(12) United States Patent
Kubo et al.

(10) Patent No.: US 7,887,665 B2
(45) Date of Patent: Feb. 15, 2011

(54) EXPANDING METHOD AND EXPANDING DEVICE

(75) Inventors: Yuichi Kubo, Mitaka (JP); Masateru Osada, Mitaka (JP); Masayuki Azuma, Mitaka (JP); Yasuyuki Sakaya, Mitaka (JP); Yuusuke Arai, Mitaka (JP); Tomohiro Tamaki, Mikata (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 660 days.

(21) Appl. No.: 10/532,815

(22) PCT Filed: Oct. 27, 2003

(86) PCT No.: PCT/JP03/13711

§ 371 (c)(1),
(2), (4) Date: Apr. 26, 2005

(87) PCT Pub. No.: WO2004/038779

PCT Pub. Date: May 6, 2004

(65) Prior Publication Data

US 2006/0005911 A1    Jan. 12, 2006

(30) Foreign Application Priority Data

| Oct. 28, 2002 | (JP) | .............. 2002-312456 |
| Jun. 24, 2003 | (JP) | .............. 2003-179680 |
| Jul. 22, 2003 | (JP) | .............. 2003-277272 |
| Jul. 25, 2003 | (JP) | .............. 2003-279713 |
| Aug. 7, 2003 | (JP) | .............. 2003-288492 |
| Sep. 29, 2003 | (JP) | .............. 2003-338795 |
| Sep. 29, 2003 | (JP) | .............. 2003-338796 |

(51) Int. Cl.
*B32B 15/00* (2006.01)

(52) U.S. Cl. .............. 156/249; 438/460; 438/462; 438/464; 264/288.4; 264/289.6; 264/291; 264/442; 264/479

(58) Field of Classification Search ............... None
See application file for complete search history.

(56) References Cited

U.S. PATENT DOCUMENTS 3,766,638 A * 10/1973 Moore .............. 438/464

(Continued)

FOREIGN PATENT DOCUMENTS

JP      52-127762 A     4/1951

(Continued)

OTHER PUBLICATIONS

Office Action issued by Japanese Patent Office, Patent Application No. 2002-312456, Dated Jun. 24, 2008.
Japanese Office Action Dated Oct. 21, 2008 Corresponding to the Above-Identified Application and English Translation.

*Primary Examiner*—Philip C Tucker
*Assistant Examiner*—Kimberly K McClelland
(74) *Attorney, Agent, or Firm*—Roberts Mlotkowski Safran & Cole, P.C.; David S. Safran

(57) ABSTRACT

An adhesive sheet (S) is expanded by expanding means (20) with a plate-like article (W) being mounted to a frame (F) after dicing of the plate-like article (W) to increase spacings between individual chips (T), an expanded state of the adhesive sheet (S) is maintained by expansion maintaining means (10), so that the plate-like article (W) is able to be conveyed together with the frame (F) with the spacings between the chips (T) being maintained, thereby preventing adjacent chips (T) from interfering with each other during the conveyance. This allows the plate-like article (W) after the dicing to be conveyed together with the frame (F) without edges of the adjacent chips (T) coming into contact with each other by vibration during the conveyance to cause chipping or microcracks in the edges.

19 Claims, 37 Drawing Sheets

U.S. PATENT DOCUMENTS

| | | | |
|---|---|---|---|
| 3,790,051 A * | 2/1974 | Moore | 225/1 |
| 3,936,204 A * | 2/1976 | Jennrich | 403/209 |
| 4,209,958 A * | 7/1980 | Bailey | 53/553 |
| 4,688,540 A * | 8/1987 | Ono | 125/13.01 |
| 4,744,550 A | 5/1988 | Oglesbee | |
| 5,186,775 A * | 2/1993 | Cullen et al. | 156/69 |
| 5,809,624 A * | 9/1998 | Nakamae et al. | 26/88 |
| 6,176,966 B1 * | 1/2001 | Tsujimoto et al. | 156/344 |
| 6,344,402 B1 | 2/2002 | Sekiya | |
| 6,383,606 B2 * | 5/2002 | Broyles | 428/156 |
| 6,403,921 B1 * | 6/2002 | Maeda et al. | 219/125.11 |

FOREIGN PATENT DOCUMENTS

| | | |
|---|---|---|
| JP | 4-255243 | 9/1992 |
| JP | 7-231003 | 8/1995 |
| JP | 7-321070 | 12/1995 |
| JP | 2001-24010 | 1/2001 |
| JP | 2001102329 A | 4/2001 |
| JP | 2003-51465 | 2/2003 |
| JP | 2003-168657 A | 6/2003 |

\* cited by examiner

EXPANDING METHOD AND EXPANDING DEVICE

TECHNICAL FIELD

The present invention relates to a method for expanding an adhesive sheet and an expanding device, and more particularly to an expanding method and an expanding device for expanding an adhesive sheet with respect to a plate-like article mounted to a ring-shaped frame through the adhesive sheet and diced into individual chips, after the dicing to increase spacings between the individual chips.

BACKGROUND OF THE ART

In a process of manufacturing semiconductors, a wafer that is a plate-like article having a surface on which semiconductor devices or electronic parts are formed is electrically tested in a probing step, and then divided into individual chips (also referred to as dice or pellets) in a dicing step. The individual chips are then die-bonded to a part base in a bonding step. After die-bonded, the individual chips are resin-molded to be semiconductor devices or electronic parts in finished form.

As shown in FIG. 3, after a probing step, a wafer W is stuck at a back surface on an adhesive sheet (also referred to as a dicing sheet or a dicing tape) S having an adhesive layer formed on one surface and having a thickness of about 100 µm, and mounted to a rigid ring-shaped frame F. The wafer W in this state is conveyed in a dicing step, between the dicing step and a die-bonding step, and in the die-bonding step.

In the dicing step, a dicing device is used that grooves the wafer W with a thin grindstone called a dicing blade to cut the wafer W. The dicing blade is a thin grindstone on which fine diamond abrasive grains are electrodeposited by Ni, and an extremely thin dicing blade is used having a thickness of about 10 µm to 30 µm.

The dicing blade is rotated at high speed of 30000 to 60000 rpm to cut into the wafer W and completely cut the wafer W (full cut). At this time, the adhesive sheet S stuck to the back surface of the wafer W is cut into about 10 µm only from a front surface thereof. Thus, the wafer W is cut into individual chips T, but the individual chips T do not come apart and an arrangement of the chips T is not deformed, thereby generally maintaining the form of the wafer.

Laser-dicing is also proposed that applies laser light having a convergent point in a wafer W to form a modification area in the wafer by multiphoton absorption, and cuts the wafer W starting at the modification area, instead of using a dicing blade. For the laser-dicing, the wafer W is diced in the state as shown in FIG. 3, and thus an arrangement of chips T is not deformed, thereby generally maintaining the form of the wafer.

For the sake of convenience, a cluster of the chips T without the arrangement of the chips T being deformed is also herein referred to as a wafer W even after the wafer W is diced and divided into the individual chips T.

Then, the wafer W is fed to the die-bonding step. In the die-bonding step, a die bonder is used. In the die bonder, the wafer W is first placed on an expanding stage, and then the adhesive sheet S is expanded to increase spacings between the chips T so that the chips T can be easily picked up.

Next, the chips T are pushed up from below by a pusher and picked up by a collet from above to bond the chips T to predetermined positions on the base.

Such an expanding device that stretches an adhesive sheet S to increase spacings between chips T has been incorporated in a die-bonder. Various improvements of such an expanding device have been made (for example, see Japanese Patent Application Laid Open No. 7-231003, Japanese Patent Application Laid Open No. 7-321070, and Japanese Patent Application Laid Open No. 2001-024010).

In the related arts, a wafer W mounted to a frame F through an adhesive sheet S is cut into individual chips T by a dicing blade, conveyed as it is through a dicing device and cleaned, then conveyed to a die bonder, and also conveyed as it is through the die bonder.

However, in recent semiconductor devices such as ICs, a width of a machining area (also referred to as a street) for dicing has become extremely narrow in order to increase the number of chips formed from one wafer W. Thus, an extremely thin dicing blade having a thickness of about 10 µm to 15 µm has been used in a dicing step.

In a wafer W diced by such an extremely thin dicing blade or the above described laser-diced wafer W, spacings between chips T are extremely narrow, and if the wafer W is conveyed while being mounted to a frame F through an adhesive sheet S as is conventional, edges of adjacent chips T come into contact with each other by vibration during the conveyance to cause chipping or microcracks in the edges, thereby degrading good chips T or compromising reliability of finished products.

Thus, it has been required that a wafer W is expanded immediately after dicing in a dicing device, and conveyed with spacings between chips T being increased. However, even if the conventional expanding method or the expanding method described in Japanese Patent Application Laid Open No. 7-231003 or Japanese Patent Application Laid Open No. 7-321070 is performed in the dicing device, the wafer W cannot be conveyed together with the frame F because the expanded adhesive sheet S shrinks to its original shape when tension to the adhesive sheet S is released.

The invention has been achieved in view of the above described circumstances, and has an object to provide an expanding method and an expanding device of an adhesive sheet that allow even a wafer having extremely narrow spacings between chips after dicing to be conveyed together with a frame without edges of adjacent chips coming into contact with each other by vibration during the conveyance to cause chipping or microcracks in the edges.

DISCLOSURE OF THE INVENTION

In order to achieve the object, the invention relates to an expanding method for expanding an adhesive sheet with respect to a plate-like article stuck to the adhesive sheet, mounted to a ring-shaped frame through the adhesive sheet, and diced into individual chips, after the dicing to increase spacings between the individual chips, characterized by including: an expanding step of expanding the adhesive sheet with the plate-like article being mounted to the frame; and an expansion maintaining step of maintaining an expanded state of the adhesive sheet with the plate-like article being mounted to the frame after the expanding step, wherein the plate-like article is able to be conveyed together with the frame with the increased spacings between the chips being maintained.

According to the invention, the adhesive sheet is expanded after the dicing to increase the spacings between the individual chips, and the plate-like article is conveyed with the state being maintained, thereby preventing edges of adjacent chips from coming into contact with each other by vibration during the conveyance to cause chipping or microcracks in the edges.

Preferably, the expanding step includes a step of heating and stretching the adhesive sheet. This allows the adhesive sheet to be easily expanded.

Preferably, the expanding step includes a step of forming a protrusion in a portion of the adhesive sheet between the frame and the plate-like article, and the expansion maintaining step includes a step of welding or bonding a base of the protrusion of the adhesive sheet. Thus, the protrusion is formed in the adhesive sheet and the adhesive sheet is expanded, and the base of the protrusion is welded or bonded to maintain the expanded state, thereby allowing the plate-like article to be handled together with the frame.

Preferably, the base of the protrusion formed in the adhesive sheet is ultrasonically welded. Thus, the base of the protrusion formed in the adhesive sheet is ultrasonically welded, thereby allowing local welding to be easily performed.

Preferably, the expanding step is performed with the plate-like article being placed on a chuck stage of a dicing device, and includes a step of temporarily maintaining the expanded state of the adhesive sheet on the chuck stage using a clamping member, and the expansion maintaining step includes a step of forming a loose part outside the clamping member of the adhesive sheet to pinch and secure a base of the loose part of the adhesive sheet. Thus, the plate-like article is expanded while being placed on the chuck stage of the dicing device, and the expanded state of the adhesive sheet is maintained, thereby allowing the plate-like article to be conveyed together with the frame with the spacings between the chips being maintained.

Preferably, the expanding step is performed in a dicing area of the dicing device after the dicing of the plate-like article, and includes a step of conveying the plate-like article with the expanded state of the adhesive sheet being temporarily maintained together with the chuck stage to a different area in the same device, and the expansion maintaining step is performed in the different area. Thus, the step of nipping and securing the base of the loose part of the adhesive sheet is performed in the area different from the dicing area of the dicing device, thereby minimizing reduction in the operating rate of the dicing device.

Preferably, the expanding method further includes a step of conveying the plate-like article together with the chuck stage of the dicing device to a different area in the same device without being detached from the chuck stage after the dicing of the plate-like article, and the expanding step and the expansion maintaining step are performed in the different area in the same device. Thus, the expanded state of the adhesive sheet is maintained with the diced plate-like article being mounted to the frame, thereby allowing the plate-like article to be conveyed together with the frame with the spacings between the chips being maintained. This prevents edges of adjacent chips from coming into contact with each other by vibration during the conveyance to cause chipping or microcracks in the edges even in a plate-like article having extremely narrow spacings between chips. The expanding step and the expansion maintaining step are performed in the area different from the dicing area of the dicing device, thereby minimizing reduction in the operating rate of the dicing device.

Preferably, the expansion maintaining step includes a step of securing the base of the loose part of the adhesive sheet by welding or bonding. In this case, the base of the pinched loose part of the adhesive sheet is welded or bonded to maintain the expanded state, thereby allowing the plate-like article to be handled together with the frame.

Preferably, a heat-shrinkable sheet is used as the adhesive sheet, and the expanding step and the expansion maintaining step are simultaneously performed by heating the adhesive sheet in at least a pair of areas sandwiching the plate-like article in parallel with a dicing line of the plate-like article in the portion of the adhesive sheet between the plate-like article and the frame. Thus, the heating area of the adhesive sheet is placed in parallel with the dicing line of the plate-like article, thereby allowing even a strip chip such as a line sensor to be easily expanded.

Preferably, the adhesive sheet is heated in at least a pair of areas sandwiching the plate-like article in parallel with a dicing line in one direction of the plate-like article, and in at least a pair of areas sandwiching the plate-like article in parallel with a dicing line perpendicular to the dicing line in one direction, and heating temperatures of the areas are individually controlled according to the state of increase in the spacings between the individual chips. Thus, the heating temperatures of the areas are individually controlled according to the state of increase in the spacings between the individual chips, thereby allowing the spacings between the individual chips to be uniformly increased.

Preferably, after the dicing of the plate-like article, the adhesive sheet is heated without the plate-like article being detached from the chuck stage of the dicing device. Thus, after the dicing of the plate-like article, the adhesive sheet is expanded without the plate-like article being detached from the chuck stage, and the adhesive sheet on which the plate-like article is stuck is maintained in the expanded state, thereby preventing the individual chips from interfering with each other in the conveyance after the dicing.

Preferably, a heat-shrinkable sheet is used as the adhesive sheet, the expanding step includes a step of applying tension to the adhesive sheet, and the expansion maintaining step includes a step of forming a loose part in a portion of the adhesive sheet between the plate-like article and the frame, and heating and shrinking the loose part to eliminate the loose part. Thus, after the heat-shrinkable adhesive sheet is expanded, the loose part is formed in a portion on which the plate-like article is not stuck, and the loose part is heated and shrunk to maintain the expanded state of the adhesive sheet, thereby allowing the plate-like article to be conveyed together with the frame with the spacings between the chips being maintained. This prevents edges of adjacent chips from coming into contact with each other by vibration during the conveyance to cause chipping or microcracks in the edges even in a plate-like article having extremely narrow spacings between chips.

Preferably, the loose part is formed after the expanded state of the adhesive sheet in the portion on which the expanded plate-like article is stuck is maintained by suction or mechanically, and the maintenance by suction or the mechanical maintenance is released after the loose part is heated and shrunk. Thus, the loose part is formed after the expanded state of the adhesive sheet in the portion on which the plate-like article is stuck is maintained by suction or mechanically, and the maintenance by suction or the mechanical maintenance is released after the loose part is heated and shrunk. Therefore, the loose part may be formed only in the adhesive sheet outside the plate-like article to heat and shrink the loose part, thereby allowing the expanded state to be easily maintained.

Preferably, the plate-like article and the frame are relatively separated to expand the adhesive sheet, and the relative separation between the plate-like article and the frame is released to form the loose part. Alternatively, the adhesive sheet is pressed between the plate-like article and the frame to expand the adhesive sheet, and the press of the adhesive sheet between the plate-like article and the frame is released to form the loose part. This allows the adhesive sheet to be uniformly expanded.

Preferably, a portion of the adhesive sheet outside the plate-like article is heated in a ring shape to shrink the loose part. Thus, the portion of the adhesive sheet outside the plate-like article is heated in the ring shape, thereby allowing the loose part formed in the adhesive sheet to be uniformly shrunk.

Preferably, after the dicing of the plate-like article, the adhesive sheet is expanded without the plate-like article being detached from the chuck stage of the dicing device. Thus, after the dicing of the plate-like article, the adhesive sheet is expanded without the plate-like article being detached from the chuck stage, and the adhesive sheet on which the plate-like article is stuck is maintained in the expanded state, thereby preventing the individual chips from interfering with each other during the conveyance after the dicing.

Preferably, the expanding step includes a step of relatively vertically separating the plate-like article and the frame, and applying a lateral force to the adhesive sheet, and the expansion maintaining step includes a step of sticking a different ring-shaped frame to the expanded adhesive sheet, and cutting the adhesive sheet near an outer periphery of the different frame. Thus, the different ring-shaped frame is stuck to the expanded adhesive sheet, and the adhesive sheet is cut near the outer periphery of the different frame to maintain the expanded state of the adhesive sheet, thereby allowing the plate-like article to be conveyed together with the frame with the spacings between the chips being maintained. This prevents edges of adjacent chips from coming into contact with each other by vibration during the conveyance to cause chipping or microcracks in the edges even in a plate-like article having extremely narrow spacings between chips.

Preferably, the lateral force applied to the adhesive sheet is applied by inflating an airbag. Thus, the airbag is used to laterally stretch the adhesive sheet, thereby allowing even an adhesive sheet having a complex expanding shape to be easily expanded.

Preferably, the frame and the different frame are of the same type. Thus, the frame to which the plate-like article is mounted through the adhesive sheet and the frame that maintains the expanded state of the expanded adhesive sheet are of the same type. This allows the frame to be shared to simplify a configuration of the device, and eliminates the need for changing conveying means in steps thereafter.

In order to achieve the object, the invention also relates to an expanding device for expanding an adhesive sheet with respect to a plate-like article stuck to the adhesive sheet, mounted to a ring-shaped frame through the adhesive sheet, and diced into individual chips, after the dicing to increase spacings between the individual chips, characterized by including: expanding means for expanding the adhesive sheet with the plate-like article being mounted to the frame; and expansion maintaining means for maintaining an expanded state of the adhesive sheet with the plate-like article being mounted to the frame, wherein the plate-like article is able to be conveyed together with the frame with the increased spacings between the chips being maintained.

According to the invention, the adhesive sheet is expanded by the expanding means after the dicing to increase the spacings between the chips, and the state is maintained by the expansion maintaining means, thereby allowing the wafer to be conveyed together with the frame, and preventing edges of adjacent chips from coming into contact with each other by vibration during the conveyance to cause chipping or microcracks in the edges.

Preferably, the expanding means includes a heating stage on which the plate-like article is placed together with the adhesive sheet, and a heater incorporated into the heating stage, the expansion maintaining means includes an inner ring having an inner diameter larger than an outer diameter of the plate-like article, and an outer ring having an inner diameter that is able to be firmly fitted over an outer periphery of the inner ring intercalated the adhesive sheet, and the expanding device is adapted so that a portion of the adhesive sheet on which the plate-like article is stuck is heated by the heating stage, the adhesive sheet is stretched toward an outer periphery thereof and expanded, and a portion outside the heated portion of the adhesive sheet is sandwiched between the inner ring and the outer ring to maintain the expanded state of the adhesive sheet. This allows the adhesive sheet to be easily heated and stretched toward the outer periphery thereof, and allows the expanded state of the adhesive sheet to be easily maintained.

Preferably, the expanding means includes a chuck stage on which the plate-like article is placed, and a pressure member that presses the portion of the adhesive sheet between the frame and the plate-like article to form a protrusion in the adhesive sheet, the expansion maintaining means includes a housing that is placed so as to face the pressure member intercalated the adhesive sheet and has a space for housing the protrusion, and a welding tool to be pressed toward a base of the protrusion, the protrusion is formed in the adhesive sheet by the pressure member to expand the adhesive sheet, and the base of the protrusion is welded by the welding tool to maintain the expanded state of the adhesive sheet. Thus, the expanding device includes the pressure member that forms the protrusion in the adhesive sheet, and the welding tool that welds the base of the protrusion, the adhesive sheet is expanded by the pressure member, and the base of the protrusion formed in the adhesive sheet is welded by the welding tool, thereby allowing the expanded state to be maintained with the plate-like article being mounted to the frame.

Preferably, pressure reducing means for reducing pressure in the space in the housing is provided. Thus, the protrusion formed in the adhesive sheet is sucked into the space in the housing, thereby allowing the shape of the protrusion to be maintained even if the pressure member is retracted, and allowing the base of the protrusion to be easily welded.

Preferably, the expanding means expands the adhesive sheet without the plate-like article being detached from the chuck stage of the dicing device after the dicing of the plate-like article, sheet securing means for temporarily maintaining the expanded state of the adhesive sheet on the chuck stage is provided, conveying means is provided for conveying the plate-like article together with the chuck stage from a dicing area to a different area in the dicing device with the expanded state of the adhesive sheet being temporarily maintained, and the expansion maintaining means is provided in the different area, and pinches and secures a base of a loose part that is formed in a portion of the adhesive sheet where the expanded state is not maintained. Thus, the adhesive sheet is expanded without the plate-like article being detached from the chuck stage after the dicing, thereby preventing edges of adjacent chips from coming into contact with each other by vibration during the conveyance to cause chipping or microcracks in the edges even in the conveyance in the dicing device. The base of the loose part formed in the portion of the adhesive sheet where the expanded state is not maintained is nipped and secured in the area different from the dicing area, thereby minimizing reduction in the operating rate of the dicing device.

Preferably, conveying means is provided for conveying the plate-like article together with the chuck stage of the dicing device from a dicing area to a different area in the dicing device without the plate-like article being detached from the chuck stage after the dicing of the plate-like article, the expanding means expands the adhesive sheet in the different area in the dicing device, sheet securing means for temporarily maintaining the expanded state of the adhesive sheet on the chuck stage is provided, and the expansion maintaining means pinches and secures a base of a loose part formed in a portion of the adhesive sheet where the expanded state is not temporarily maintained. Thus, the plate-like article is conveyed together with the chuck stage of the dicing device from the dicing area to the different area in the dicing device without the plate-like article being detached from the chuck stage, and expanded, and the expanded state of the adhesive sheet on the chuck stage is temporarily maintained to further maintain the expanded state, thereby preventing edges of adjacent chips from coming into contact with each other by vibration during the conveyance to cause chipping or microcracks in the edges even in the conveyance in the dicing device. This also prevents the expansion from causing reduction in the operating rate of the dicing device.

Preferably, the expansion maintaining means includes an ultrasonic welding tool. Thus, the base of the loose part formed in the adhesive sheet is ultrasonically welded, thereby allowing local welding to be easily performed.

Preferably, for the heat-shrinkable adhesive sheet, the expanding means and the expansion maintaining means include heating means for heating the adhesive sheet in at least a pair of areas sandwiching the plate-like article in parallel with a dicing line in one direction of the plate-like article, and in at least a pair of areas sandwiching the plate-like article in parallel with a dicing line perpendicular to the dicing line in one direction. Thus, heating temperatures of the areas may be individually controlled according to the state of increase in the spacings between the individual chips, thereby allowing the spacings between the individual chips to be uniformly increased.

Preferably, for the heat-shrinkable adhesive sheet, the expanding means includes at least one of means for relatively vertically separating the plate-like article and the frame, and means for pressing the adhesive sheet, sheet securing means for temporarily maintaining the expanded state of the adhesive sheet is provided, and the expansion maintaining means includes heating means for heating a loose part formed in a portion of the adhesive sheet between the plate-like article and the frame. Thus, after the heat-shrinkable adhesive sheet is expanded, the loose part is formed in a portion on which the plate-like article is not stuck, and the loose part is heated and shrunk to maintain the expanded state of the adhesive sheet, thereby allowing the plate-like article to be conveyed together with the frame with the spacings between the chips being maintained. This prevents edges of adjacent chips from coming into contact with each other by vibration during the conveyance to cause chipping or microcracks in the edges even in a plate-like article having extremely narrow spacings between chips.

Preferably, the expanding means includes means for relatively vertically separating the plate-like article and the frame to stretch the adhesive sheet, and an air bag that is inflated by compressed air to apply a lateral force to the adhesive sheet, and the expansion maintaining means includes means for sticking a new frame to the expanded adhesive sheet, and means for cutting the adhesive sheet along an outer periphery of the new frame. Thus, the plate-like article and the frame are relatively vertically separated to stretch the adhesive sheet, the airbag is inflated to apply the lateral force to the adhesive sheet to expand the adhesive sheet, a different ring-shaped frame is stuck to the expanded adhesive sheet, and the adhesive sheet is cut near the outer periphery of the different frame to maintain the expanded state of the adhesive sheet, thereby allowing the plate-like article to be conveyed together with the frame with the spacings between the chips being maintained. This prevents edges of adjacent chips from coming into contact with each other by vibration during the conveyance to cause chipping or microcracks in the edges even in a plate-like article has extremely narrow spacings between chips.

BRIEF DESCRIPTIONS OF THE DRAWINGS

BEST MODE FOR CARRYING OUT THE INVENTION

Figure 1:
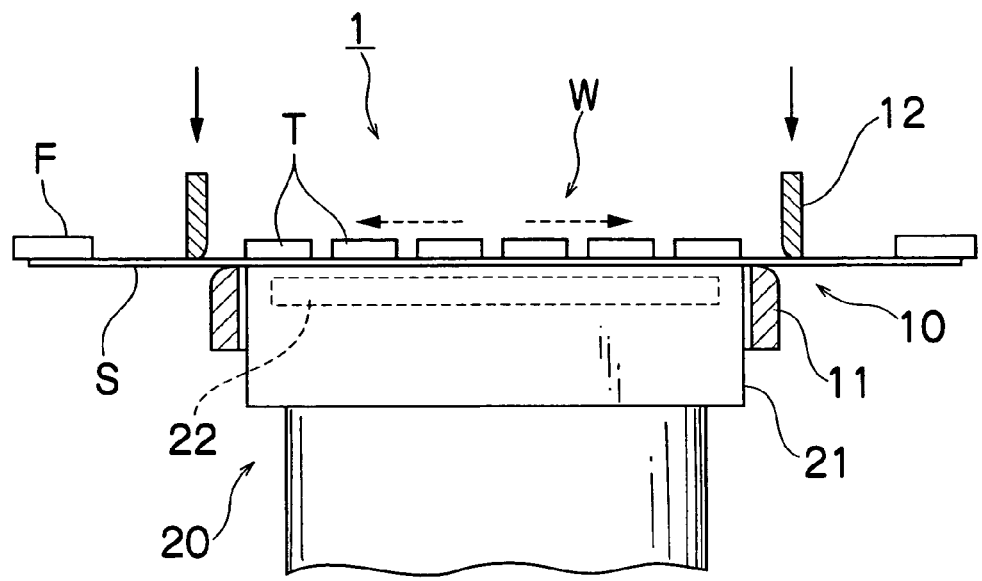
FIG. 1 is a sectional view of an expanding device according to a first embodiment of the invention.

Now, preferred embodiments of an expanding method and an expanding device according to the invention will be described in detail with reference to the accompanying drawings. Like components are denoted by like reference numerals or characters throughout the drawings.

FIG. 1 shows a first embodiment of an expanding device according to the invention. The expanding device 1 includes expanding means 20 constituted by a heating stage 21, and expansion maintaining means 10 constituted by an inner ring 11 and an outer ring 12.

A heater 22 is incorporated in the heating stage 21 near an upper surface thereof and set so as to heat the upper surface of the heating stage 21 to a predetermined temperature. The inner ring 11 is detachably placed on an outer periphery of the heating stage 21. An inner diameter of the outer ring 12 is sized to be firmly fitted over an outer periphery of the inner ring 11 intercalated an adhesive sheet S. The outer ring 12 is vertically moved by unshown drive means.

Next, as a first embodiment of an expanding method according to the invention, operations of the expanding device 1 thus configured will be described. A wafer W is cut into individual chips T, T, . . . by dicing and then placed on the heating stage 21. When the wafer W is placed on the heating stage 21, the wafer sheet S is heated and stretched to increase spacings between the chips. The outer ring 12 is lowered in this state to sandwich the wafer sheet S between the outer ring 12 and the inner ring 11.

Figure 2:
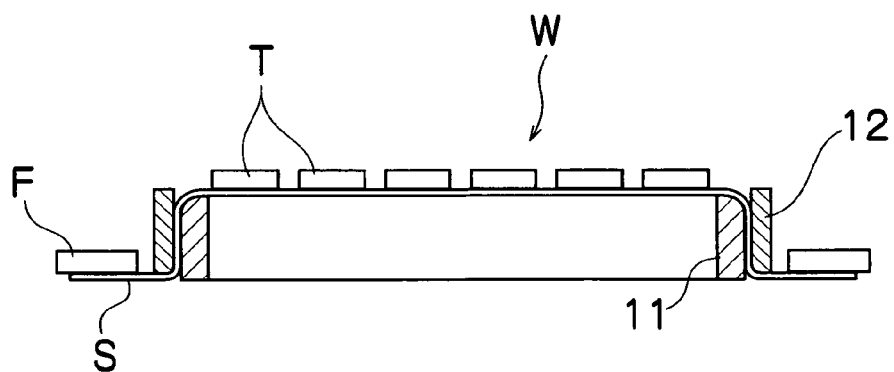
FIG. 2 is a sectional view of an expansion maintaining state of an adhesive sheet according to the first embodiment.

This causes the state in FIG. 2. Specifically, the wafer sheet S is expanded, and the state where the spacings between the chips T are increased is maintained. The wafer W after the dicing is thereafter conveyed in this state. The wafer W is conveyed with the increased spacings between the chips T being maintained, thereby preventing edges of adjacent chips from coming into contact with each other by vibration during the conveyance to cause chipping or microcracks in the edges.

As a method for maintaining the expanded state of the wafer sheet S, a double ring method for sandwiching the wafer sheet S between the inner ring 11 and the outer ring 12 is used, but not limited to this, various securing methods may be used such as a method for resticking the expanded wafer sheet S to a frame having a smaller diameter or a method for securing the wafer sheet S to the inner ring 11 with an elastic belt instead of the outer ring 12.

Figure 4:
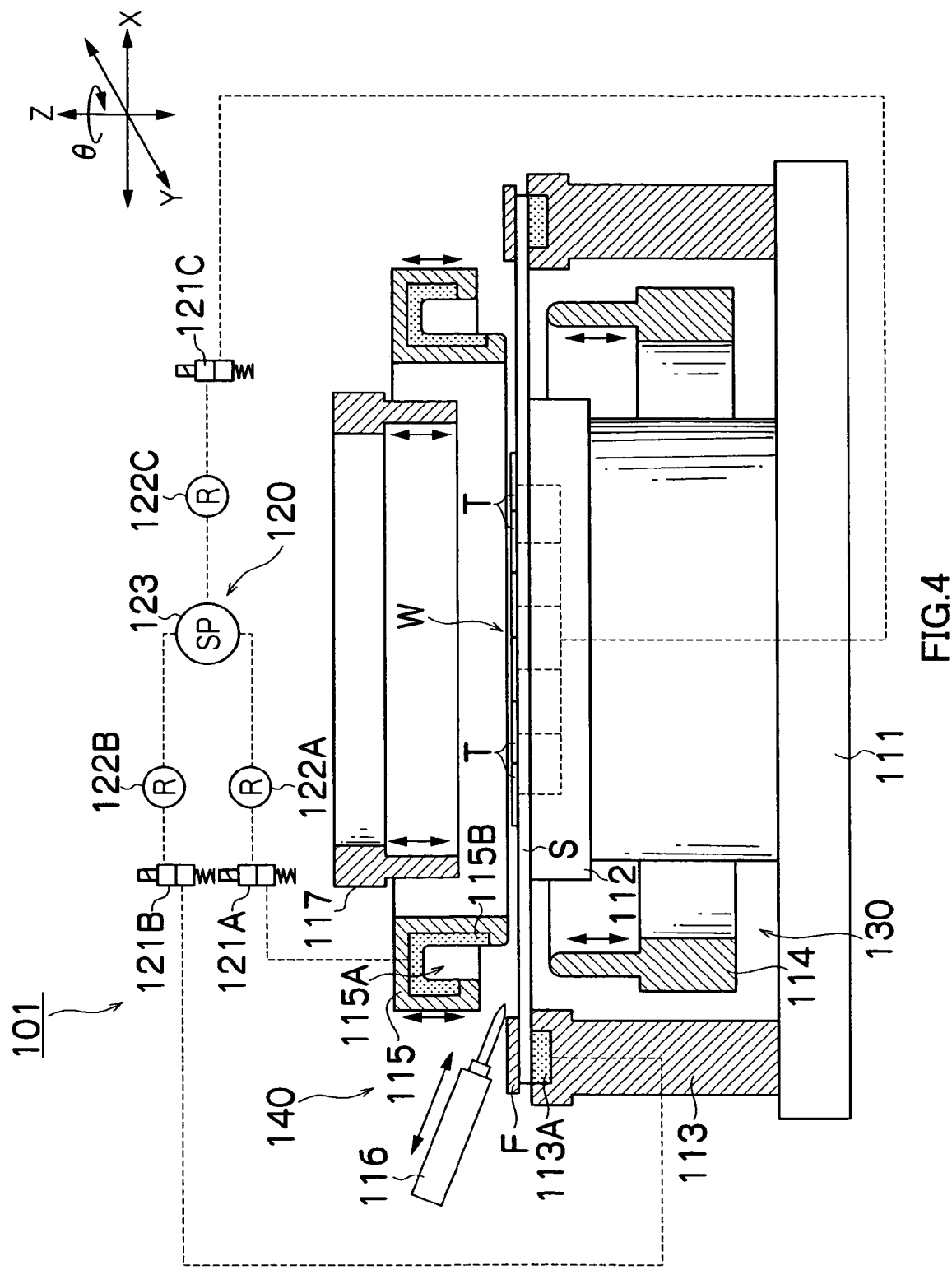
FIG. 4 is a sectional view of an expanding device according to a second embodiment of the invention.

FIG. 4 shows a second embodiment of an expanding device according to the invention. The expanding device 101 includes an XY θ table 111, a chuck stage 112, a frame chuck 113, a pressure member 114, a housing 115, an ultrasonic welding tool 116 as a welding tool, and a pressing ring 117, or the like, expanding means 130 includes the frame chuck 113, the housing 115, and the pressure member 114, or the like, and expansion maintaining means 140 includes the housing 115, the pressing ring 117, and the ultrasonic welding tool 116, or the like.

The XY θ table 111 is moved in XY directions in FIG. 4 and rotated through 0 by an unshown drive device. The chuck stage 112 and the frame chuck 113 are mounted to the XY θ table 111. A porous member 113A is embedded in an upper surface of the frame chuck 113, and connected to a pressure reducing pump 123 that constitutes pressure reducing means 120 through a solenoid valve 121B and a regulator 122B so as to suck a frame F.

An unshown porous member is embedded in an upper surface of the chuck stage 112, and connected to the pressure reducing pump 123 through a solenoid valve 121C and a regulator 122C so as to suck a wafer W that is a plate-like article.

The ring-shaped housing 115 having an annular groove (space) 115A is placed above a portion of an adhesive sheet S on which a frame F and the wafer W are not stuck. An inner surface of the annular groove 115A is formed of a porous member 115B, and is connected to the pressure reducing pump 123 through a solenoid valve 121A and a regulator 122A to reduce pressure in the groove 115A. The housing 115 is vertically moved by unshown drive means and clamped at a lowering end.

The ring-shaped pressure member 114 is provided so as to face the housing 115 intercalated the adhesive sheet S. The pressure member 114 is vertically moved by unshown drive means and positioned so as to be raised and inserted into the groove 115A in the housing 115. An upper edge of the pressure member 114 is smoothly chamfered.

The annular pressing ring 117 is provided inside the housing 115, and vertically moved by unshown drive means to firmly press the chuck stage 112 when moved downward.

The ultrasonic welding tool 116 as the welding tool is placed outside the housing 115 in a slanting manner with a tip of the ultrasonic welding tool 116 being directed to an entrance of the groove 115A. The ultrasonic welding tool 116 is axially moved by unshown drive means to press a subject at a tip thereof while generating ultrasound.

Figure 5:
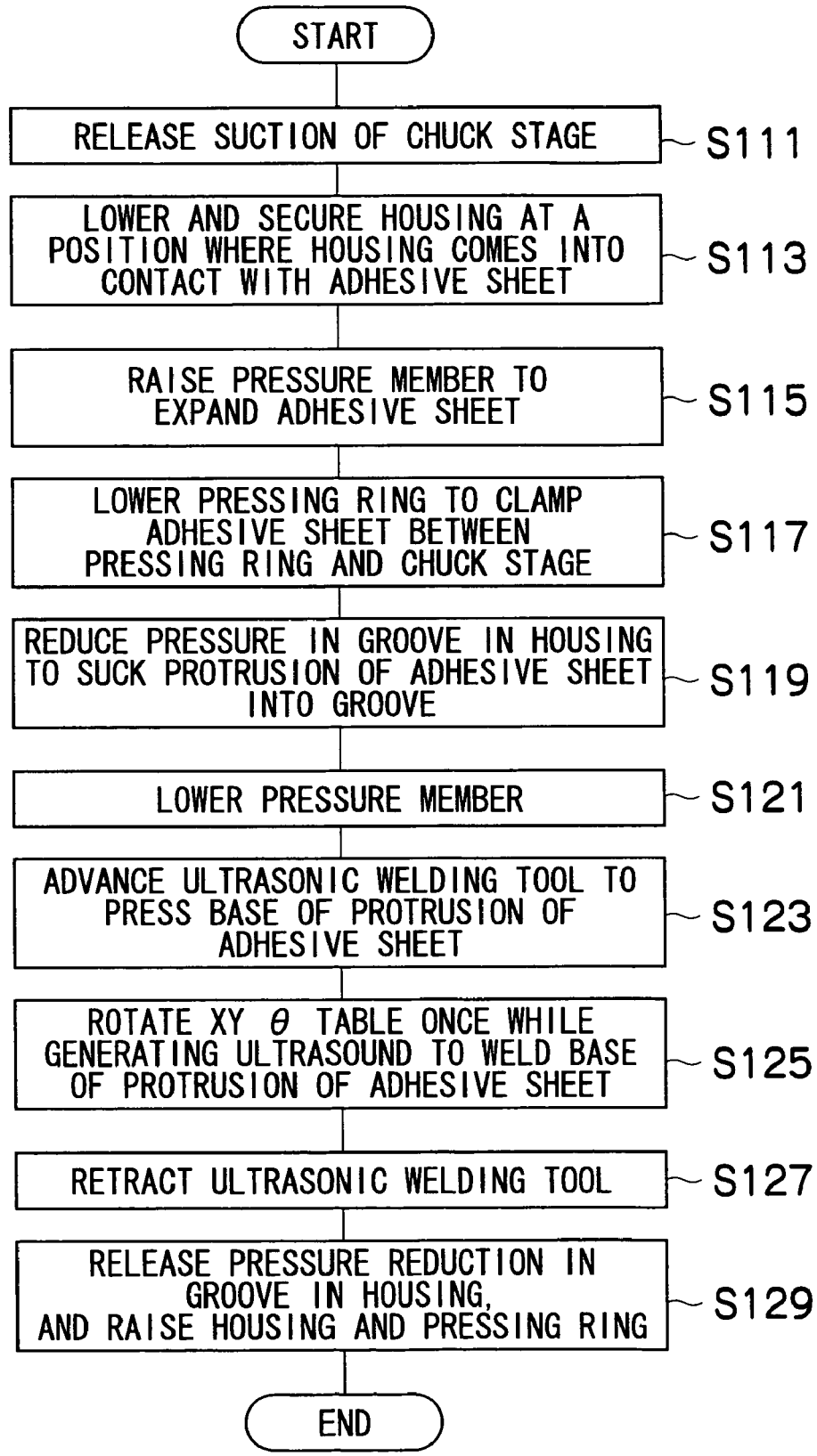
FIG. 5 is a flowchart illustrating an expanding method according to the second embodiment.

Next, an expanding method (a second embodiment) by the expanding device 101 thus configured will be described. FIG. 5 is a flowchart of the second embodiment of the expanding method according to the invention. The wafer W mounted to the frame F through the adhesive sheet S is placed on the chuck stage 112 and the frame chuck 113, the wafer W is sucked to the chuck stage 112 through the adhesive sheet S, and the frame F is sucked to the frame chuck 113 through the adhesive sheet S. The wafer W is diced into individual chips T in this state.

In expanding the adhesive sheet S, as shown in FIG. 5, the frame F first remains sucked, and the solenoid valve 121C is actuated to release the suction of the chuck stage 112 only (Step S111).

Next, the housing 115 is lowered and clamped at a position where the lower end comes into contact with the adhesive sheet S (Step S113). Then, the pressure member 114 is raised and abutted against the adhesive sheet S, and further raised to push up the adhesive sheet S to form a protrusion in the groove 115A in the housing 115. Thus, the adhesive sheet S is expanded outward from the center, and the spacings between the chips T stuck on the adhesive sheet S are increased (Step S 115).

The pressing ring 117 is then lowered to press and clamp the adhesive sheet S between the pressing ring 117 and the upper surface of the chuck stage 112. Thus, the expanded state of the adhesive sheet S inside the pressing ring 117 is temporarily maintained (Step S117).

Figure 6:
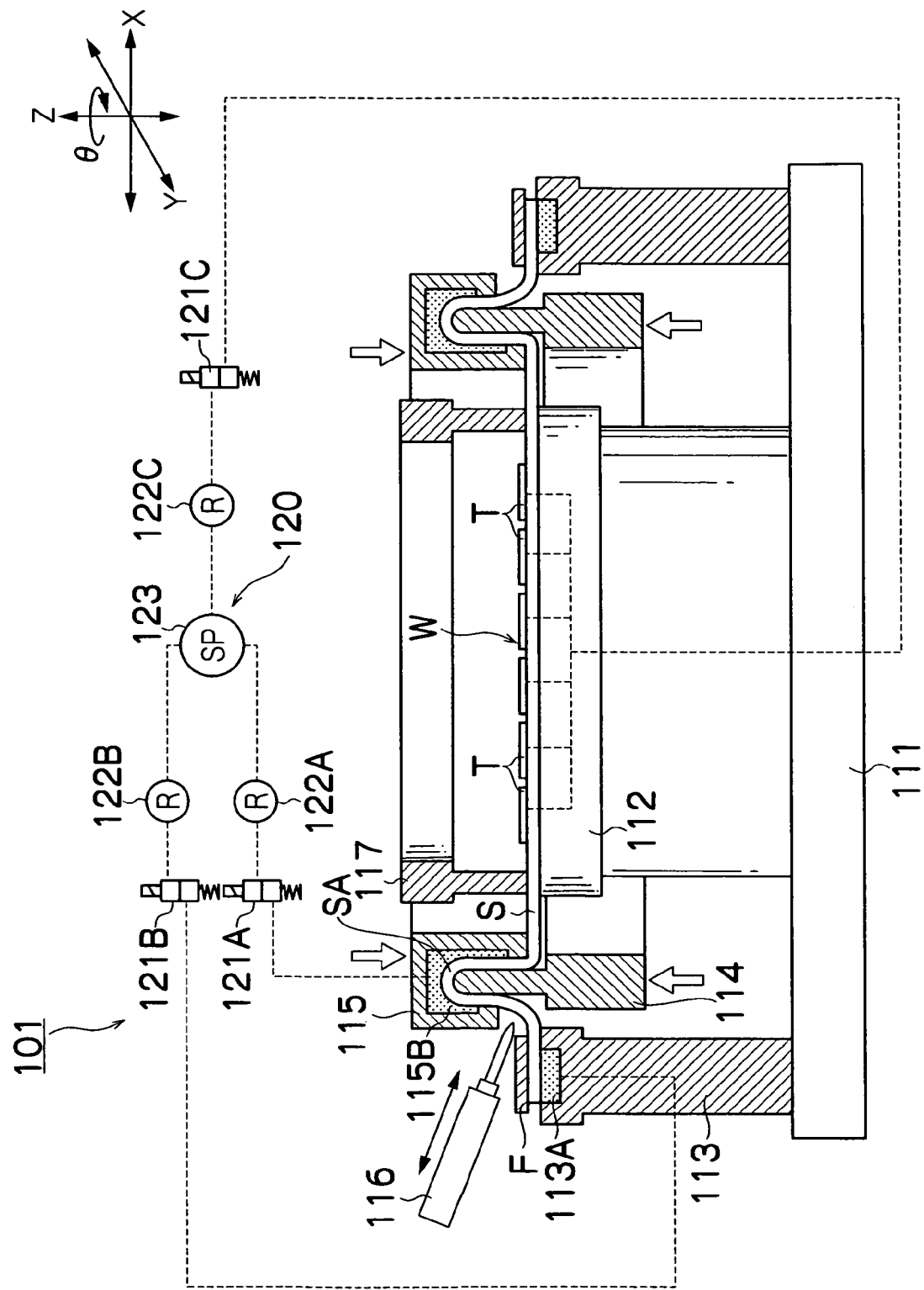
FIG. 6 is a conceptual view of an expanded state according to the second embodiment.

FIG. 6 shows this state, and the adhesive sheet S is pushed up by the pressure member 114 to form an annular protrusion SA in the annular groove in the housing 115. Thus, the adhesive sheet S is extended outward from the center, the spacings between the individual chips T are increased, and this expanded state is temporarily maintained by the pressing ring 117.

Next, the solenoid valve 121A is actuated to reduce pressure in the space within the groove 115A in the housing 115 by a pressure reducing pump, and the protrusion SA of the adhesive sheet S is sucked to the inner surface of the groove 115A (Step S119). The inner surface of the groove 115A is formed of the porous member 115B, thereby allowing the protrusion SA to be uniformly sucked.

The pressure member 114 that has formed the protrusion SA in the adhesive sheet S is then lowered. Even if the pressure member 114 is lowered, the protrusion SA of the adhesive sheet S is sucked to the inner surface of the groove 115A, thereby preventing the protrusion SA from returning to its original shape (Step S121).

Next, the ultrasonic welding tool 116 is advanced to press, at a tip thereof, a base SB that is a root of the protrusion SA of the adhesive sheet S, and bring bases SB into contact with each other to be pressed against a wall of the groove 115A in the housing 115 (Step S123). Then, the ultrasonic welding tool 116 generates ultrasound to locally weld, at the tip thereof, the bases SB of the protrusion SA of the adhesive sheet S, and the XY θ table 111 is once rotated to weld along the entire periphery of the bases SB of the annular protrusion SA (Step S125).

Figure 7:
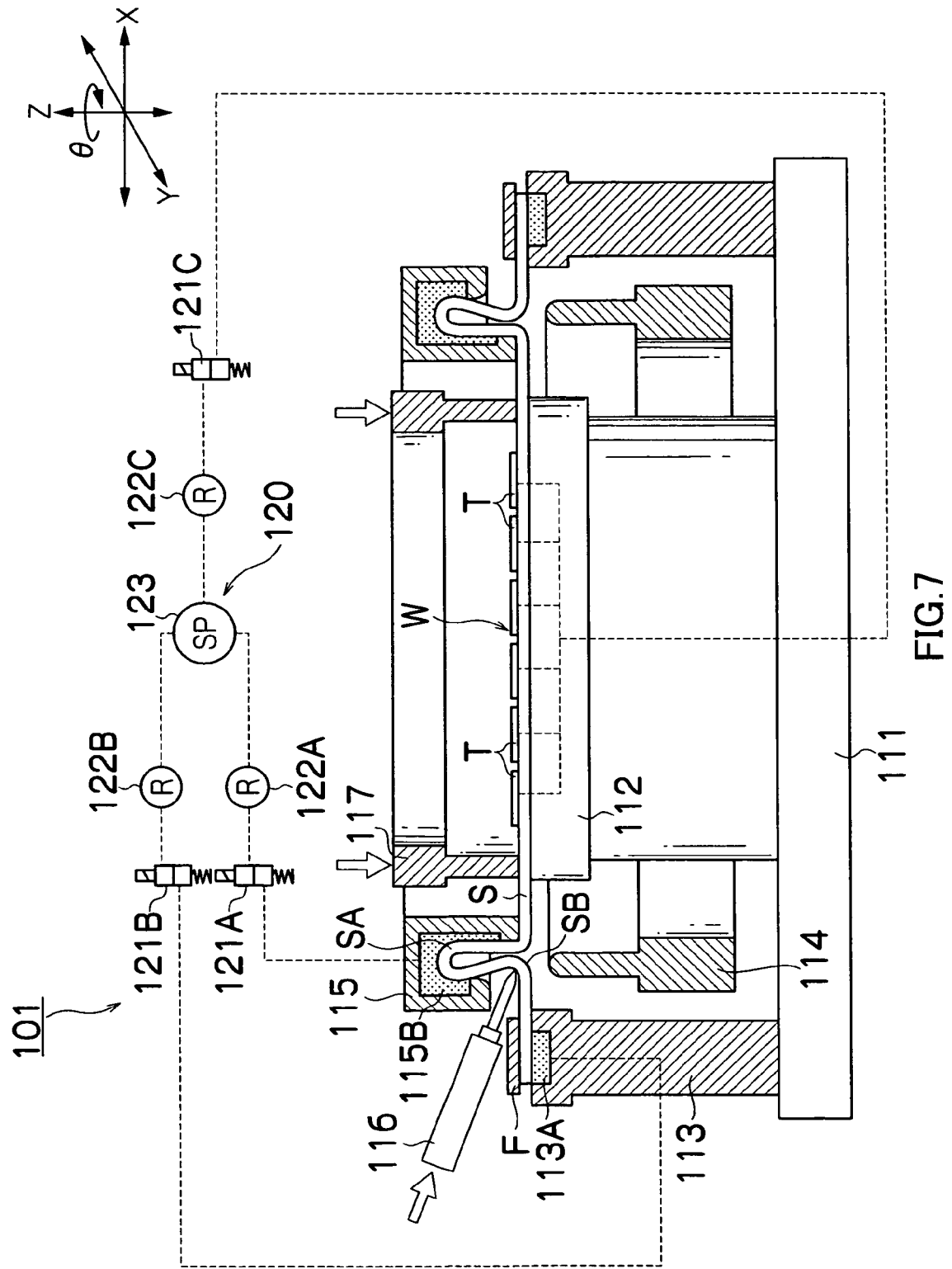
FIG. 7 is a conceptual view of an expansion maintaining state according to the second embodiment.

FIG. 7 shows this state. For the adhesive sheet S, the base SB of the protrusion SA is pressed by the tip of the ultrasonic welding tool 116 with the inside of the pressing ring 117 being expanded and the spacings between the chips T being increased, and the bases SB are pressed against the wall of groove 115A and locally welded by ultrasonic vibration.

The ultrasonic welding tool 116 is then retracted (Step S127), the solenoid valve 121A is actuated to release the pressure reduction in the groove 115A in the housing 115, and the housing 115 and the pressing ring 117 are raised (Step S129).

In the above described steps, the spacings between the chips T of the wafer W stuck to the adhesive sheet S and diced into the individual chips T are increased, and in this state, the loose part is formed near the outer periphery of the adhesive sheet S and the root of the loose part is pinched, thereby causing the increased spacings between the individual chips T to be maintained and allowing the diced wafer W to be conveyed together with the frame.

The expansion is preferably performed immediately after the dicing in the dicing device. The wafer W is thus conveyed together with the frame with the increased spacings between the chips T being maintained, thereby preventing edges of adjacent chips from coming into contact with each other by vibration during the conveyance to cause chipping or microcracks in the edges.

In the second embodiment described above, the adhesive sheet S is pushed up from below to form the protrusion SA upward, but the invention is not limited to this, and the adhesive sheet S may be pushed down to form the protrusion SA downward.

The bases SB of the protrusion SA of the adhesive sheet S are ultrasonically welded, but not limited to the ultrasonic welding, the bases SB may be locally welded by thermocompression bonding, or bonded by an adhesive instead of the welding.

Figure 8:
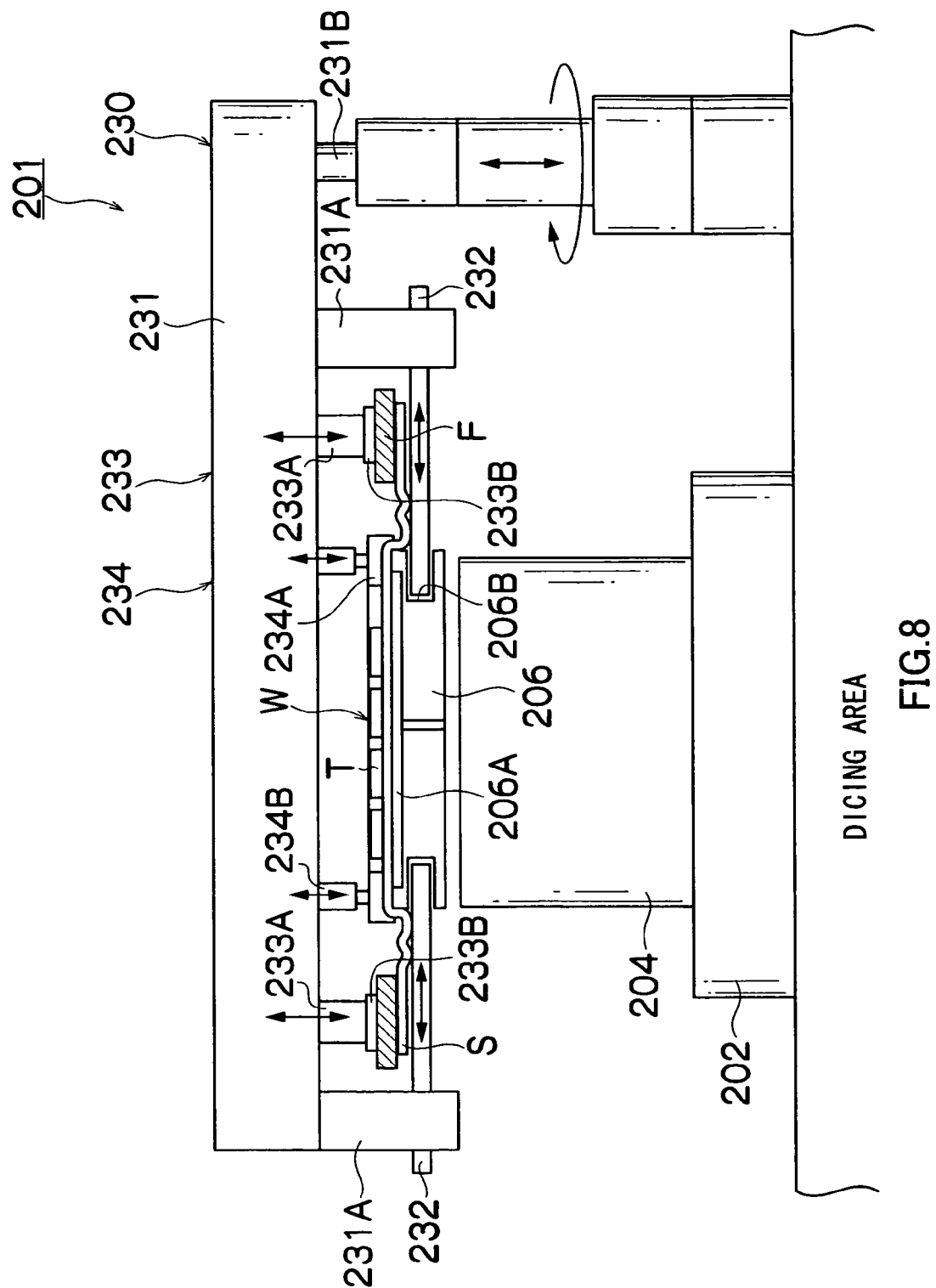
FIG. 8 is a front view of part of an expanding device according to a third embodiment of the invention.
Figure 9:
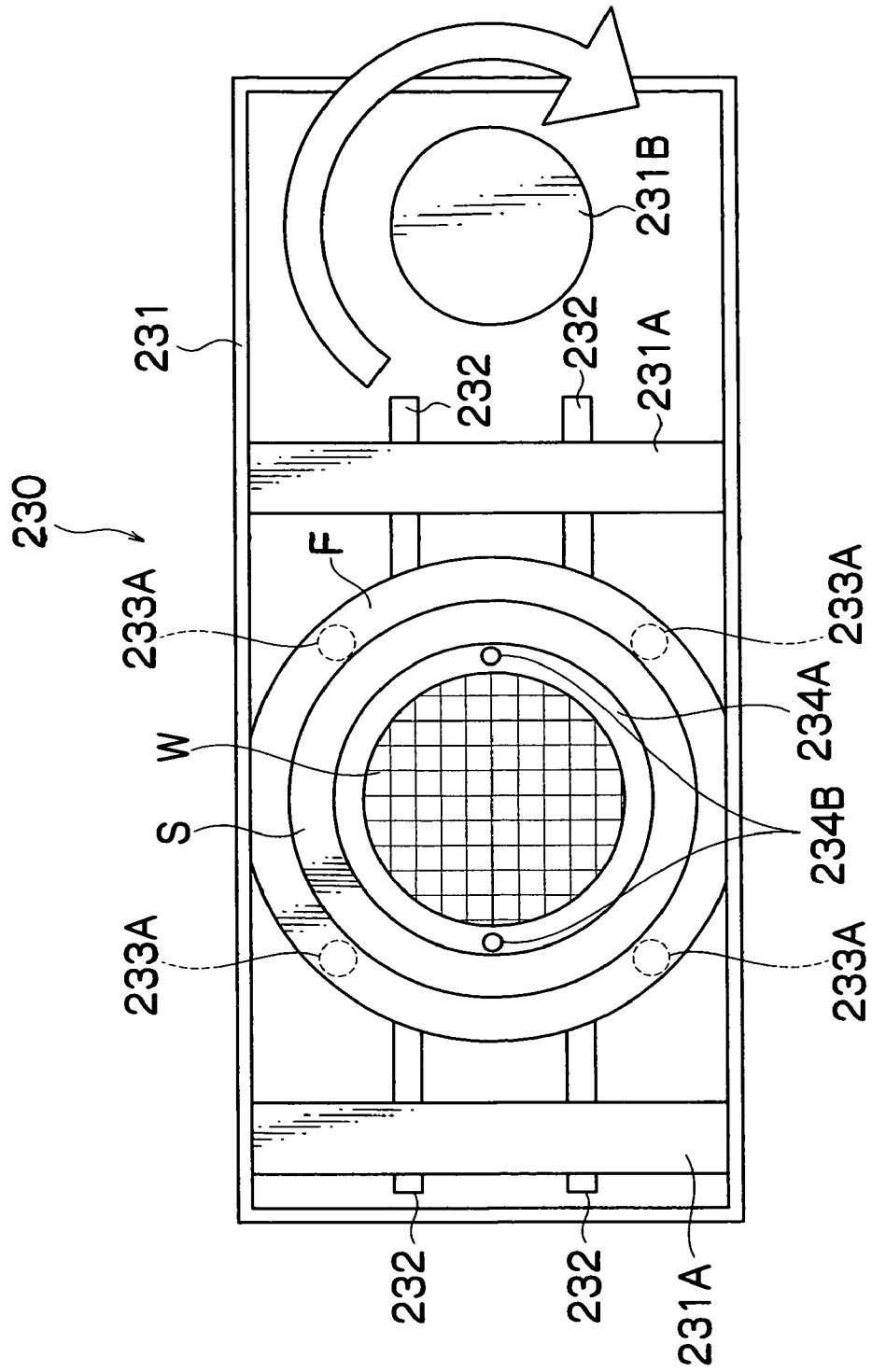
FIG. 9 is a plan view of part of the expanding device according to the third embodiment.

FIG. 8 illustrates a third embodiment of an expanding device according to the invention, and is a front view of part of the expanding device and a state where a conveying device including expanding means is positioned in a dicing area of a dicing device. FIG. 9 is a plan view thereof.

As shown in FIGS. 8 and 9, an expanding device 201 includes conveying means 230, expanding means 233 mounted to the conveying means 230, sheet clamping means 234, and sheet loose part securing means 201A that is expansion maintaining means provided in a below described welding area (a different area), or the like.

The conveying means 230 conveys a wafer W that is a plate-like article mounted to a frame through an adhesive sheet S together with a chuck stage 206 of the dicing device from the dicing area to the welding area (the different area), and includes a rotation arm 231 that is rotated around a shaft 231B and vertically moved by unshown drive means, two support beams 231A and 231A, and four forks 232, 232, . . . that are provided two for each of the support beams 231A and 231A, are horizontally moved by unshown drive means, and hold the chuck stage 206, or the like.

The expanding means 233 mounted to the conveying means 230 includes four pushers 233A, 233A, . . . extendable by an unshown air cylinder, and a suction pad 233B mounted to a tip of each pusher 233A.

The pusher 233A and the suction pad 233B have vacuum paths, and are connected to an unshown pressure reducing device to suck a frame F, and the pusher 233A is extended downward to expand the adhesive sheet S. The suction pad 233B is made of a thin rubber material so as to ensure suction of the frame F.

Sheet clamping means 234 mounted to the conveying means 230 includes a clamp ring 234A that is a clamping member that temporarily clamps the expanded adhesive sheet, and two support rods 234B and 234B that support the clamp ring 234A and are vertically extendable by an unshown air cylinder.

The clamp ring 234A is a ring having a protruding edge and an L-shaped section, and an inner diameter of the edge is slightly larger than an outer diameter of the chuck stage 206 of the dicing device so that the clamp ring 234A is firmly fitted over the chuck stage 206 through the adhesive sheet S. A slot may be formed in part of the clamp ring 234A for firm fitting. The clamp ring 234A is placed over the chuck stage 206 after the expansion of the adhesive sheet S to temporarily maintain the expanded state of the adhesive sheet S on the chuck stage 206.

The chuck stage 206 of the dicing device is placed on an upper surface of a Z θ stage 204 incorporated into an XY table 202 placed in the dicing area, and is sucked by vacuum together with the wafer W on the chuck stage 206. A porous member 206A is embedded in an upper surface of the chuck stage 206 so as to uniformly suck the wafer W through the adhesive sheet S. A groove 206B is formed in a lower portion on a side surface of the chuck stage 206, and the fork 232 of the conveying means 230 is inserted into the groove 206B.

Figure 10:
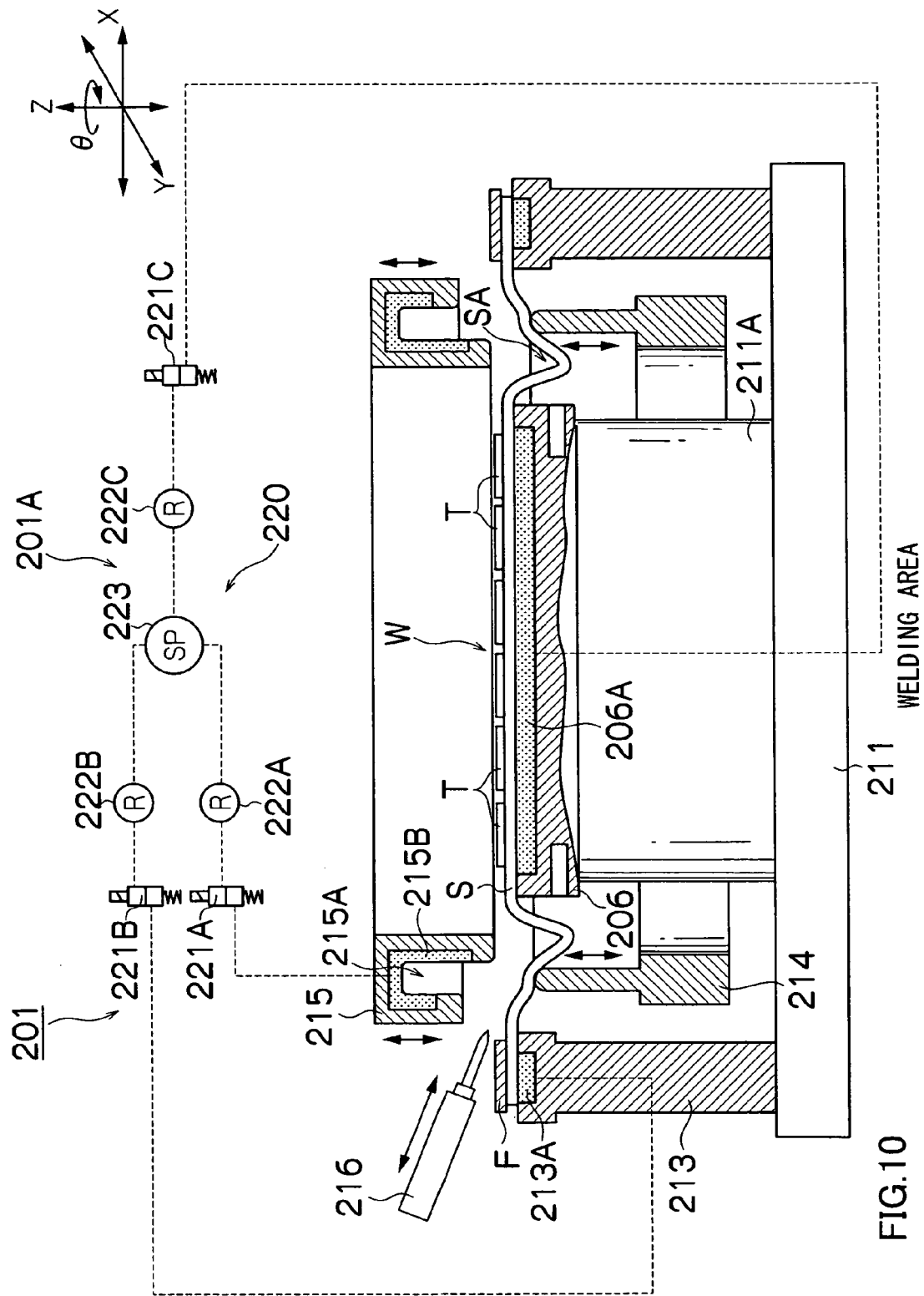
FIG. 10 is a sectional view of sheet loose part securing means according to the third embodiment.

FIG. 10 is a sectional view of the sheet loose part securing means 201A that is the expansion maintaining means placed in the welding area different from the dicing area of the dicing device. The sheet loose part securing means 201A pinches and secures bases SB of a loose part SA formed in the adhesive sheet S at the frame F to which the wafer W conveyed by the conveying means 230 is mounted.

The sheet loose part securing means 201A includes a θ table 211, a mount 211A, a frame chuck 213, a push-up member 214, a housing 215, an ultrasonic welding tool 216 as a welding tool, and pressure reducing means 220, or the like.

The θ table 211 is rotated through θ in a θ direction in FIG. 10 by an unshown drive device. A mount 211A on which the chuck stage 206 is placed and a frame chuck 213 on which the frame F is placed are mounted to the θ table 211. A porous member 213A is embedded in an upper surface of the frame chuck 213, and connected to a pressure reducing pump 233 through a solenoid valve 221B and a regulator 222B so as to suck the frame F.

The porous member 206A is embedded in the upper surface of the chuck stage 206, and connected to the pressure reducing pump 223 that constitutes the pressure reducing means 220 through the mount 211A, a solenoid valve 221C, and a regulator 222C so as to suck the wafer W that is a plate-like article together with the adhesive sheet S. The suction causes the chuck stage 206 to be also sucked to the mount 211A.

The ring-shaped housing 215 having an annular groove 215A is placed above a portion of the adhesive sheet S on which the frame F and the wafer W are not stuck. An inner surface of the annular groove 215A is formed of a porous member 215B, and connected to the pressure reducing pump 223 through a solenoid valve 221A and a regulator 222A so as to reduce pressure in the groove 215A. The housing 215 is vertically moved by unshown drive means and clamped at a lowering end.

The ring-shaped push-up member 214 is provided to face the housing 215 intercalated the adhesive sheet S. The push-up member 214 is vertically moved by unshown drive means and positioned so as to be raised and inserted into the groove 215A in the housing 215. An upper edge of the push-up member 214 is smoothly chamfered. The loose part SA of the adhesive sheet S is pushed up into the groove 215A in the housing 215 by the push-up member 214.

The ultrasonic welding tool 216 as the welding tool is placed outside the housing 215 in a slanting manner with a tip of the ultrasonic welding tool 216 being directed to an entrance of the groove 215A. The ultrasonic welding tool 216 is axially moved by unshown drive means to press a subject at a tip thereof while generating ultrasound.

Figure 11:
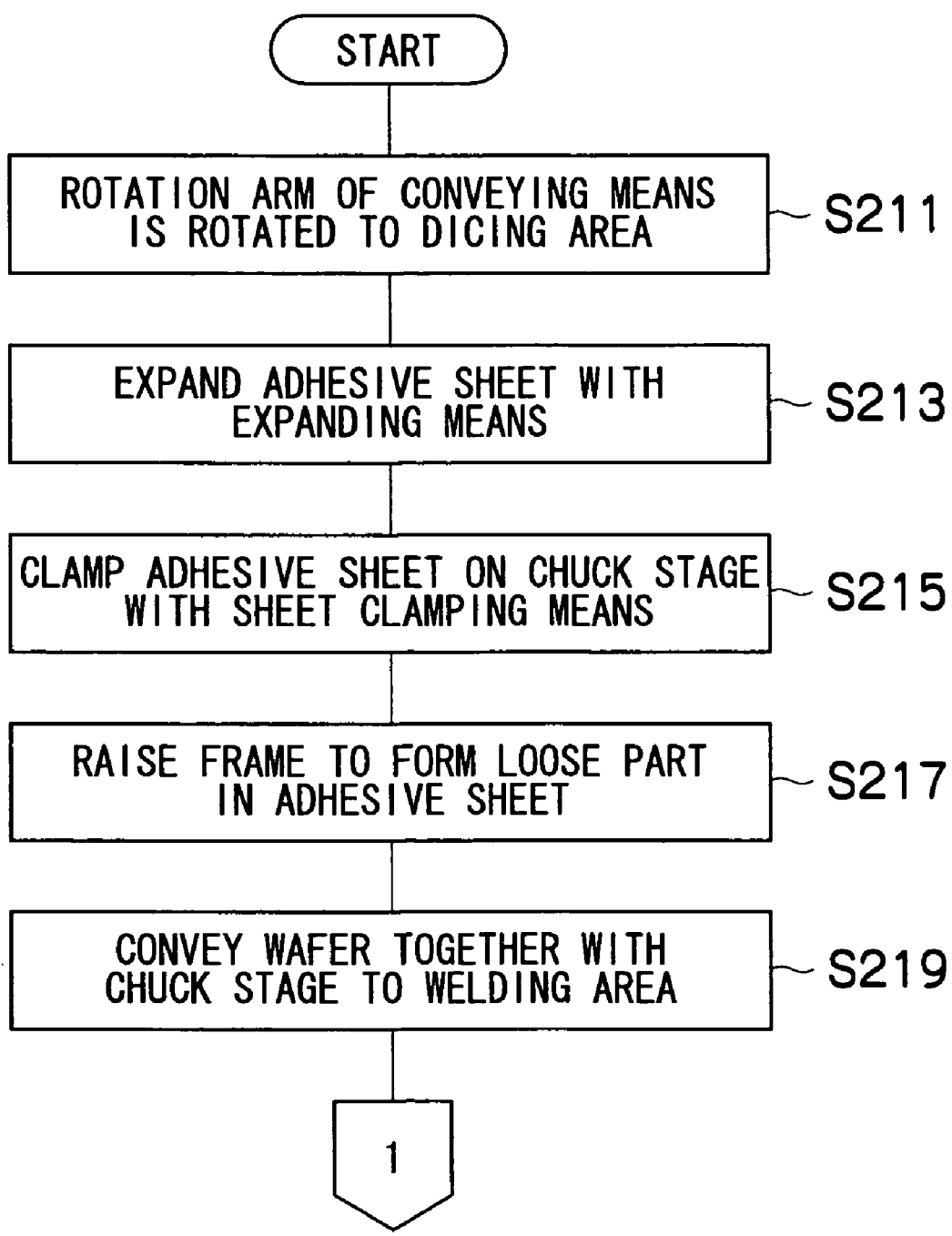
FIG. 11 is a flowchart illustrating an expanding method according to the third embodiment.
Figure 12:
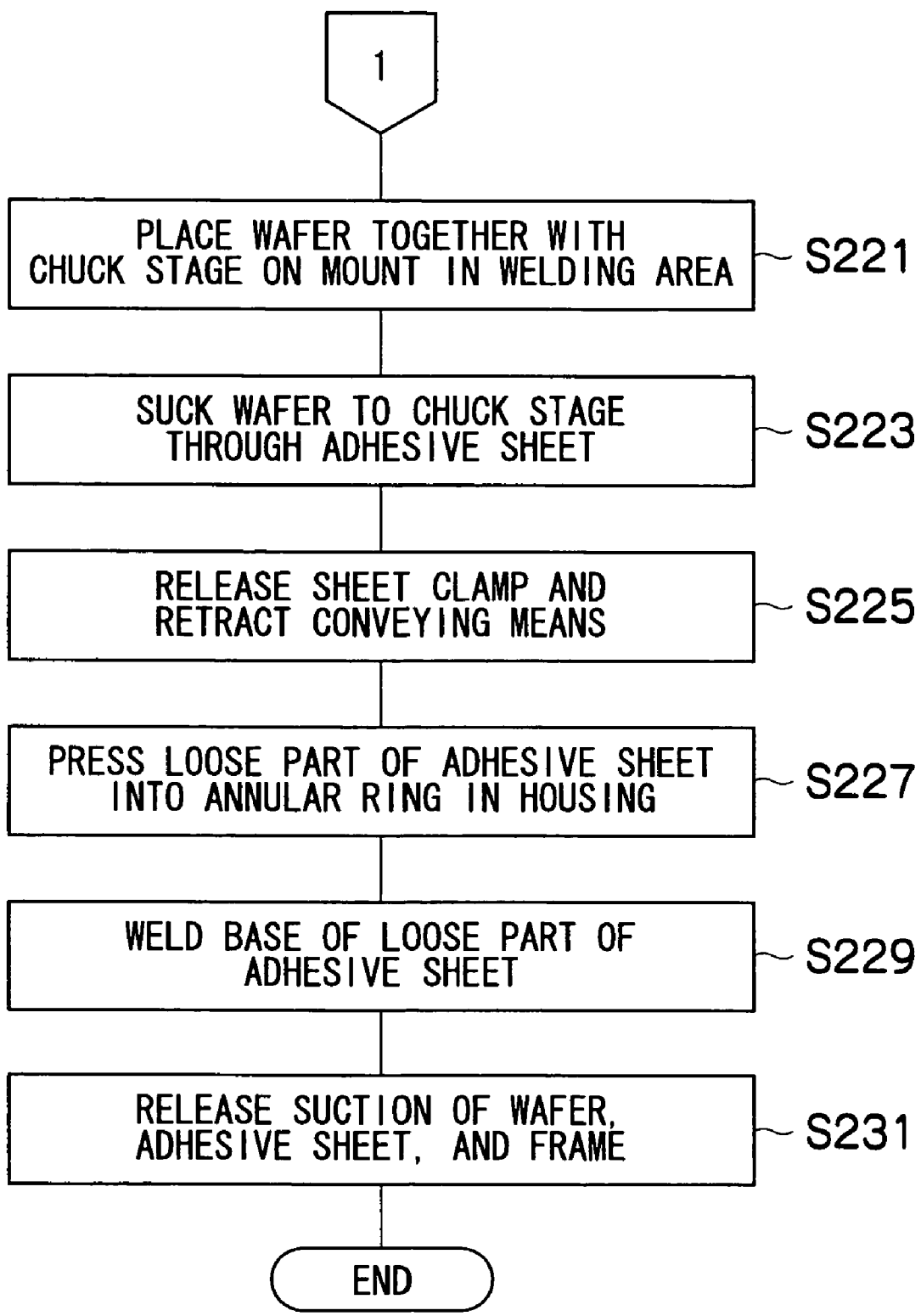
FIG. 12 is a flowchart illustrating the expanding method according to the third embodiment.

Next, an expanding method (a third embodiment) by the expanding device 201 thus configured will be described. FIGS. 11 and 12 are flowcharts of the third embodiment of the expanding method according to the invention. The wafer W mounted to the frame F through the adhesive sheet S is sucked to and placed on the chuck stage 206 in the dicing area of the dicing device, and laser-diced by an unshown laser-dicing portion.

When the laser dicing is completed, a rotation arm of the conveying means 230 is rotated and positioned above the wafer W (Step S211). The suction of the wafer W is released (that is, the suction of the adhesive sheet S to the upper surface of the chuck stage 206 is released), and the pushers 233A, 233A, ... of the expanding means 233 are lowered to suck the frame F.

Figure 13:
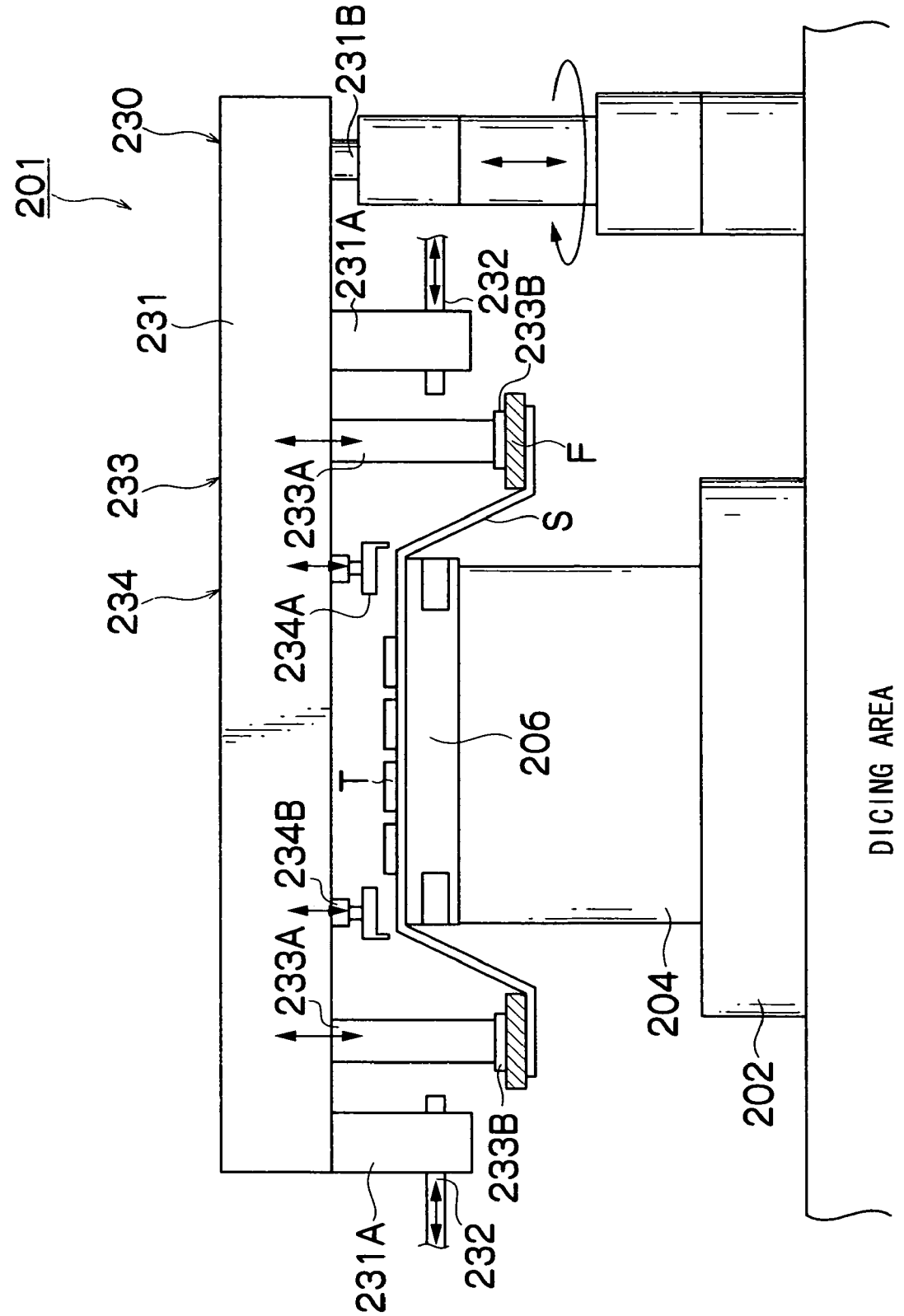
FIG. 13 is a front view for illustrating an expanding operation according to the third embodiment.

When the pushers 233A, 233A, ... are further lowered in this state, the adhesive sheet S inside the frame F including the upper portion of the chuck stage 206 is expanded (Step S213). The adhesive sheet S is expanded to increase the spacings between the individual chips T of the diced wafer W. FIG. 13 shows this state.

Next, the clamp ring 234A of the sheet clamping means 234 is lowered, and the adhesive sheet S is sandwiched and clamped between the chuck stage 206 and the clamp ring 234A. Thus, the expanded state of the expanded adhesive sheet S on the chuck stage 206 is temporarily maintained (Step S215).

Figure 14:
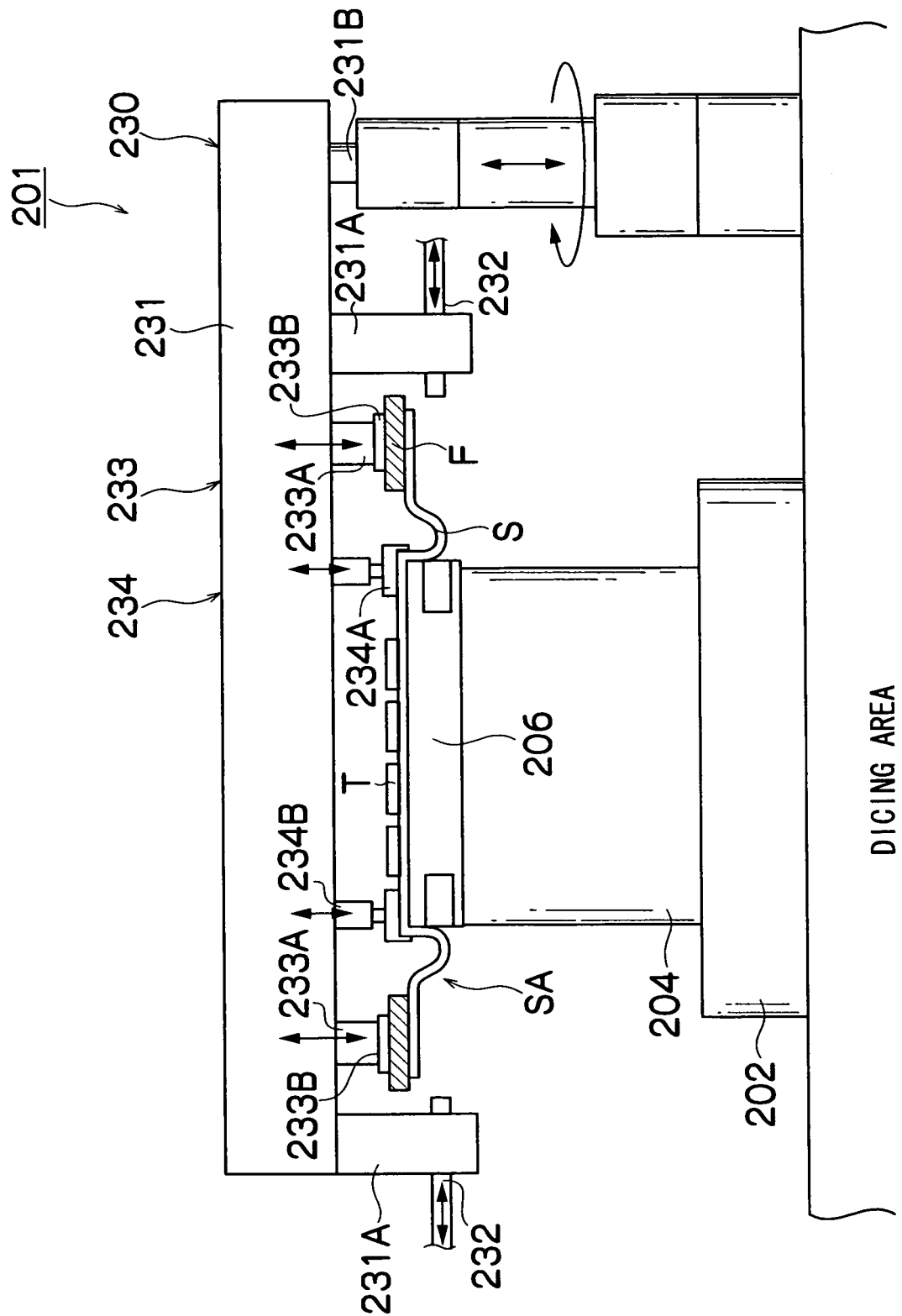
FIG. 14 is a front view for illustrating a sheet loose part forming operation according to the third embodiment.

The pushers 233A, 233A, ... that suck the frame F are then raised. When the pushers 233A, 233A, ... are raised, a loose part SA is formed in the adhesive sheet S between the outside of the clamp ring 234A and the inside of the frame F because the expanded state of the adhesive sheet S on the chuck stage 206 is maintained but the expanded state of other portions is not maintained (Step S217). FIG. 14 shows this state.

Next, the four forks 232, 232, ... of the conveying means 230 are horizontally moved and fitted in the grooves 206B formed in the side surface of the chuck stage 206 to hold the chuck stage 206. When the chuck stage 206 is held, the rotation arm 231 of the conveying means 230 is slightly raised to separate the chuck stage 206 from the Z θ stage of the dicing device with the wafer W being placed on the chuck stage 206. FIG. 8 shows this state.

Then, the rotation arm 231 is rotated to convey the wafer W, the adhesive sheet S, and the frame F together with the chuck stage 206 to the welding area different from the dicing area (Step S219), and the wafer W together with the chuck stage 206 and the frame F are placed on the mount 211A and the frame chuck 213, respectively, through the adhesive sheet S in the welding area (Step S221). Also in the conveyance, the expanded state of the adhesive sheet S on the chuck stage 206 is maintained, thereby preventing edges of the chips T from coming into contact with each other to damage the chips T.

In the welding area, the solenoid valve 221C is actuated to suck the chuck stage 206 to the mount 211A, thereby causing the wafer W to be sucked to the chuck stage 206 through the adhesive sheet S (Step S223).

At the same time, the suction of the frame F by the pushers 233A, 233A, ... is released, and then the frame F is sucked to the frame chuck 213. Next, the support rods 234B and 234B of the sheet clamping means 234 are railed to retract the clamp ring 234A from the chuck stage 206, and rotationally retract the rotation arm 231 from the welding area (Step S225).

Even if the clamp ring 234A is retracted from the chuck stage 206, the adhesive sheet S on the chuck stage 206 is sucked to the upper surface of the chuck stage 206 to maintain the expanded state. FIG. 10 shows this state.

Next, the housing 215 is lowered and secured at a position where the lower end comes into contact with the adhesive sheet S. Then, the push-up member 214 is raised and abutted against the adhesive sheet S, and further raised to push up the loose part SA of the adhesive sheet S and press the loose part SA into the groove 215A in the housing 215.

Figure 15:
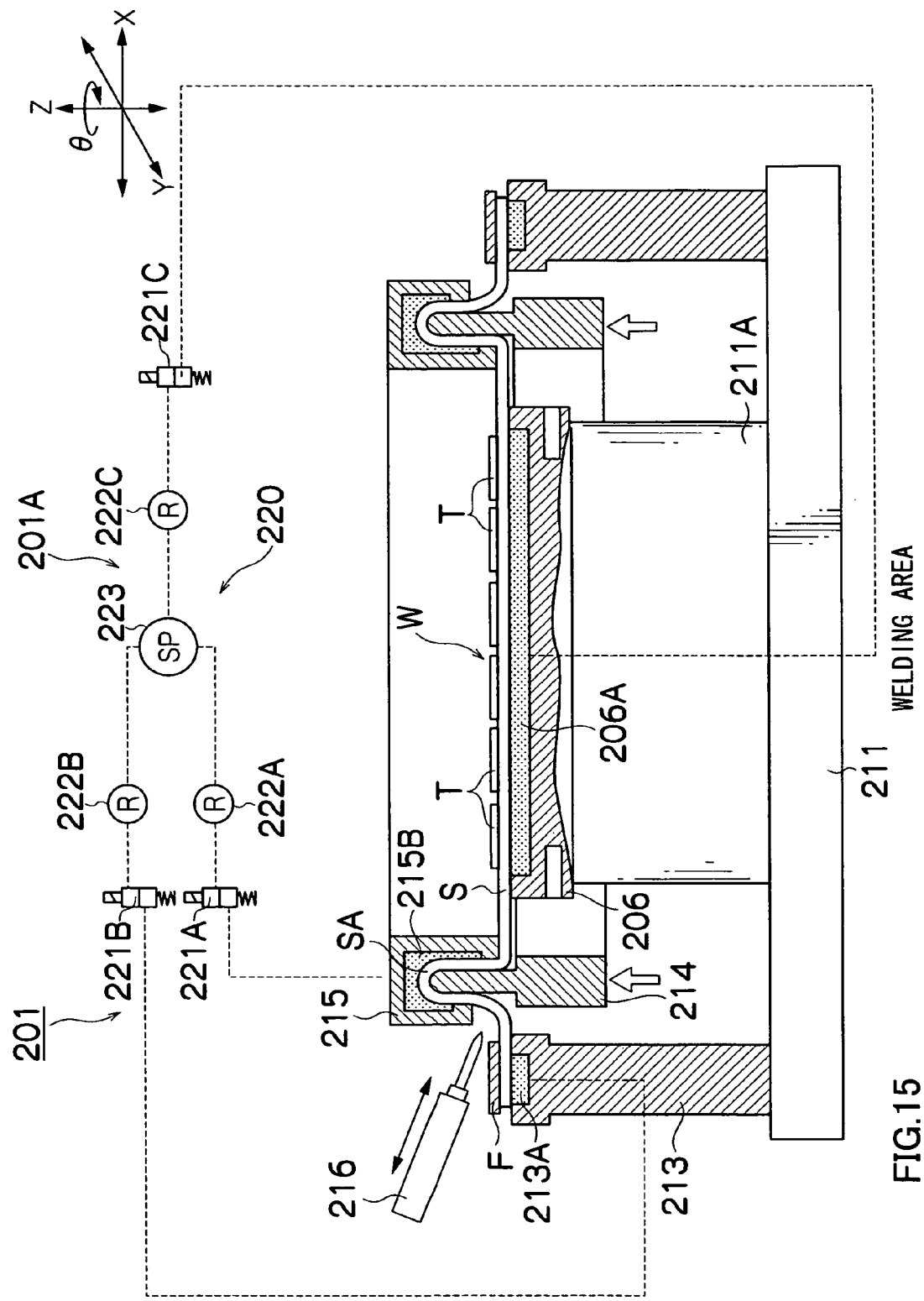
FIG. 15 is a sectional view for illustrating a sheet loose part securing operation according to the third embodiment.

Next, the solenoid valve 221A is actuated to reduce pressure in the space within the groove 215A in the housing 215 by a pressure reducing pump, and the loose part SA of the adhesive sheet S is sucked to the inner surface of the groove 215A (Step S227). The inner surface of the groove 215A is formed of the porous member 215B, thereby allowing the loose part SA to be uniformly sucked. FIG. 15 shows this state.

The push-up member 214 that has pressed the loose part SA of the adhesive sheet S into the groove 215A is then lowered. Even if the push-up member 214 is lowered, the loose part SA of the adhesive sheet S is sucked to the inner surface of the groove 215A, thereby preventing the loose part SA from hanging over.

Next, the ultrasonic welding tool 216 is advanced to press, at a tip thereof, a base SB that is a root of the loose part SA of the adhesive sheet S, and bring bases SB into contact with each other to be pressed against a wall of the groove 215A in the housing 215. Then, the ultrasonic welding tool 216 generates ultrasound to locally weld, at the tip thereof, the bases SB of the loose part SA of the adhesive sheet S. At the same time, the θ table 211 is once rotated to weld along the entire periphery of the bases SB of the annular loose part SA (Step S229).

Figure 16:
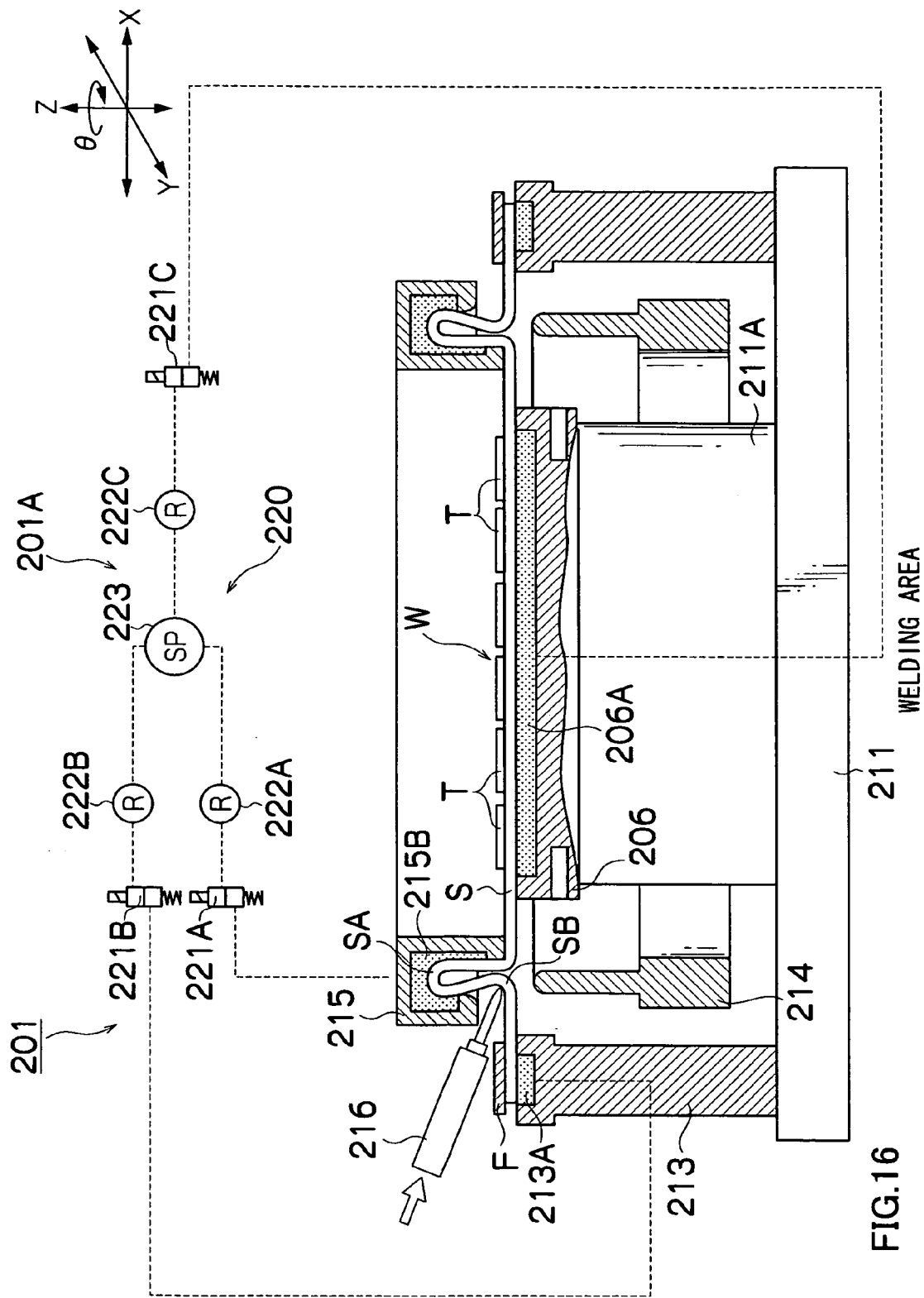
FIG. 16 is a sectional view for illustrating a sheet loose part securing operation according to the third embodiment.

FIG. 16 shows this state. For the adhesive sheet S, the base SB of the loose part SA is pressed by the tip of the ultrasonic welding tool 216 with the portion on which the wafer W is stuck being expanded and the spacings between the chips T being increased, and the bases SB are pressed against the wall of the groove 215A and locally welded by ultrasonic vibration.

The ultrasonic welding tool 216 is then retracted, the solenoid valve 221A is actuated to release the pressure reduction in the groove 215A in the housing 215, and the housing 215 is raised. Then, the solenoid valve 221B and the solenoid valve 221C are actuated to release suction forces of the chuck stage 206 and the frame chuck 213 (Step S231).

In the above described steps, the spacings between the chips T of the wafer W stuck to the adhesive sheet S and diced into the individual chips T are increased, and in this state, the loose part is formed near the outer periphery of the adhesive sheet S and the root of the loose part is pinched, thereby causing the increased spacings between the individual chips T to be maintained and allowing the diced wafer W to be conveyed together with the frame.

The expansion is preferably performed immediately after the dicing in the dicing device. The wafer W is thus conveyed together with the frame with the increased spacings between the chips T being maintained, thereby preventing edges of adjacent chips from coming into contact with each other by vibration during the conveyance to cause chipping or microcracks in the edges.

The securing of the root (the base SB) of the loose part of adhesive sheet S is performed in the area different from the dicing area, thereby minimizing reduction in the operating rate of the dicing device.

In the third embodiment described above, the frame F is pushed down to expand the adhesive sheet S, clamped, and then raised to form the loose part SA in the adhesive sheet S, but the invention is not limited to this, and the chuck stage 206 may be raised to expand the adhesive sheet S, clamped, and then lowered to form the loose part SA in the adhesive sheet S.

The bases SB of the loose part SA of the adhesive sheet S are ultrasonically welded, but not limited to the ultrasonic welding, the bases SB may be locally welded by thermocompression bonding, or bonded by an adhesive instead of the welding.

Figure 17:
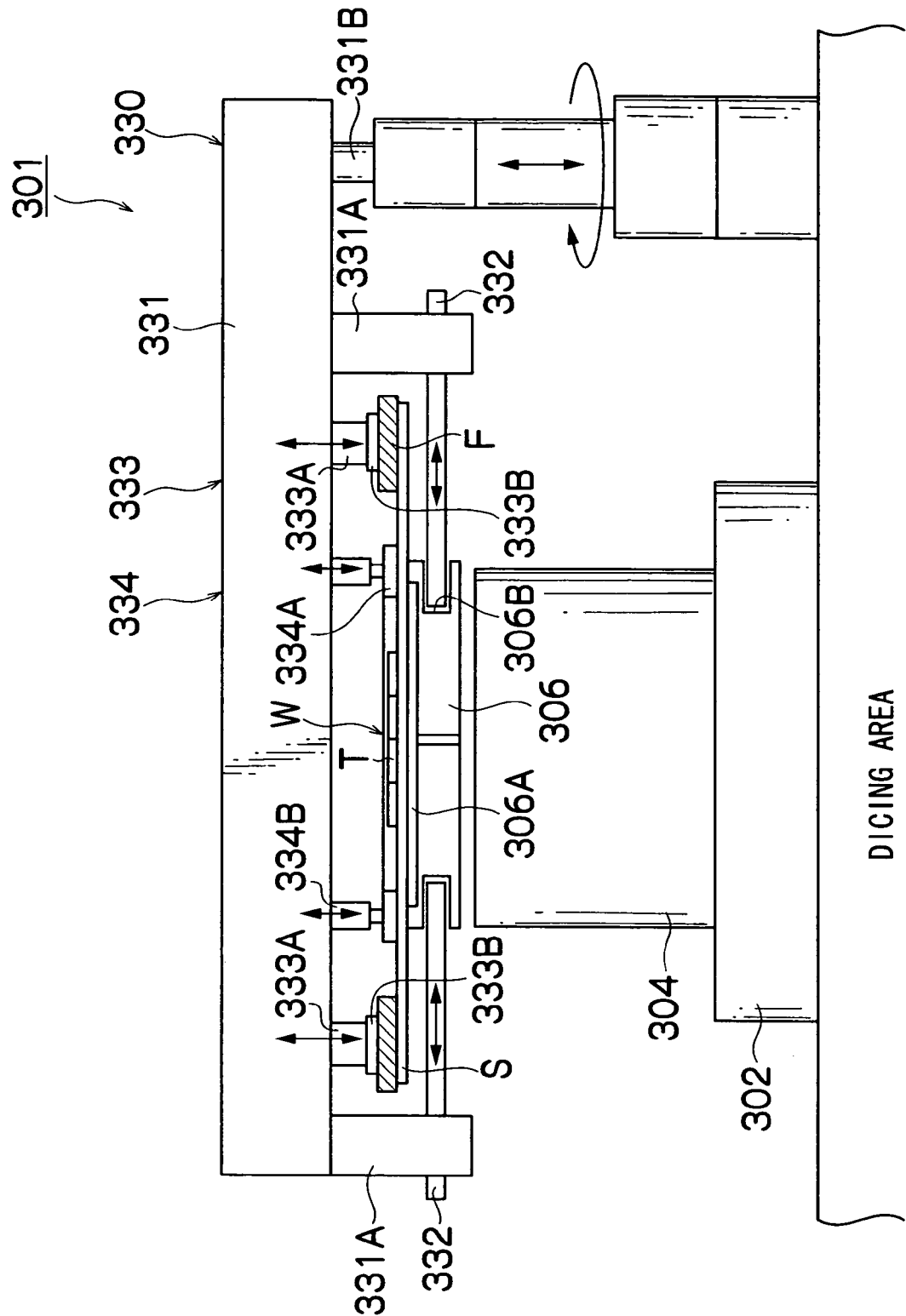
FIG. 17 is a front view of conveying means of an expanding device according to a fourth embodiment of the invention.
Figure 18:
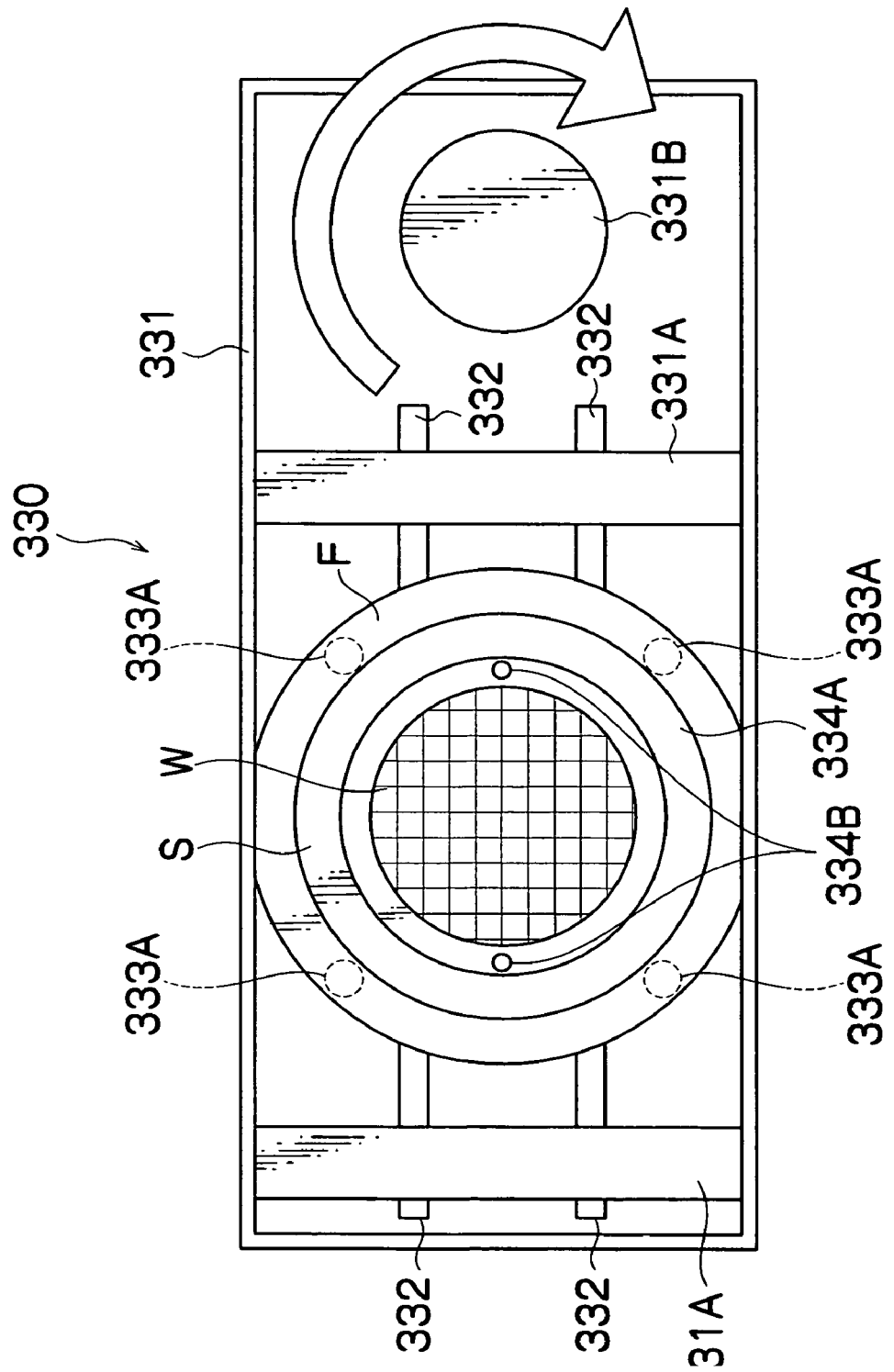
FIG. 18 is a plan view of the conveying means of the expanding device according to the fourth embodiment.

FIG. 17 illustrates a fourth embodiment of an expanding device according to the invention, and is a front view of a state where a conveying device that is part of the expanding device is positioned in a dicing area of a dicing device. FIG. 18 is a plan view thereof.

As shown in FIGS. 17 and 18, an expanding device 301 includes conveying means 330, frame sucking means 333 mounted to the conveying means 330, sheet pressing means 334, and expanding means 301A provided in a below described expanding area (a different area), and sheet loose part securing means 301B that is expansion maintaining means.

The conveying means 330 conveys a wafer W that is a plate-like article mounted to a frame F through an adhesive sheet S together with a chuck stage 306 of the dicing device from the dicing area to the expanding area (the different area), and includes a rotation arm 331 that is rotated around a shaft 331B and vertically moved by unshown drive means, two support beams 331A and 331A, four forks 332, 332, ... that are provided two for each of the support beams 331A and 331A, are horizontally moved by unshown drive means, and hold the chuck stage 306, frame sucking means 333, and sheet pressing means 334, or the like.

The frame sucking means 333 mounted to the conveying means 330 includes four pushers 333A, 333A, ... extendable by an unshown air cylinder, and a suction pad 333B mounted to a tip of each pusher 333A.

The pusher 333A and the suction pad 333B have vacuum paths, and are connected to an unshown pressure reducing device to suck a frame F. The suction pad 333B is made of a thin rubber material so as to ensure suction of the frame F.

The sheet pressing means 334 mounted to the conveying means 330 includes a sheet pressing ring 334A that clamps the adhesive sheet on the chuck stage 306, and two support rods 334B and 334B that support the sheet pressing ring 334A and are vertically extendable by an unshown air cylinder.

The sheet pressing ring 334A presses and clamps the adhesive sheet S on the chuck stage 306.

The chuck stage 306 of the dicing device is placed on an upper surface of a Z θ stage 304 incorporated into an XY table 302 placed in the dicing area, and is sucked by vacuum to the Z θ stage 304 together with the wafer W on the chuck stage 306.

A porous member 306A is embedded in an upper surface of the chuck stage 306 so as to uniformly suck the wafer W through the adhesive sheet S. A groove 306B is formed in a lower portion on a side surface of the chuck stage 306, and the fork 332 of the conveying means 330 is inserted into the groove 306B.

Figure 19:
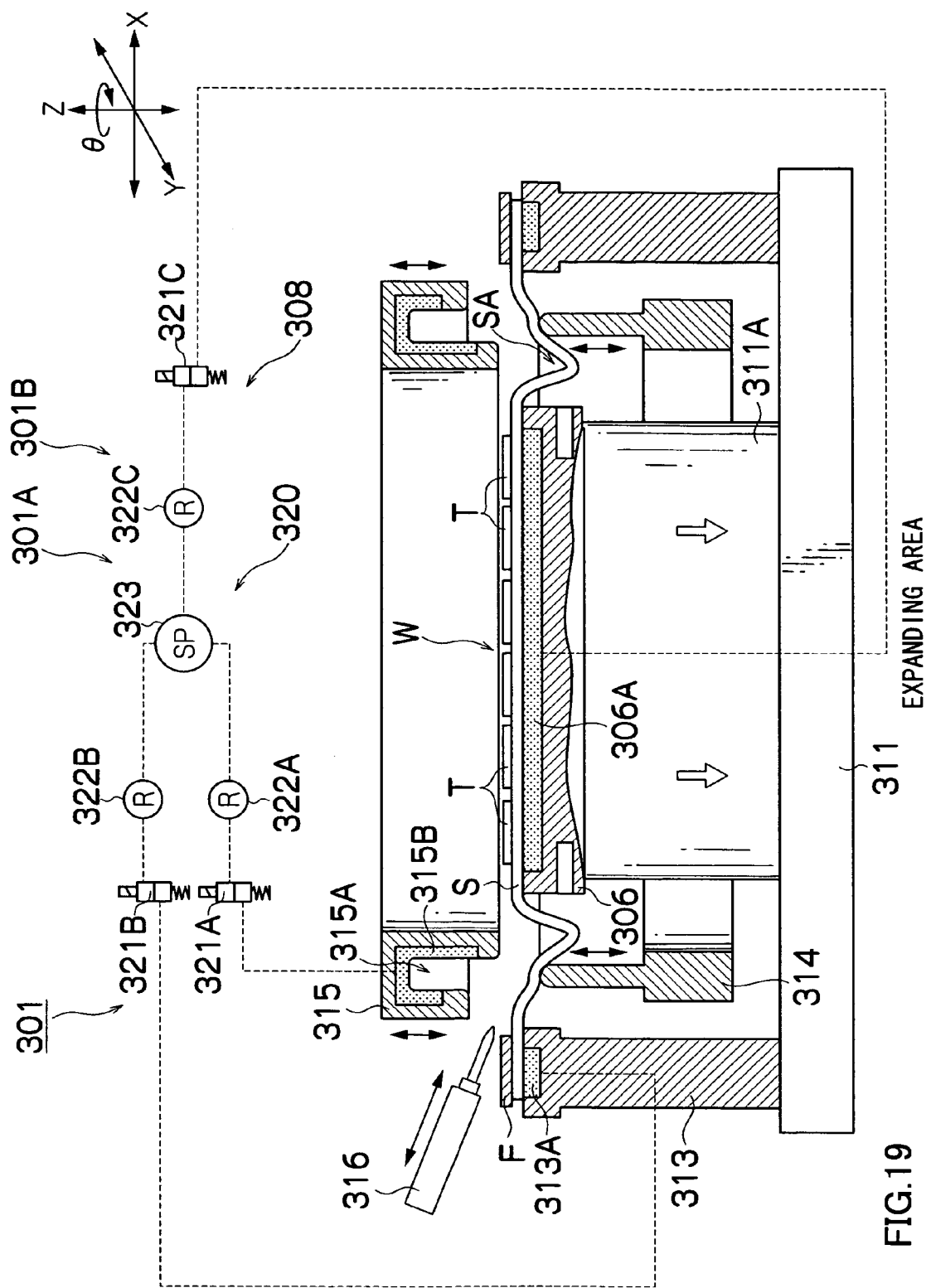
FIG. 19 is a sectional view of expanding means and sheet loose part securing means of the expanding device according to the fourth embodiment.

FIG. 19 is a sectional view of the expanding means 301A placed in the expanding area different from the dicing area of the dicing device, and the sheet loose part securing means 301B that is the expansion maintaining means.

The expanding means 301A stretches the adhesive sheet S on which the wafer W is stuck to increase spacings between individual chips, and includes a lift stand 311A on which the wafer W is placed together with the chuck stage 306 and that is vertically moved by unshown drive means, a frame chuck 313 that sucks and secures the frame F, and pressure reducing means 320, or the like.

The pressure reducing means 320 includes solenoid valves 321A, 321B and 321C, regulators 322A, 322B and 322c, and a pressure reducing pump 323, and the pressure reducing pump 323, the solenoid valve 321B, and the regulator 322B are used as the expanding means 301A.

A porous member 313A is embedded in an upper surface of the frame chuck 313, and connected to the pressure reducing pump 323 through the solenoid valve 321B and the regulator 322B so as to suck the frame F.

The porous member 306A is embedded in the upper surface of the chuck stage 306, and connected to the pressure reducing pump 323 through the lift stand 311A, the solenoid valve 321C, and the regulator 322C so as to suck the wafer W that is a plate-like article together with the adhesive sheet S. The suction causes the chuck stage 306 to be also sucked to the mount 311A.

The lift stand 311A is raised with the suction of the wafer W together with the adhesive sheet S by the chuck stage 306 being released and with the frame F being chucked by the frame chuck 313, thereby expanding the adhesive sheet S.

When the adhesive sheet S is secured to the chuck stage 306 by the sheet securing means 308 after the expansion, and the lift stand 311A is lowered in this state, a loose part is formed in a portion of the adhesive sheet S outside the chuck stage 306.

The sheet securing means 308 is suction means of the adhesive sheet S including the chuck stage 306, the lift stand 311A, the solenoid valve 321C, the regulator 322C, and the pressure reducing pump 323, and the expanded adhesive sheet is sucked and secured onto the chuck stage 306 to temporarily maintain the expanded state.

The sheet loose part securing means 301B pinches and secures bases SB of a loose part SA formed in the adhesive sheet S at the frame F to which the wafer W conveyed by the conveying means 330 is mounted.

The sheet loose part securing means 301B includes a $\theta$ table 311, the lift stand 311A (shared with the expanding means 301A), the frame chuck 313 (shared with the expanding means 301A), a push-up member 314, a housing 315, an ultrasonic welding tool 316 as a welding tool, the pressure reducing pump 323 of the pressure reducing means 320, the solenoid valves 321A and 321C, and the regulators 322A and 322C, or the like.

The $\theta$ table 311 is rotated through $\theta$ in a $\theta$ direction in FIG. 19 by an unshown drive device. The lift stand 311A on which the chuck stage 306 is placed and the frame chuck 313 on which the frame F is placed are mounted to the $\theta$ table 311.

The ring-shaped housing 315 having an annular groove 315A is placed above a portion of the adhesive sheet S on which the frame F and the wafer W are not stuck. An inner surface of the annular groove 315A is formed of a porous member 315B, and connected to the pressure reducing pump 323 through the solenoid valve 321A and the regulator 322A so as to reduce pressure in the groove 315A. The housing 315 is vertically moved by unshown drive means and clamped at a lowering end.

The ring-shaped push-up member 314 is provided to face the housing 315 intercalated the adhesive sheet S. The push-up member 314 is vertically moved by unshown drive means and positioned so as to be raised and inserted into the groove 315A in the housing 315. An upper edge of the push-up member 314 is smoothly chamfered. The loose part SA of the adhesive sheet S is pushed up into the groove 315A in the housing 315 by the push-up member 314.

The ultrasonic welding tool 316 as the welding tool is placed outside the housing 315 in a slanting manner with a tip of the ultrasonic welding tool 316 being directed to an entrance of the groove 315A. The ultrasonic welding tool 316 is axially moved by unshown drive means to press a subject at a tip thereof while generating ultrasound and weld the subject.

Figure 20:
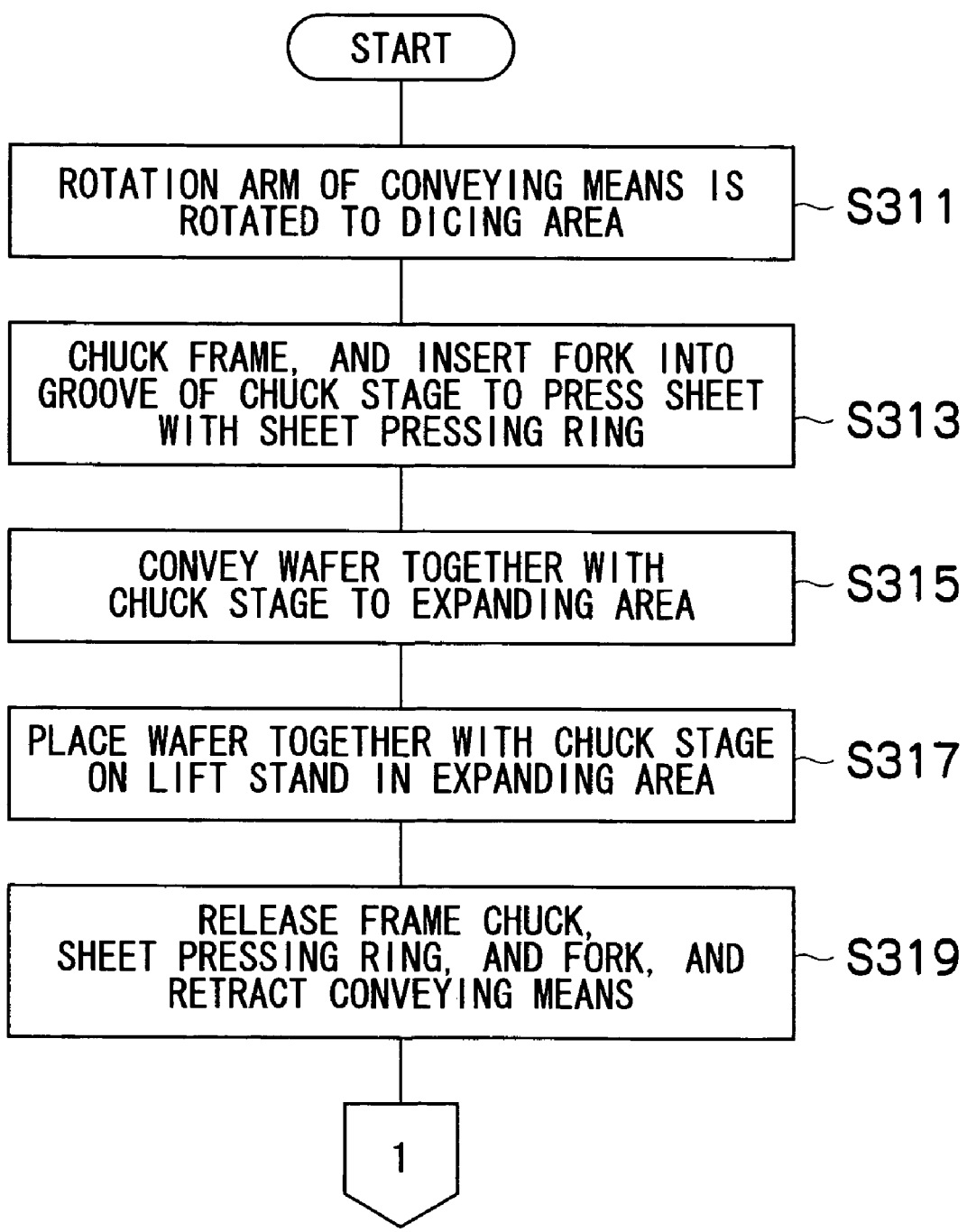
FIG. 20 is a flowchart illustrating an expanding method according to the fourth embodiment.
Figure 21:
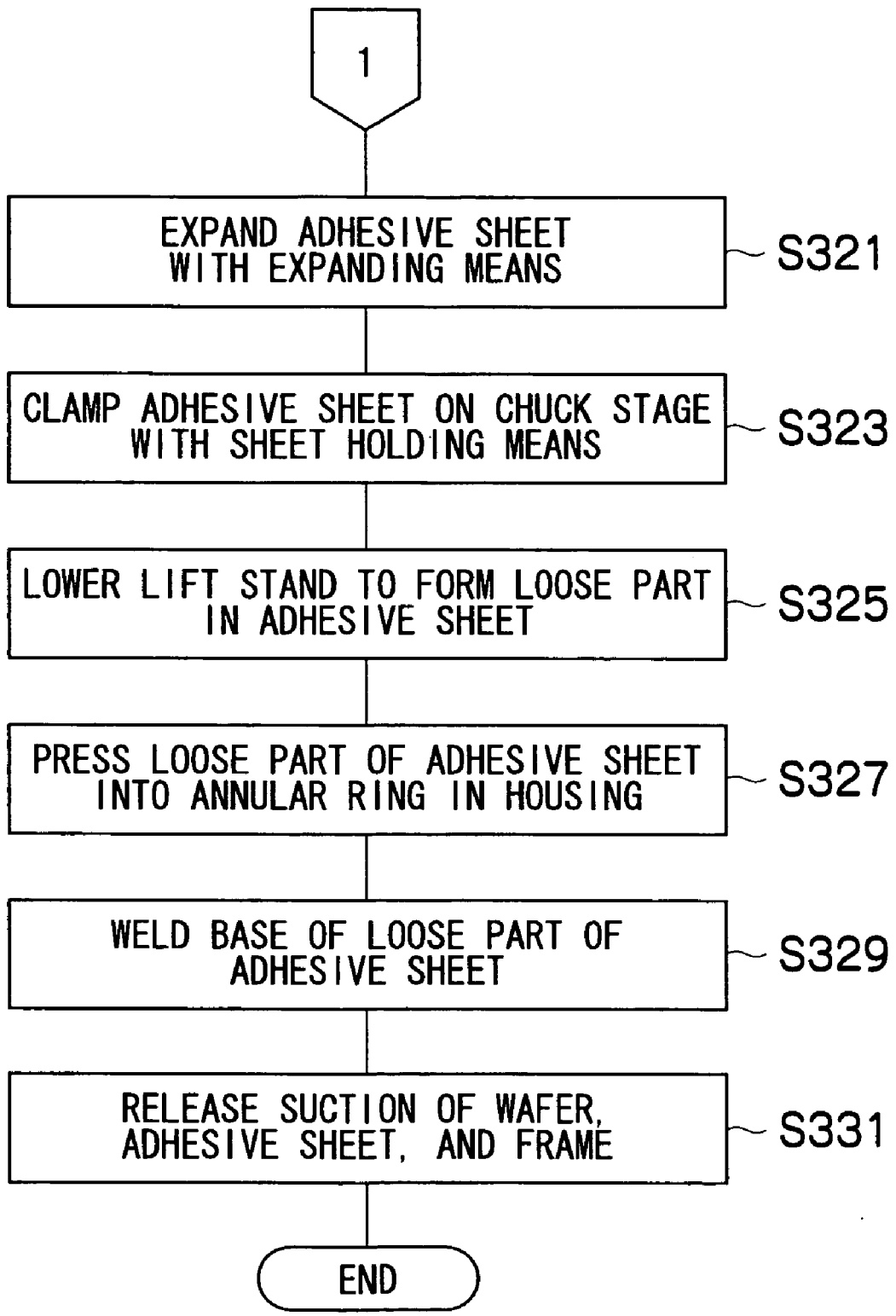
FIG. 21 is a flowchart illustrating the expanding method according to the fourth embodiment.

Next, an expanding method (a fourth embodiment) by the expanding device 301 thus configured will be described. FIGS. 20 and 21 are flowcharts of the fourth embodiment of the expanding method according to the invention. The wafer W mounted to the frame F through the adhesive sheet S is sucked to and placed on the chuck stage 306 in the dicing area of the dicing device, and laser-diced by an unshown laser-dicing portion.

When the laser dicing is completed, a rotation arm of the conveying means 330 is rotated and positioned above the wafer W (Step S311). The frame sucking means 333 and 333, . . . of the conveying means 330 are then lowered to suck the upper surface of the frame F by the suction pads 333B. Then, the forks 332, 332, . . . of the conveying means 330 are inserted into the groove 306B in the chuck stage 306 to hold the chuck stage 306, and the sheet pressing means 334 is lowered to sandwich the adhesive sheet S between the sheet pressing ring 334A and the upper surface of the chuck stage 306 (Step S313).

Next, the suction of the frame F sucked at the dicing on the side of the adhesive sheet S is released, the suction of the wafer W is released, and the securing to the Z $\theta$ stage 304 of the chuck stage 306 sucked and secured to the Z $\theta$ stage 304 together with the wafer W is also released.

When the securing of the chuck stage 306 to the Z $\theta$ stage 304 is released, the arm 331 of the conveying means 330 is raised (FIG. 17 shows this state), and then rotated around the shaft 331B to convey the wafer W, the adhesive sheet S, and the frame together with the chuck stage 306 from the dicing area to the expanding area (Step S315).

When the arm 331 of the conveying means 330 is rotated to the expanding area, the arm 331 is lowered to place the chuck stage 306 on which the wafer W is placed on the lift stand 311A, and place the frame F on the frame chuck 313 (Step S317). In the conveyance, the adhesive sheet S on the chuck stage 306 is pressed onto the upper surface of the chuck stage 306, thereby preventing edges of the chips T from coming into contact with each other to damage the chips T.

Next, the solenoid valve 321B is actuated to suck and secure the frame F to the frame chuck 313. Then, the sheet pressing means 334 is raised to separate the sheet pressing ring 334A from the adhesive sheet S, and release the suction on the upper surface of the frame F by the frame sucking means 333, 333, . . . , and the forks 332, 332, . . . are horizontally moved and drawn out of the grooves 306B in the chuck stage 306 to release the holding of the chuck stage 306.

Figure 22:
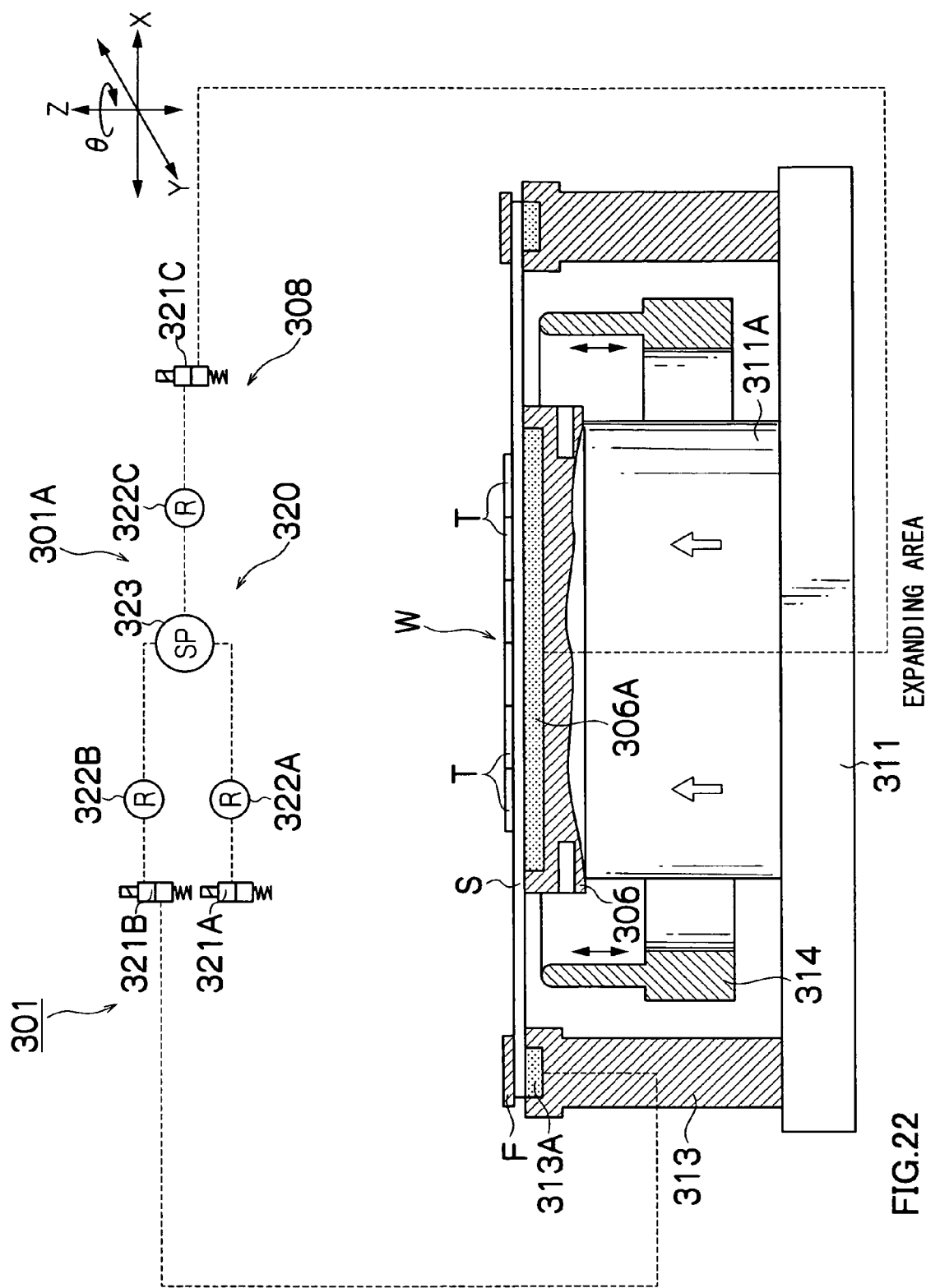
FIG. 22 is a sectional view for illustrating a state of a wafer conveyed into an expanding area.

The arm 331 is then slightly raised and rotated to retract the conveying means 330 (Step S319). FIG. 22 shows this state, and the frame F is sucked and secured onto the frame chuck, the wafer W has not yet been sucked to the chuck stage 306, and the spacings between the diced individual chips have not yet been increased.

Figure 23:
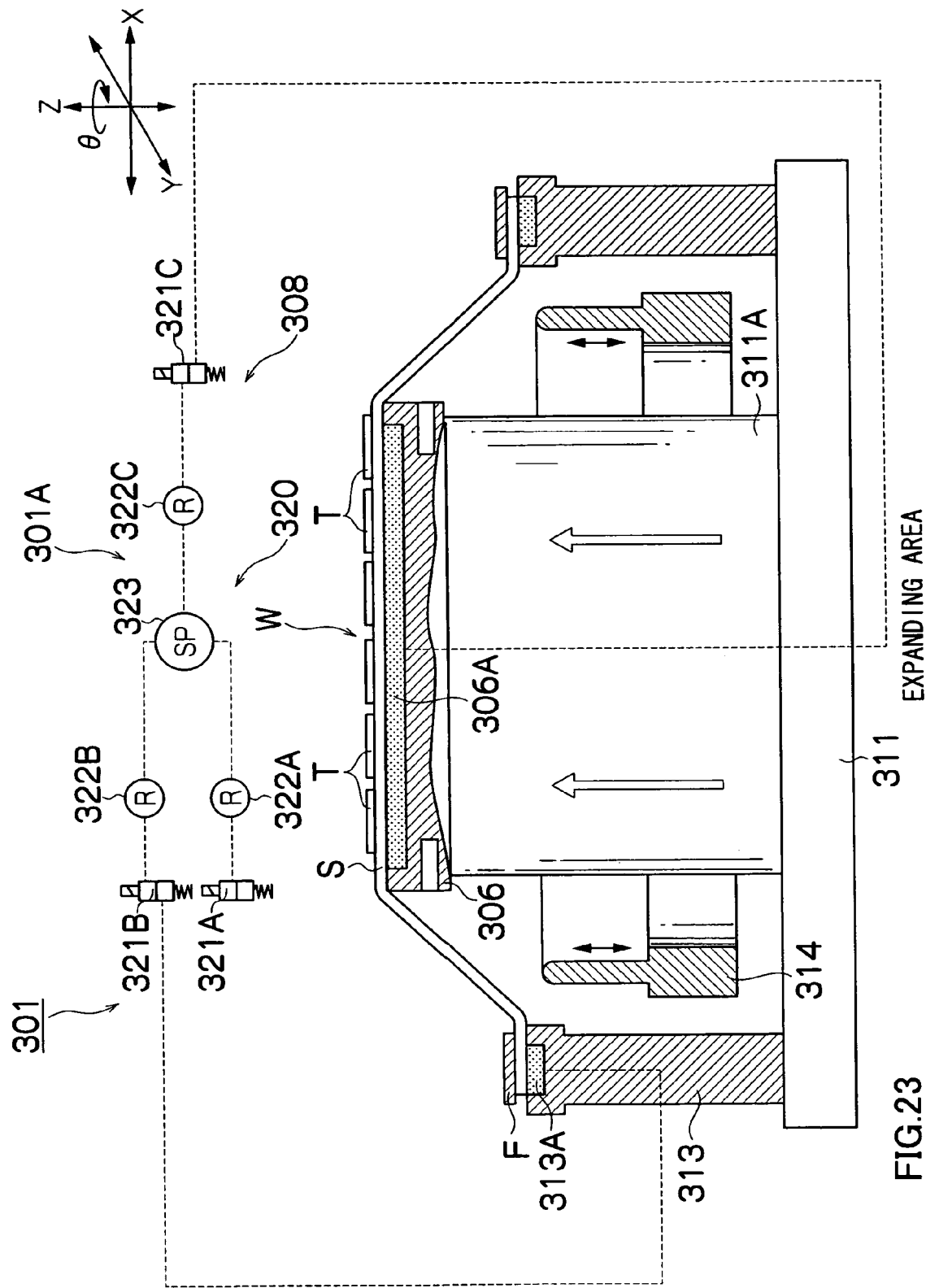
FIG. 23 is a sectional view for illustrating an expanding operation according to the fourth embodiment.

Next, the lift stand 311A is raised. When the lift stand 311A is raised, the adhesive sheet S on and outside the chuck stage 306 is stretched because the frame F is sucked and secured to the frame chuck 313, thereby increasing the spacings between the individual chips T stuck to the adhesive sheet S (Step S321). FIG. 23 shows this state.

Next, the solenoid valve 321C is actuated to suck and hold the adhesive sheet S on the chuck stage 306 to the chuck stage 306 (Step S323).

When the adhesive sheet S on the chuck stage 306 is sucked to and held on the chuck stage 306, the lift stand 311A is lowered to its original height. When the lift stand 311A is lowered to its original height, the loose part SA is formed in a portion of the adhesive sheet S outside the chuck stage 306 because the adhesive sheet S on the chuck stage 306 is sucked to and held on the chuck stage 306 to maintain the expanded state (Step S325).

The ring-shaped housing 315 having the annular groove 315A is placed above the wafer W, and the ultrasonic welding tool 316 as the welding tool is placed outside the housing 315 in a slanting manner with a tip of the ultrasonic welding tool 316 being directed to an entrance of the groove 315A in the housing 315. FIG. 19 shows this state.

Next, the housing 315 is lowered, and secured at a height where the lower end is at the same height as the upper surface of the adhesive sheet S. Then, the push-up member 314 is raised to be abutted against the adhesive sheet S, and further raised to push up the loose part SA of the adhesive sheet S and pressed into the groove 315A in the housing 315.

Figure 24:
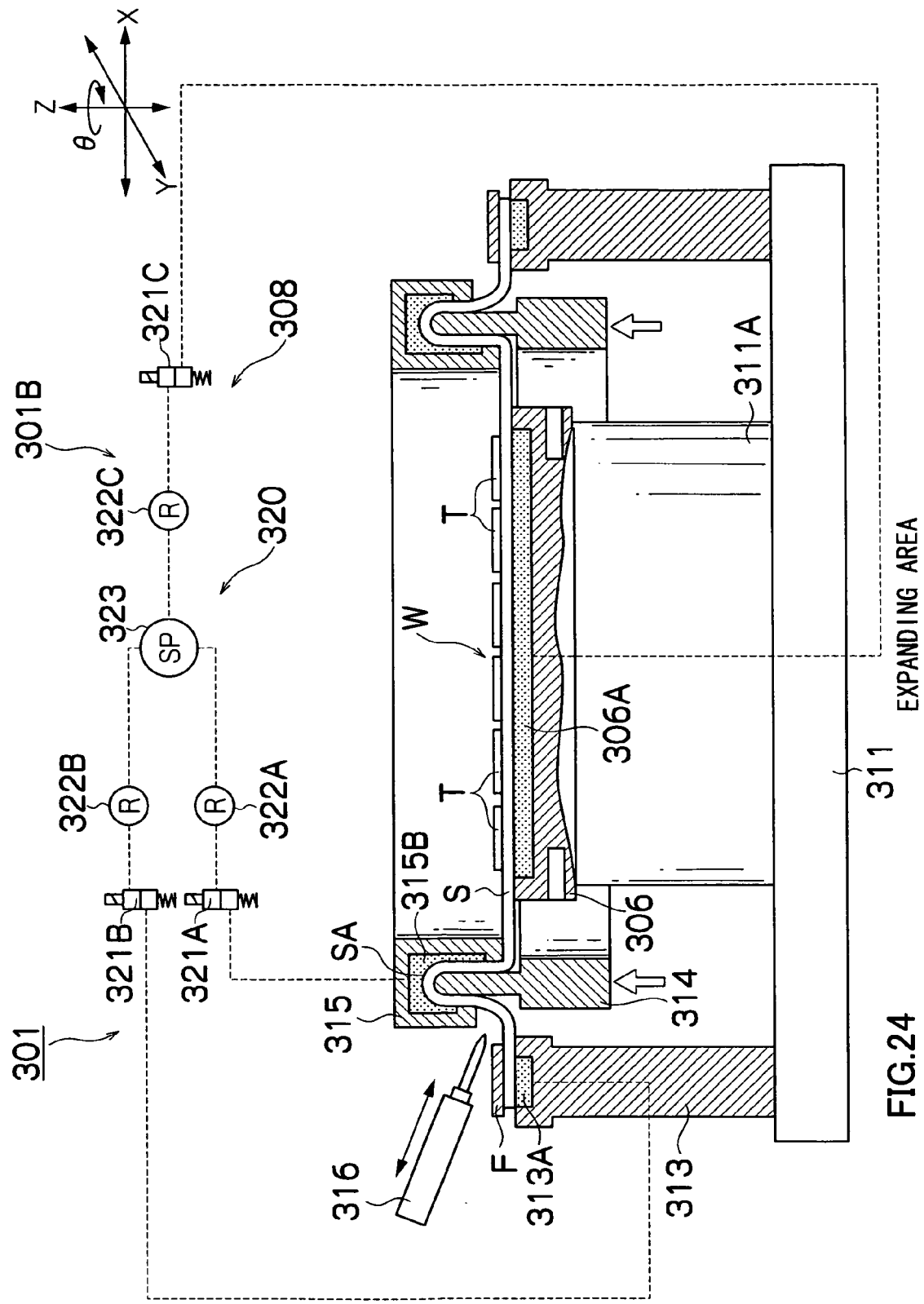
FIG. 24 is a sectional view for illustrating a sheet loose part securing operation according to the fourth embodiment.

Next, the solenoid valve 321A is actuated to reduce pressure in the space within the groove 315A in the housing 315 by a pressure reducing pump, and the loose part SA of the adhesive sheet S is sucked to the inner surface of the groove 315A (Step S327). The inner surface of the groove 315A is formed of the porous member 315B, thereby allowing the loose part SA to be uniformly sucked. FIG. 24 shows this state.

The push-up member 314 that has pressed the loose part SA of the adhesive sheet S into the groove 315A in the adhesive sheet S is then lowered. Even if the push-up member 314 is lowered, the loose part SA of the adhesive sheet S is sucked to the inner surface of the groove 315A, thereby preventing the loose part SA from hanging over.

Next, the ultrasonic welding tool 316 is advanced to press, at a tip thereof, a base SB that is a root of the loose part SA of the adhesive sheet S, and bring bases SB into contact with each other to be pressed against a wall of the groove 315A in the housing 315. Then, the ultrasonic welding tool 316 generates ultrasound to locally weld, at the tip thereof, the bases SB of the loose part SA of the adhesive sheet S. At the same time, the θ table 311 is once rotated to weld along the entire periphery of the bases SB of the annular loose part SA (Step S329).

Figure 25:
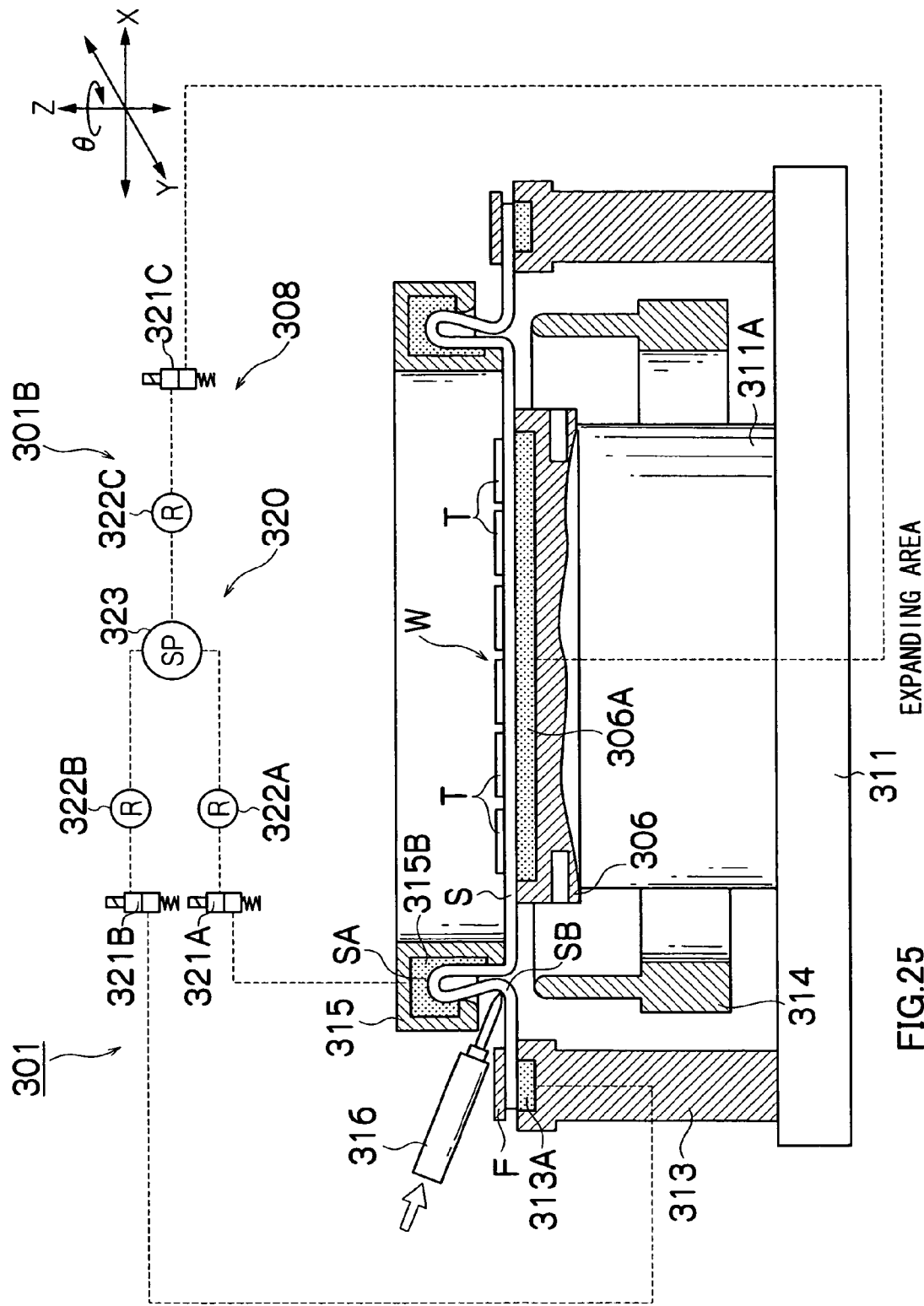
FIG. 25 is a sectional view for illustrating a sheet loose part securing operation according to the fourth embodiment.

FIG. 25 shows this state. For the adhesive sheet S, the bases SB of the loose part SA is pressed by the tip of the ultrasonic welding tool 316 with the portion on which the wafer W is stuck being expanded and the spacings between the chips T being increased, and the bases SB are pressed against the wall of groove 315A and locally welded by ultrasonic vibration.

The ultrasonic welding tool 316 is then retracted, the solenoid valve 321A is actuated to release the pressure reduction in the groove 315A in the housing 315, and the housing 315 is raised. Then, the solenoid valve 321B and the solenoid valve 321C are actuated to release suction forces of the chuck stage 306 and the frame chuck 313 (Step S331).

In the above described steps, the spacings between the chips T of the wafer W stuck to the adhesive sheet S and diced into the individual chips T are increased, and in this state, the loose part is formed near the outer periphery of the adhesive sheet S and the root of the loose part is pinched and secured, thereby causing the increased spacings between the chips T to be maintained and allowing the diced wafer W to be conveyed together with the frame.

The expansion is preferably performed immediately after the dicing in the dicing device. The wafer W is thus conveyed together with the frame with the increased spacings between the chips T being maintained, thereby preventing edges of adjacent chips from coming into contact with each other by vibration during the conveyance to cause chipping or microcracks in the edges.

The expansion of the adhesive sheet S and the securing of the root (the base SB) of the adhesive sheet S are performed in the area different from the dicing area, thereby preventing the expansion from causing reduction in the operating rate of the dicing device.

In the fourth embodiment described above, the chuck stage 306 is raised to expand the adhesive sheet S, clamped, and then lowered to form the loose part SA in the adhesive sheet S, but the invention is not limited to this, and the frame F may be pushed down to expand the adhesive sheet S, clamped, and then raised to form the loose part SA in the adhesive sheet S.

The bases SB of the loose part SA of the adhesive sheet S is ultrasonically welded, but not limited to the ultrasonic welding, the bases SB may be locally welded by thermocompression bonding, or bonded by an adhesive instead of the welding.

Figure 26:
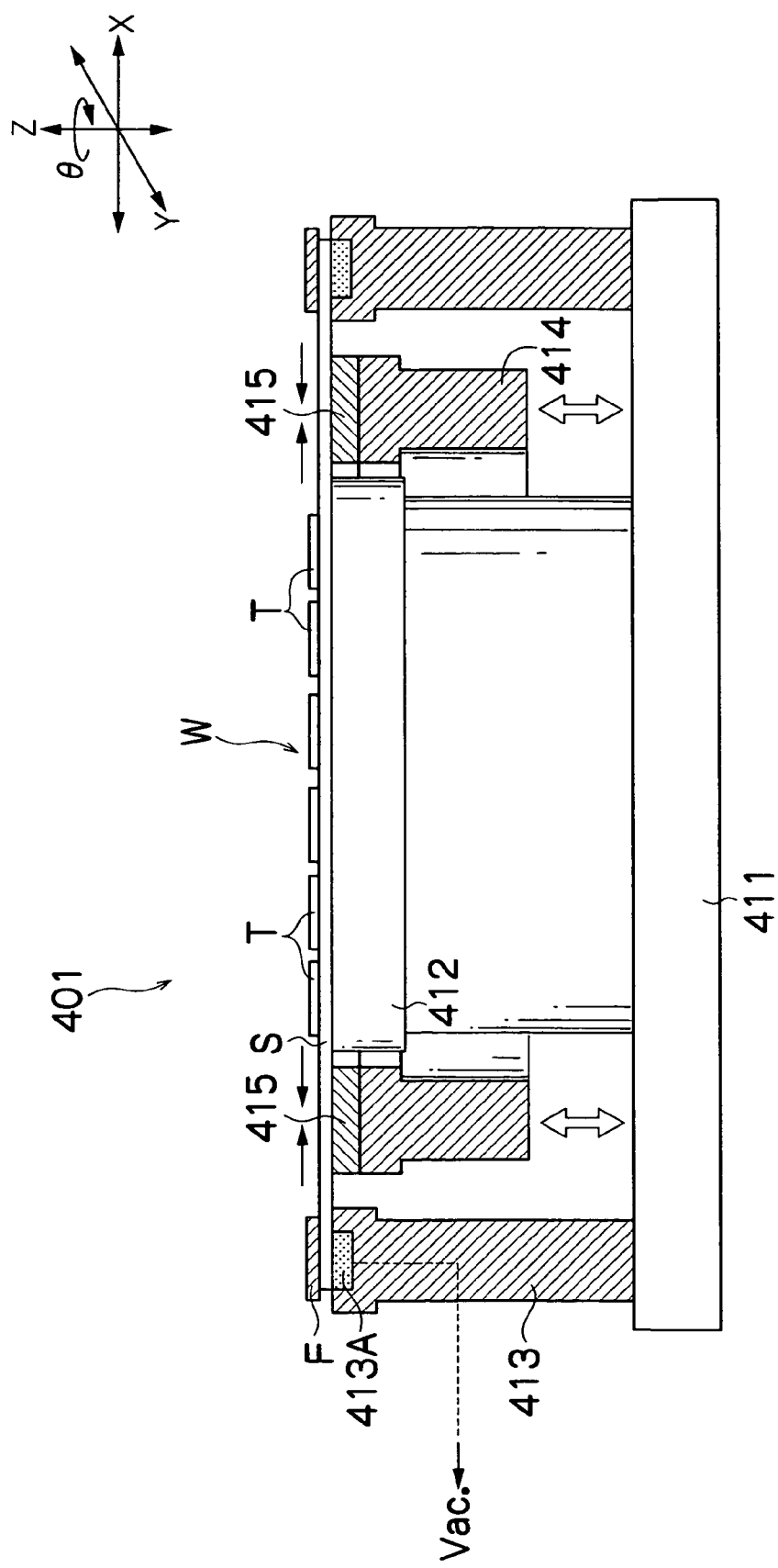
FIG. 26 is a sectional view of an expanding device according to a fifth embodiment of the invention.

FIG. 26 illustrates a fifth embodiment of an expanding device according to the invention, and the expanding device is provided in a dicing area in a dicing device. The expanding device 401 includes an XYZ θ table 411, a chuck stage 412 and a frame chuck 413 placed on the XYZθ table 411, a mounting ring 414 that surrounds the chuck stage 412 and is vertically moved by unshown drive means, and heating means 415 mounted to an upper surface of the mounting ring 414.

An unshown porous member is embedded in an upper surface of the chuck stage 412, and the chuck stage 412 is connected to pressure reducing means through the porous member so as to suck and hold a workpiece. A porous member 413A is embedded in an upper surface of the frame chuck 413, and the frame chuck 413 is connected to the pressure reducing means through the porous member 413A.

The heating means 415 mounted to the mounting ring 414 that is vertically moved heats a portion of an adhesive sheet S between a wafer W that is a plate-like article and a frame F, and a surface heating element such as a rubber heater is used.

Figure 27:
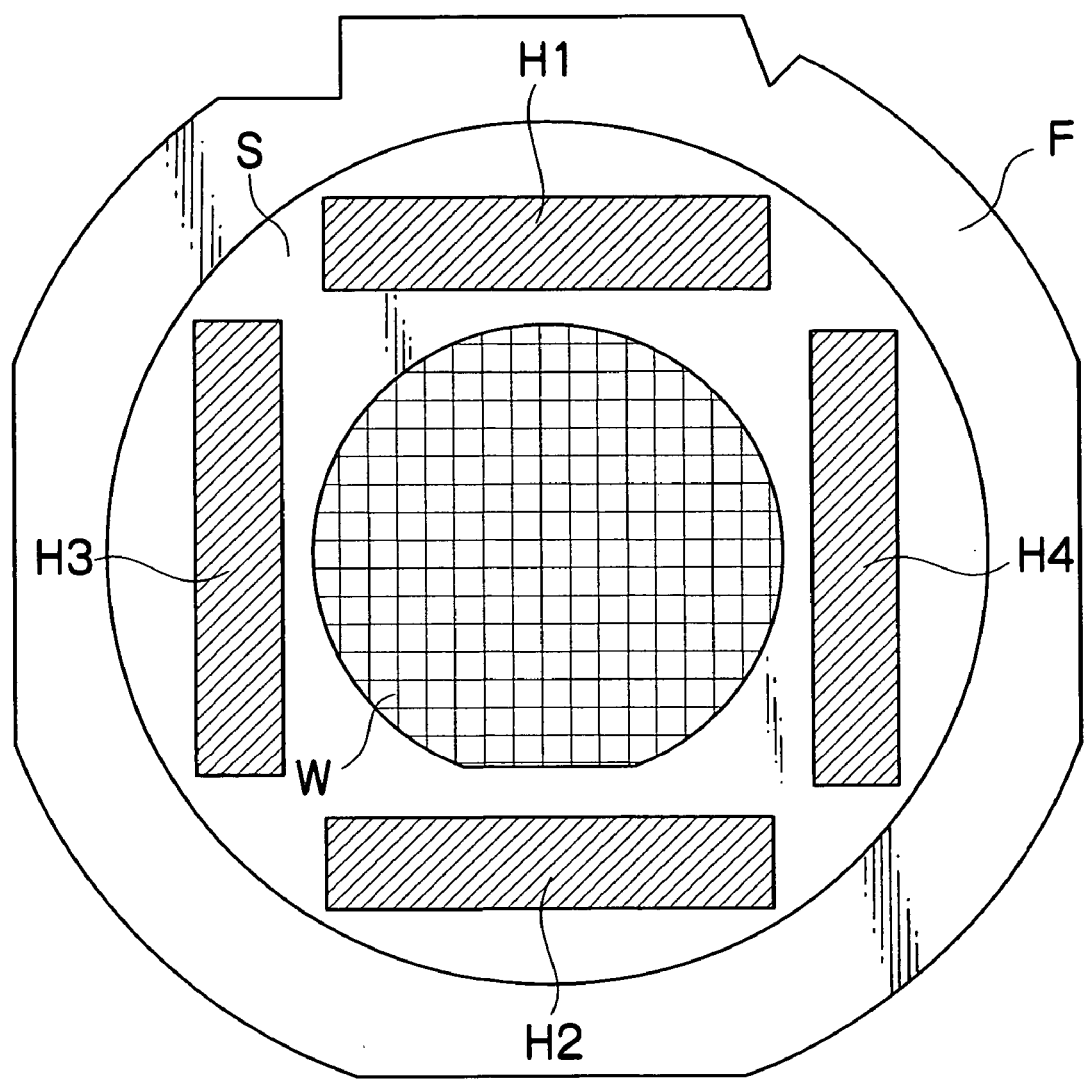
FIG. 27 is a plan view of a heating area of an adhesive sheet.

FIG. 27 is a plan view of areas to be heated in the adhesive sheet S between the wafer W and the frame F. As shown in FIG. 27, the areas to be heated in the adhesive sheet S are a pair of areas H1 and H2 in parallel with a dicing line in one direction of the wafer W, and a pair of areas H3 and H4 in parallel with a dicing line perpendicular to the dicing line in one direction. Plurality of heating means 415 have the same planar shapes as the areas H1, H2, H3 and H4 and are placed in the same positions.

For each of the heating means 415 placed in the areas H1, H2, H3 and H4, on/off control and heating temperature control can be independently performed.

Next, a fifth embodiment of an expanding method according to the invention will be described. In the dicing device including the expanding device 401 according to the invention, the wafer W is stuck to a heat-shrinkable adhesive sheet S, and introduced while being mounted to a ring-shaped frame F through the adhesive sheet S.

As a base material of the heat-shrinkable adhesive sheet S, polyolefin plastic is used that shrinks when heated at 115° C. or more and has a shrinkage percentage of −15% or more at a rate of change in length. The base material of the adhesive sheet S may be selected from polyolefin, polyvinyl chloride, polyester, and polystyrene plastics.

When the wafer W is diced, the wafer W is sucked by vacuum to the chuck stage 412 through the adhesive sheet S while being stuck to the adhesive sheet S. The frame F is also sucked to the frame chuck 413 through the adhesive sheet S. At this time, the mounting ring 414 to which the heating means 415 is mounted is placed in a lower position.

In this state, a laser light having a convergent point in the wafer W is applied to the wafer W from an unshown laser head to form a modification layer in the wafer by multiphoton absorption, and the wafer W is laser diced by relative movement between the XYZ θ table 411 and the laser light.

When the wafer W is diced, a vacuum chuck of the chuck stage is exposed to the atmosphere with the suction of the frame F remaining, and the suction of the portion of the adhesive sheet S on which the wafer W is stuck is released.

Next, the mounting ring 414 is raised to bring the heating means 415 into contact with the heating areas H1, H2, H3 and H4 of the adhesive sheet S. Then, either the pair of areas H1 and H2 or the pair of areas H3 and H4 are first heated. The adhesive sheet S is the heat-shrinkable sheet, and thus the heated areas shrink. At this time, the portion of the adhesive sheet S on which the wafer W is stuck is stretch outward to expand the spacings between the diced individual tips T in one direction.

Next, the other pair of areas are heated to perform expansion in another direction. The heating means 415 is heated up to about 120° C., the spacings between the chips are observed by a microscope or a screen of a TV camera, and the heating temperature of each area is controlled according to an expansion situation of each portion.

Next, the heating means 415 is lowered, and at the same time, the suction of the frame F is released. Even if the heating of the areas H1, H2, H3 and H4 in the adhesive sheet S is released, the adhesive sheet S remains shrunk to maintain the expanded state of the portion on which the wafer W is stuck, thereby allowing the wafer W to be conveyed while being mounted to the frame F with the spacings between the chips being increased.

Thus, the wafer W is expanded without being detached from the chuck stage 412 immediately after the dicing, and the spacings between the individual chips are increased, thereby preventing edges of the chips T from coming into contact with each other during the conveyance.

When either the pair of the areas H1 and H2 or the pair of areas H3 and H4 in the adhesive sheet S are first heated and expanded in one direction, and then the other pair of areas are heated and expanded in another direction, on/off control of the heating means 415 corresponding to each area may be used, or the mounting ring 414 may be divided to independently vertically move the areas.

The four heating areas are provided in the adhesive sheet S, but the heating areas may be further separated into smaller areas for finer control.

Figure 28:
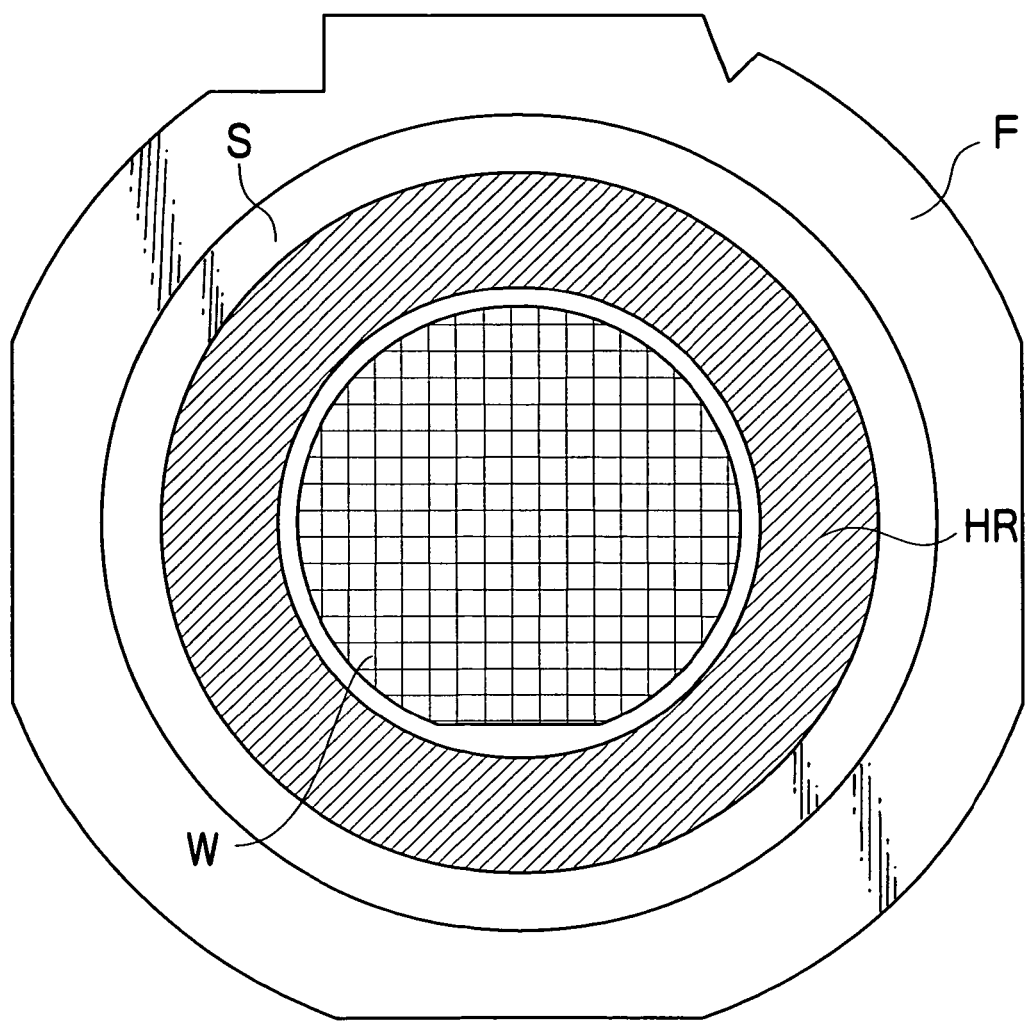
FIG. 28 is a plan view of another embodiment of a heating area of the adhesive sheet.

For uniform expansion toward the outer periphery regardless of the direction of the dicing line, the areas H1, H2, H3 and H4 to be heated may be heated at the same time. For the uniform expansion regardless of the direction of the dicing line, as shown in FIG. 28, the area to be heated in the adhesive sheet S may be an annular area HR, and the heating means 415 may have the same annular shape.

Figure 29:
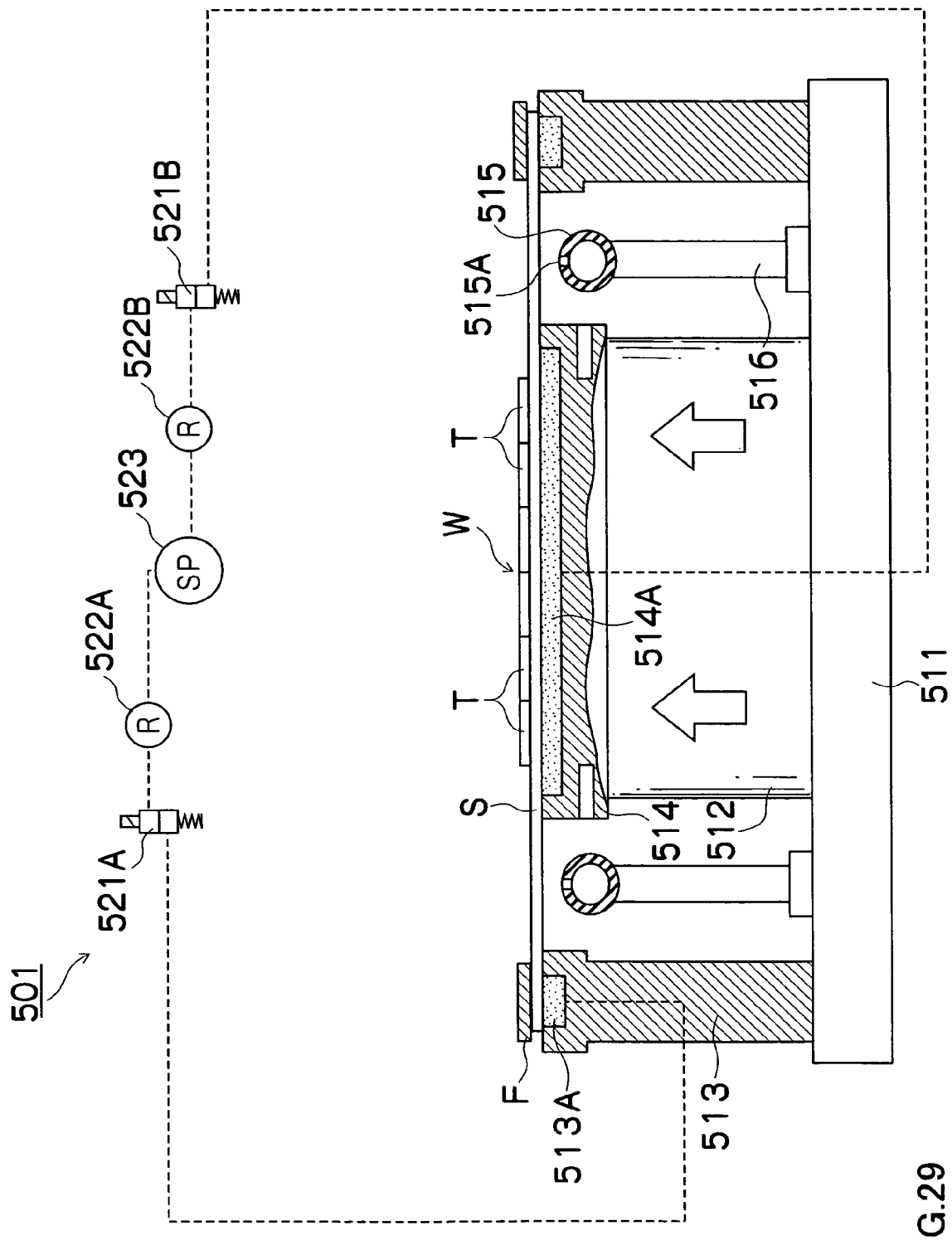
FIG. 29 is a sectional view of an expanding device according to a sixth embodiment of the invention.

FIG. 29 illustrates a sixth embodiment of an expanding device of the invention. The expanding device 501 includes a base 511, an extendable table 512 and a frame chuck 513 that are expanding means placed on the base 511, a chuck stage 514 mounted to the extendable table 512, and a jet pipe 515 that is expansion maintaining means mounted to the base 511 intercalated a holder 516, or the like.

A porous member 514A is embedded in an upper surface of the chuck stage 514, and connected to a vacuum pump 523 through a solenoid valve 521B and a regulator 522B so as to suck and hold a wafer W that is a plate-like article workpiece together with an adhesive sheet S.

A porous member 513A is embedded in an upper surface of the frame chuck 513, and connected to a vacuum pump 523 through a solenoid valve 521A and a regulator 522A so as to suck and hold the frame F together with the adhesive sheet S.

The extendable table 512 is vertically extendable by unshown drive means to vertically move the wafer W on the chuck stage 514 together with the adhesive sheet S.

The jet pipe 515 is connected to a hot air source through a ring-shaped pipe, and jets hot air upward from multiple jet orifices 515A, 515A, . . . formed in the upper surface.

Figure 3:
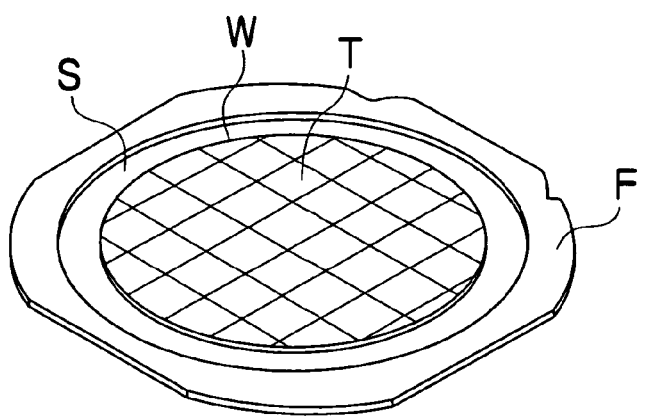
FIG. 3 is a perspective view of a wafer mounted to a frame.
Figure 30:
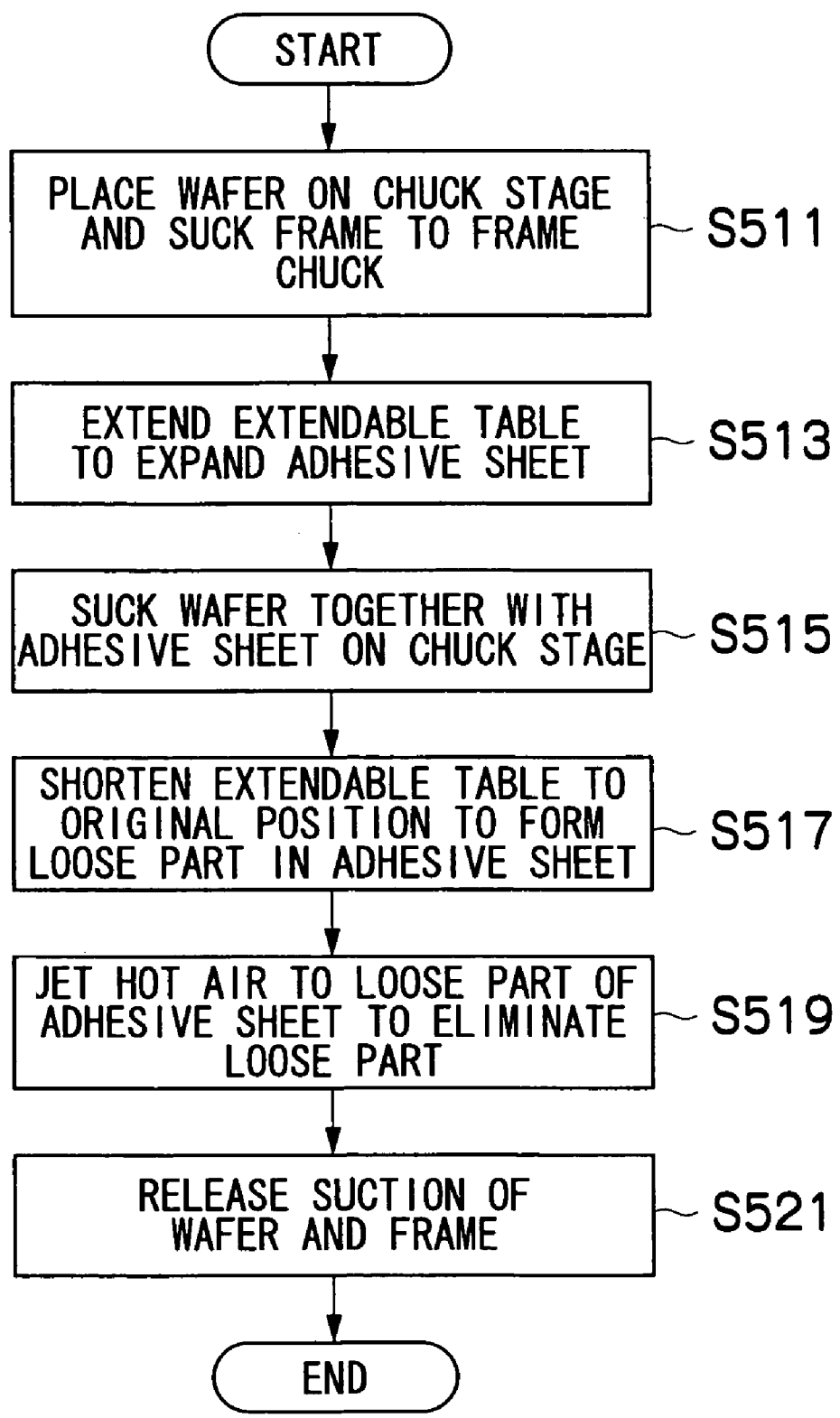
FIG. 30 is a flowchart illustrating an expanding method according to the sixth embodiment.

Next, a sixth embodiment of an expanding method according to the invention will be described based on the flowchart in FIG. 30. In the expanding device 501 used in the expanding method according to the invention, as shown in FIG. 3, the wafer W is stuck to the heat-shrinkable sheet S, and introduced while being mounted to a ring-shaped frame F through the adhesive sheet S.

As a base material of the heat-shrinkable adhesive sheet S, polyolefin plastic is used that shrinks when heated at 115° C. or more and has a shrinkage percentage of −15% or more at a rate of change in length. The base material of the adhesive sheet S may be selected from polyolefin, polyvinyl chloride, polyester, and polystyrene plastics.

This wafer W is placed on the chuck stage 514 through the adhesive sheet S, and the frame F is placed on the frame chuck 513. The wafer W has been already diced and divided into individual chips.

In this state, the solenoid valve 521A is actuated to suck and secure the frame F to the frame chuck 513 (Step S511). The wafer W remains placed on the chuck stage 514 and is not sucked. FIG. 29 shows this state.

Figure 31:
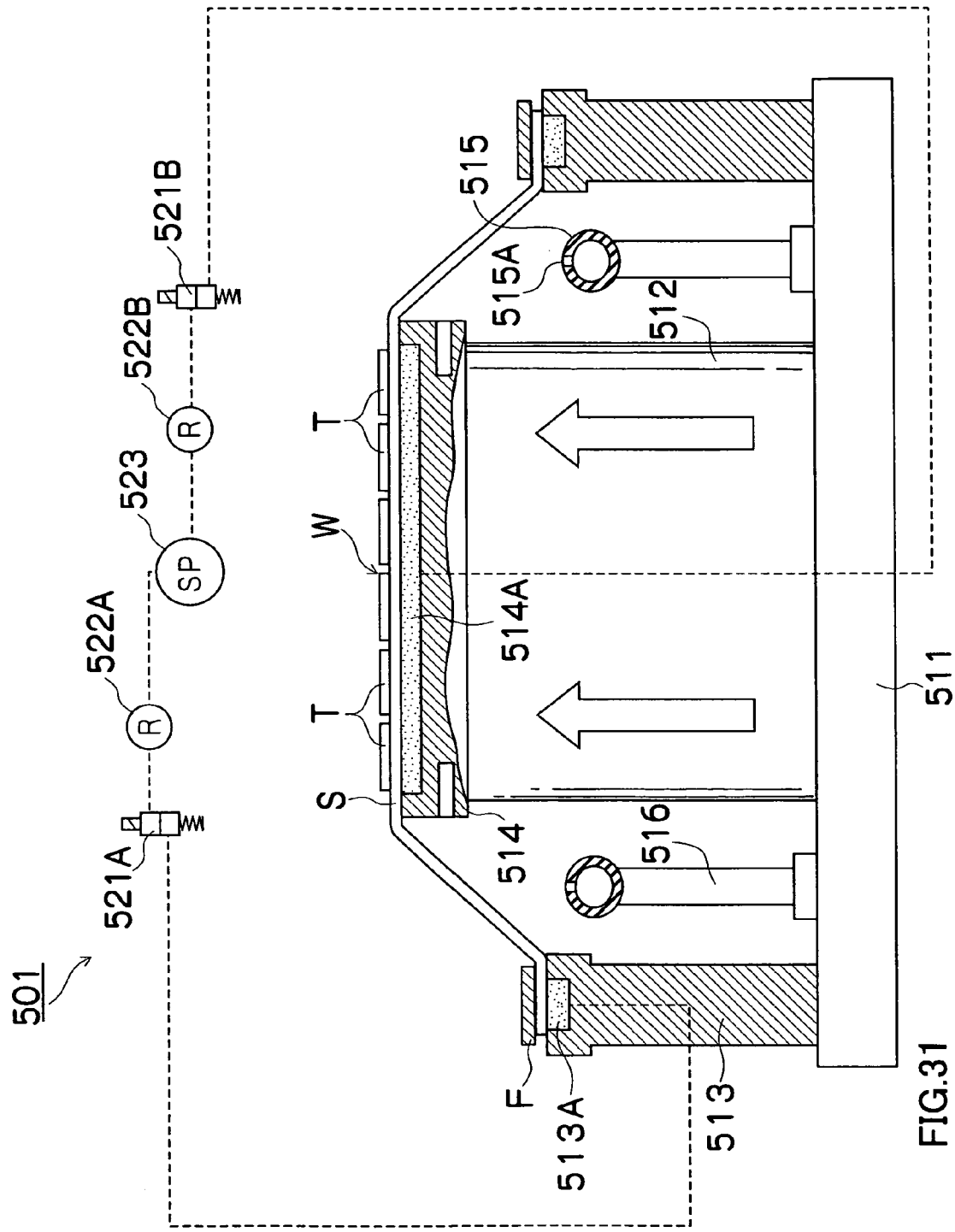
FIG. 31 is a sectional view for illustrating an expanding operation according to the sixth embodiment.

Next, the extendable table 512 is extended upward to raise a portion of the adhesive sheet S on which the wafer W is stuck. This causes the adhesive sheet S to be stretched to increase spacings between the individual chips T (Step S513). FIG. 31 shows this state.

Next, the solenoid valve 521B is actuated to suck and secure the wafer W together with the adhesive sheet S on the chuck stage 514. This causes the expanded state of the adhesive sheet S on the chuck stage 514 to be temporarily maintained (Step S515).

From this state, the extendable table 512 is shortened to its original position. The adhesive sheet S on the chuck stage 514 is sucked and secured to form a loose part SA in the adhesive sheet S between the frame F and the chuck stage 514 (Step S517).

Next, hot air is jetted toward the loose part SA of the adhesive sheet S from the jet orifices 515A, 515A, . . . of the jet pipe 515. The temperature of the hot air is preferably about 120° C. The adhesive sheet S is the heat-shrinkable sheet, and thus the loose part SA shrinks and is eliminated (Step S519).

Figure 32:
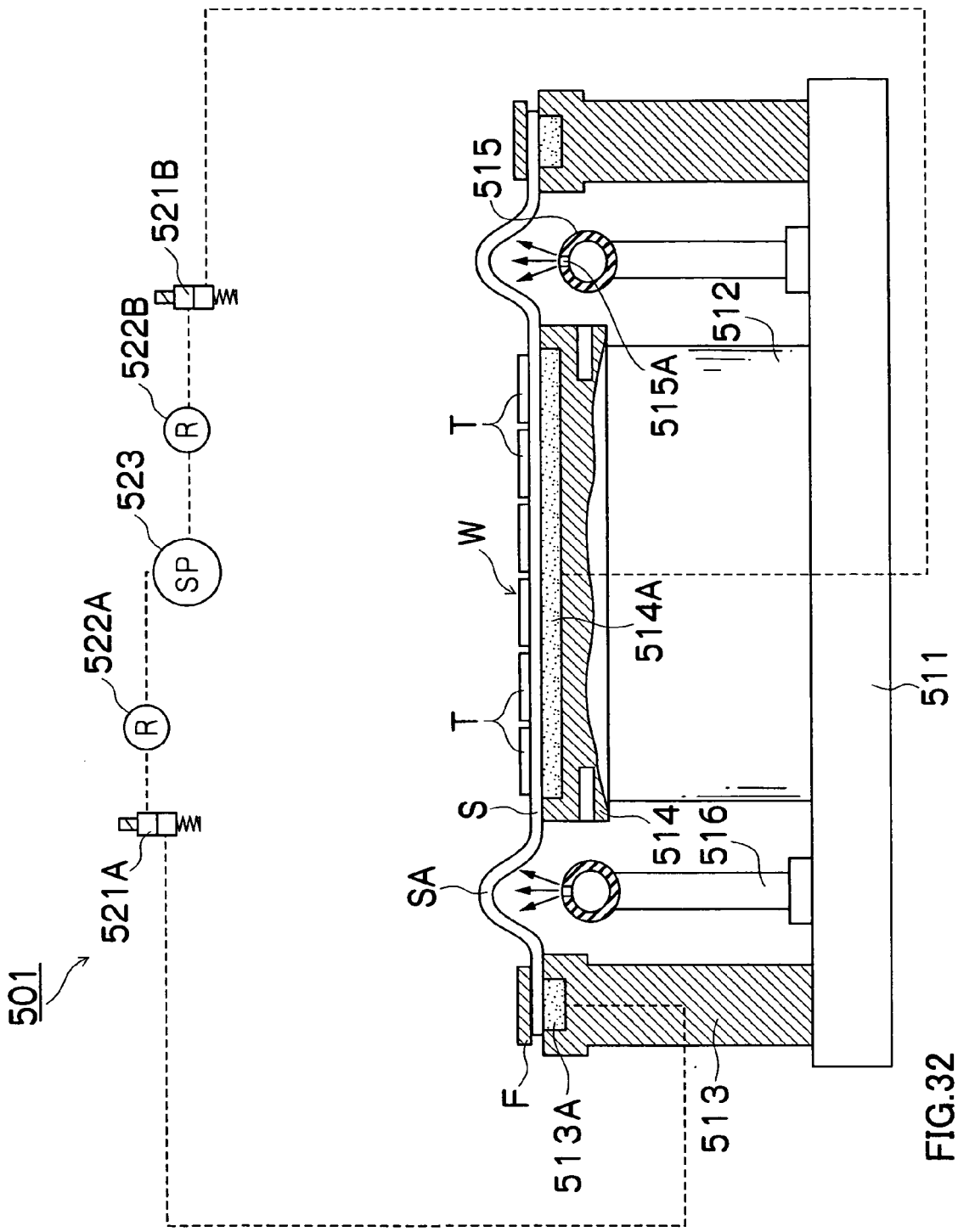
FIG. 32 is a sectional view for illustrating an expanding operation according to the sixth embodiment.

FIG. 32 shows a state where the loose part SA is formed in the adhesive sheet S between the frame F and the chuck stage 514, and hot air is jetted to the loose part SA from the jet pipe 515.

Figure 33:
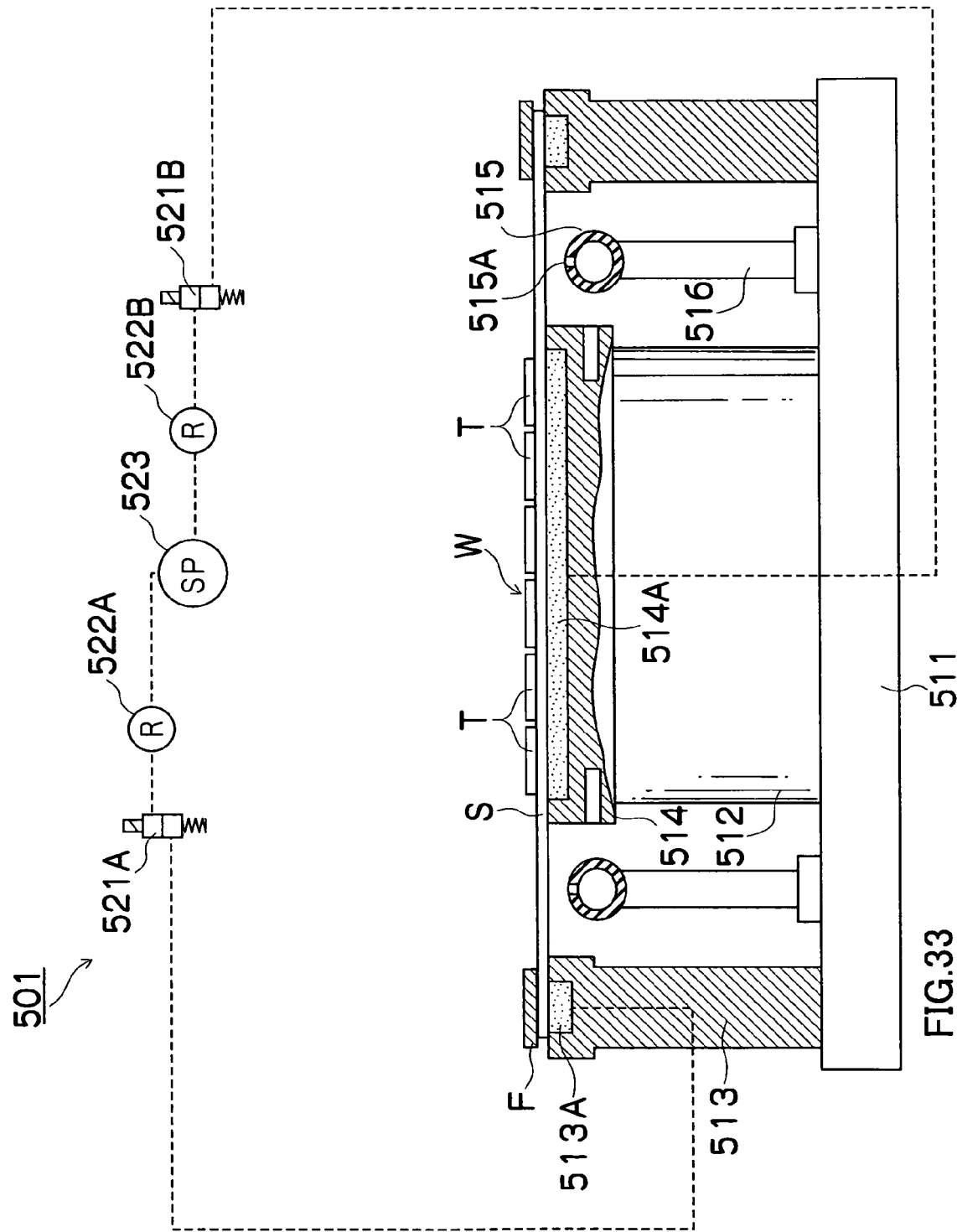
FIG. 33 is a sectional view for illustrating an expanding operation according to the sixth embodiment.

The solenoid valves 521A and 521B are then actuated to release the suction of the wafer W and the frame F (Step S521). Even if the suction of the wafer W is released, the loose part SA of the adhesive sheet S shrinks and is eliminated to maintain the expanded state of the adhesive sheet S, thereby causing the increased spacings between the individual chips T to be maintained. FIG. 33 shows this state.

Thus, the expanded state of the expanded adhesive sheet S is maintained, and the spacings between the individual chips T are increased, thereby preventing contact between the individual chips T and allowing the wafer W to be easily conveyed together with the frame F.

In the sixth embodiment, the frame F is secured to a fixed position and the wafer W is moved upward to expand the adhesive sheet S, but the invention is not limited to this, and the wafer W may be secured to a fixed position and the frame F may be pushed down to expand the adhesive sheet S. The wafer W and the frame F may be moved in any direction as long as the wafer W and the frame F are relatively separated.

Figure 34:
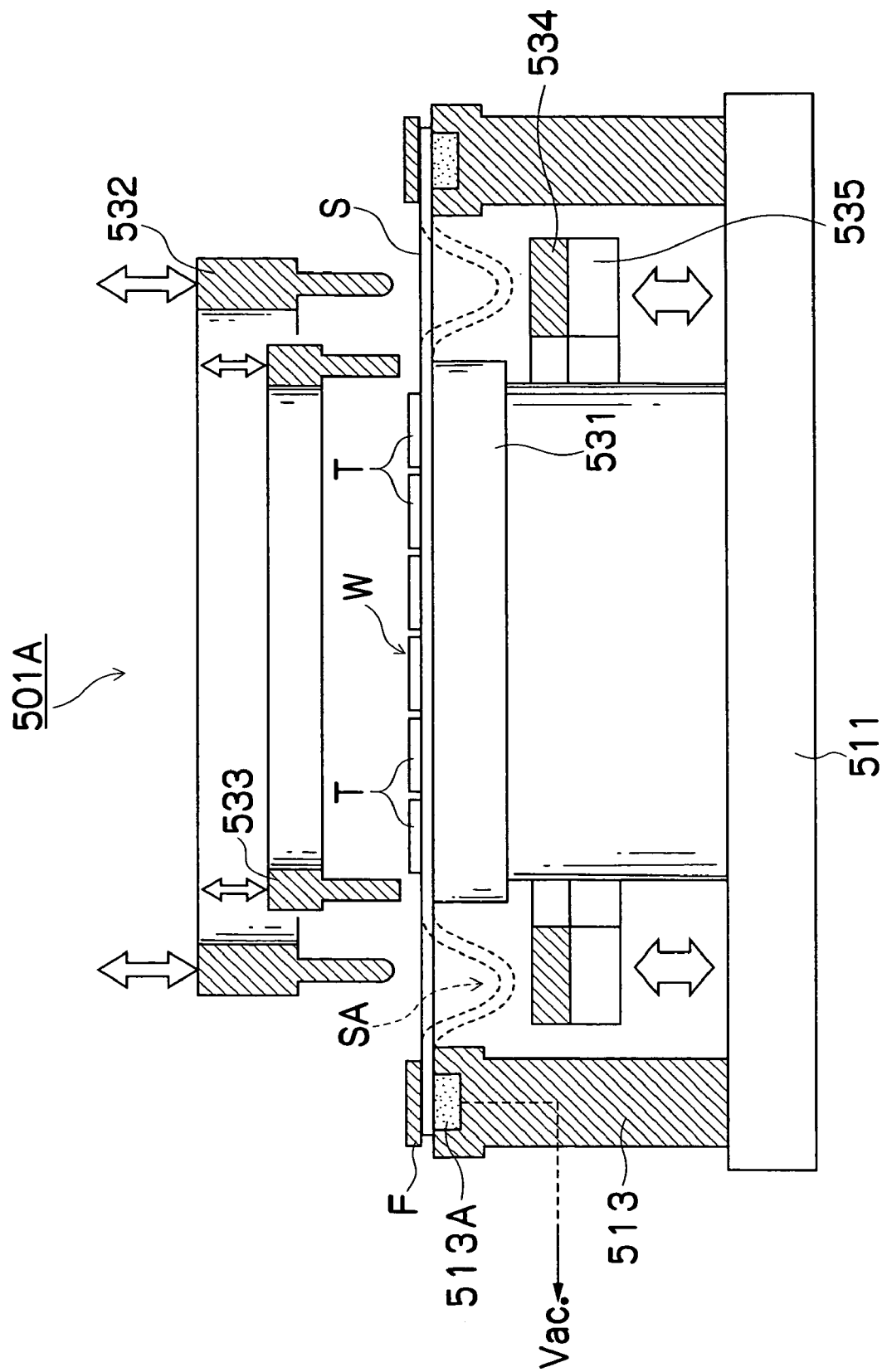
FIG. 34 is a sectional view for illustrating a variant of the sixth embodiment.

Next, a variant of the sixth embodiment of the expanding device and the expanding method according to the invention will be described. FIG. 34 shows an expanding device according to the variant of the sixth embodiment of the invention. The expanding device 501A includes a base 511, a stage 531 and a frame chuck 513 placed on the base 511, and a ring-shaped heating plate 534 provided on the base 511 intercalated a mount 535.

A porous member 513A is embedded in an upper surface of the frame chuck 513, and connected to an unshown vacuum source so as to suck and hold a frame F together with an adhesive sheet S.

A surface heating element such as a rubber heater is used as the heating plate 534, and the mount 535 to which the heating plate 534 is mounted is vertically moved by unshown drive means.

An annular clamp ring 533 is provided above the stage 531, and vertically moved by unshown drive means. When pushed down, the clamp ring 533 presses the adhesive sheet S on the stage 531 to clamp the adhesive sheet S.

An annular pressing ring 532 is provided above the heating plate 534, and vertically moved by unshown drive means. When pushed down, the pressing ring 532 presses the adhesive sheet S downward in a ring shape.

Figure 35:
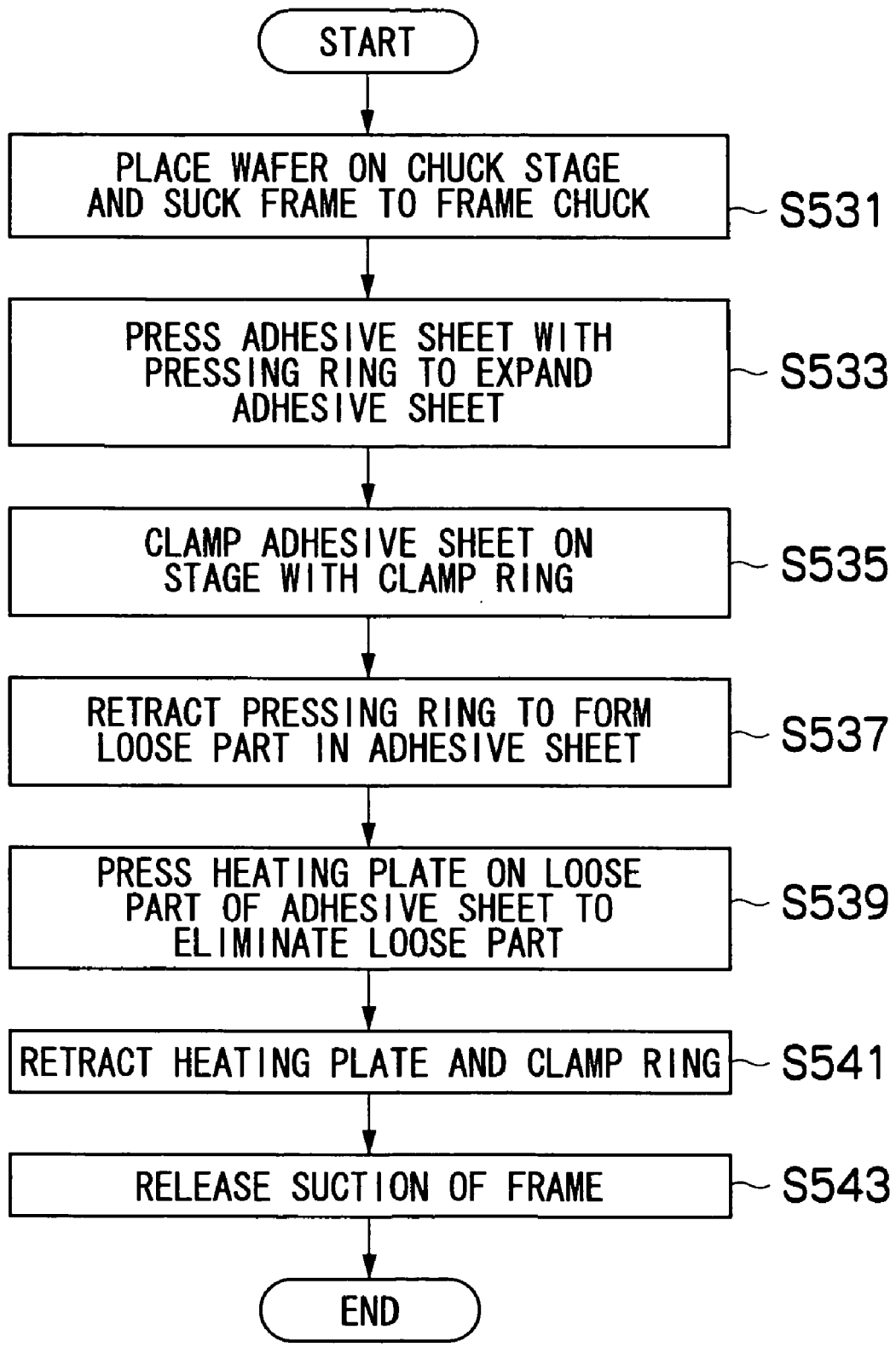
FIG. 35 is a flowchart illustrating the variant of the sixth embodiment.

FIG. 35 shows a flowchart of the variant of the sixth embodiment of the expanding method according to the invention. First, a wafer W is placed on the stage 531, the frame F is placed on the frame chuck 513, then a vacuum source of the frame chuck 513 is turned on, and the frame F is sucked and secured to the frame chuck 513 together with the adhesive sheet S (Step S531).

Next, the pressing ring 532 is moved downward to push down a portion of the adhesive sheet S between the stage 531 and the frame F. This causes the adhesive sheet S to be expanded to increase the spacings between individual chips T (Step S533).

Next, the clamp ring 533 is moved downward to press and clamp the adhesive sheet S on the stage 531 at an outer periphery of the wafer W (Step S535). This causes the expanded state of the adhesive sheet S on the stage 531 to be temporarily maintained. When the pressing ring 532 is retracted upward, a loose part SA as shown by the dotted line in FIG. 34 is formed in the portion of the adhesive sheet S between the stage 531 and the frame F (Step S537).

Next, the mount 535 is raised to bring the ring-shaped heating plate 534 heated at about 120° C. into contact with the loose part SA of the adhesive sheet S and gradually raise the heating plate 534. The adhesive sheet S is a heat-shrinkable sheet, and thus a loose part SA gradually shrinks and is eliminated (Step S539). The outer portion of the wafer W of the adhesive sheet is heated in an annular shape by the ring-shaped heating plate 534, and thus the loose part SA of the adhesive sheet S uniformly shrinks and is eliminated.

When the loose part SA is completely eliminated, the heating plate 534 and the clamp ring 533 are retracted (Step S541). The suction of the frame F is then released (Step S543). Even if the clamp of the adhesive sheet S on the stage 531 and the suction of the frame F are released, the loose part SA of the adhesive sheet S shrinks and is eliminated to maintain the expanded state of the adhesive sheet S, thereby increasing the spacings between the individual chips T to prevent the individual chips T from coming into contact with each other, and allowing the wafer W to be easily conveyed together with the frame F.

FIG. 34 shows a state where the loose part SA as shown in the dotted line is formed by the pressing ring 532, the loose part SA is heated by the ring-shaped heating plate 534 to shrink and is completely eliminated (the solid line in FIG. 34).

As described above, according to the expanding method of the invention, the heat-shrinkable adhesive sheet S is expanded to increase the spacings between the diced individual chips T, the loose part SA is formed in the adhesive sheet S with the expanded state being maintained, and the loose part SA is heated and shrunk, thereby allowing the expanded state of the adhesive sheet S to be easily maintained, and preventing edges of the chips T from coming into contact with each other during the conveyance.

After the dicing of the wafer W, the adhesive sheet S is expanded without the wafer W being detached from the chuck stage, the loose part SA is formed, and the loose part SA is shrunk by heat and eliminated to maintain the expanded state, thereby preventing edges of the chips T from coming into contact with each other also during the conveyance in the dicing device after the dicing.

Figure 36:
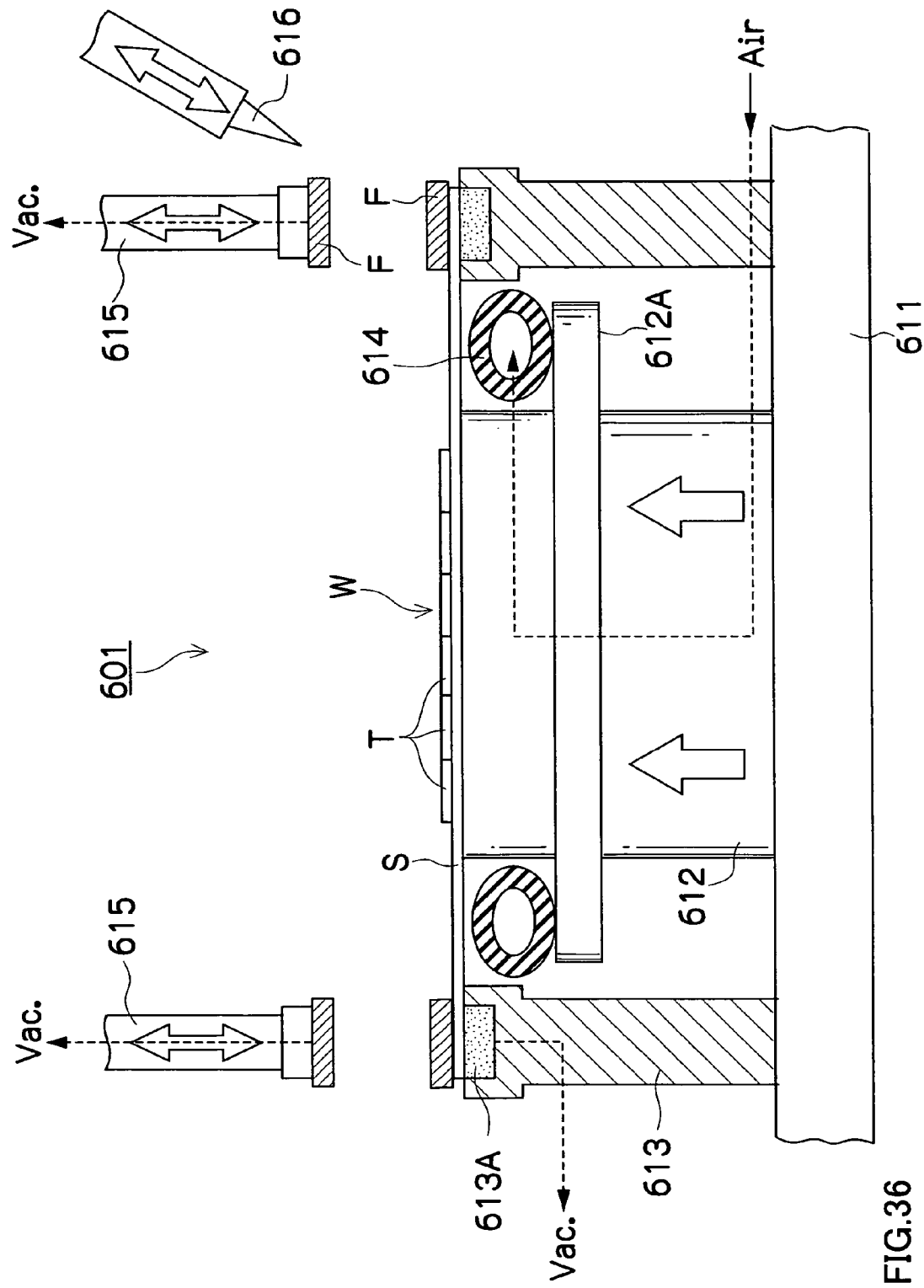
FIG. 36 is a sectional view of an expanding device according to a seventh embodiment of the invention.

FIG. 36 illustrates a seventh embodiment of an expanding device according to the invention. The expanding device 601 includes a base 611, a wafer stage 612 and a frame chuck 613 placed on the base 611, an airbag 614 provided on a flange 612A of the wafer stage 612, a frame holder 615 placed above the frame chuck 613, and a cutter 616 that cuts an adhesive sheet S.

Expanding means of the expanding device 601 includes the wafer stage 612 and the airbag 614, or the like, and expansion maintaining means includes the frame holder 615 and the cutter 616, or the like.

The wafer stage 612 is vertically extendable by unshown drive means to vertically move a wafer W that is a plate-like article together with the adhesive sheet S. The frame chuck 613 is of a cylindrical shape, and a porous member 613A is embedded in an upper surface of the frame chuck 613, and connected to an unshown vacuum source so as to suck and hold the frame F that is a first frame together with the adhesive sheet S.

The airbag 614 provided on the flange 612A of the wafer stage 612 is of a tubular shape and made of a rubber elastic material, and connected to an unshown compressed air source so as to be mainly laterally extendable by a force of compressed air.

The frame holder 615 placed above the frame chuck 613 is vertically extendable by unshown drive means, and connected to an unshown vacuum source so as to suck and hold a new frame F that is a second frame. For the new frame F that is the second frame, the same frame as the frame F that is the first frame is used.

Near the frame holder 615, the cutter 616 is provided that is vertically moved together with the frame holder 615, advanced to and retracted from an outer periphery of the new frame F, and further rotated along the outer periphery of the new frame F to cut off the adhesive sheet S.

Figure 37:
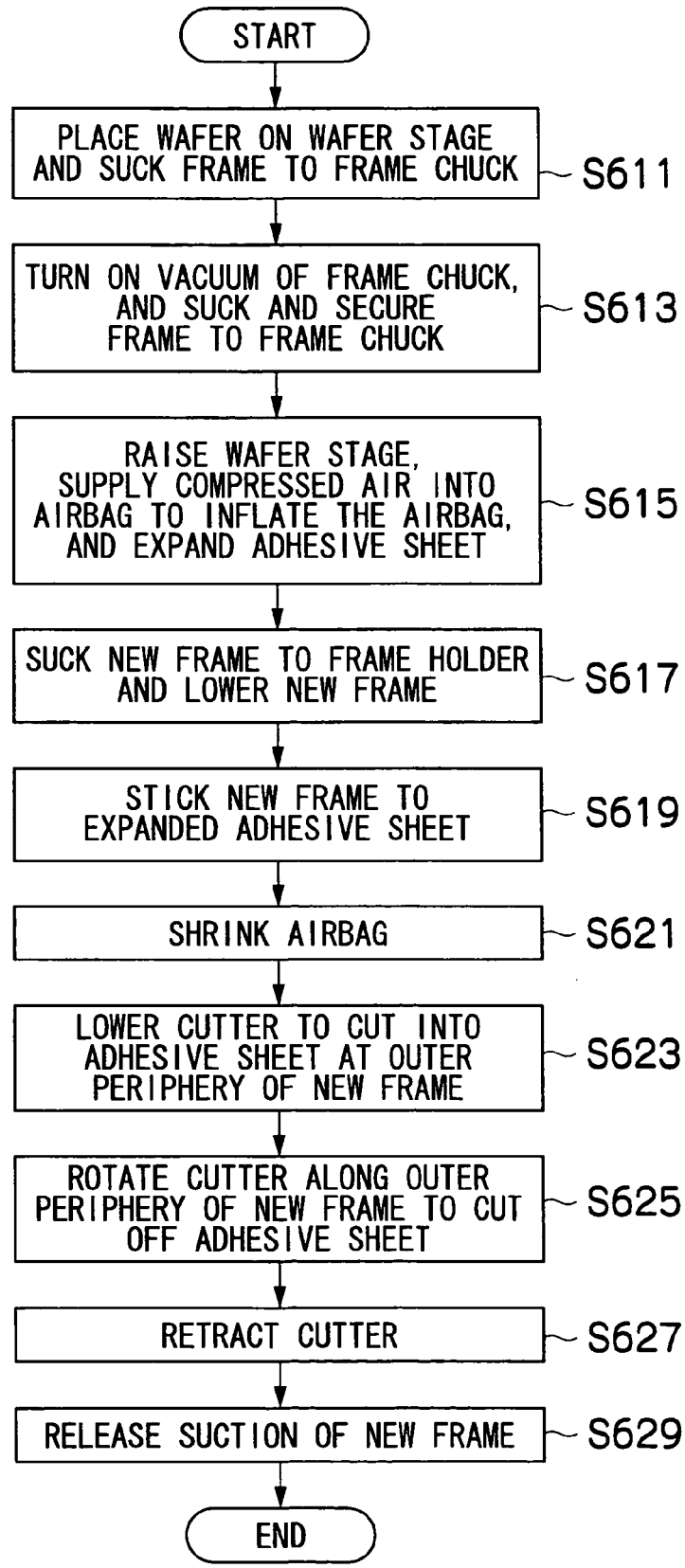
FIG. 37 is a flowchart illustrating an expanding method according to the seventh embodiment.

Next, a seventh embodiment of an expanding method according to the invention will be described based on the flowchart in FIG. 37. In the expanding device 601 used in the expanding method according to the invention, as shown in FIG. 3, the wafer W is stuck to the adhesive sheet S, and introduced while being mounted to the ring-shaped frame F that is the first frame through the adhesive sheet S.

This wafer W is placed on the wafer stage 612 through the adhesive sheet S, and the frame F is placed on the frame chuck 613 (Step S611). The wafer W has been already diced and divided into individual chips T.

In this state, the frame F is sucked and secured to the frame chuck 613 (Step S613). FIG. 36 shows this state.

Next, the wafer stage 612 is extended upward to raise a portion of the adhesive sheet S on which the wafer W is stuck. At the same time, the compressed air is supplied into the airbag 614 to laterally inflate the airbag 614.

Figure 38:
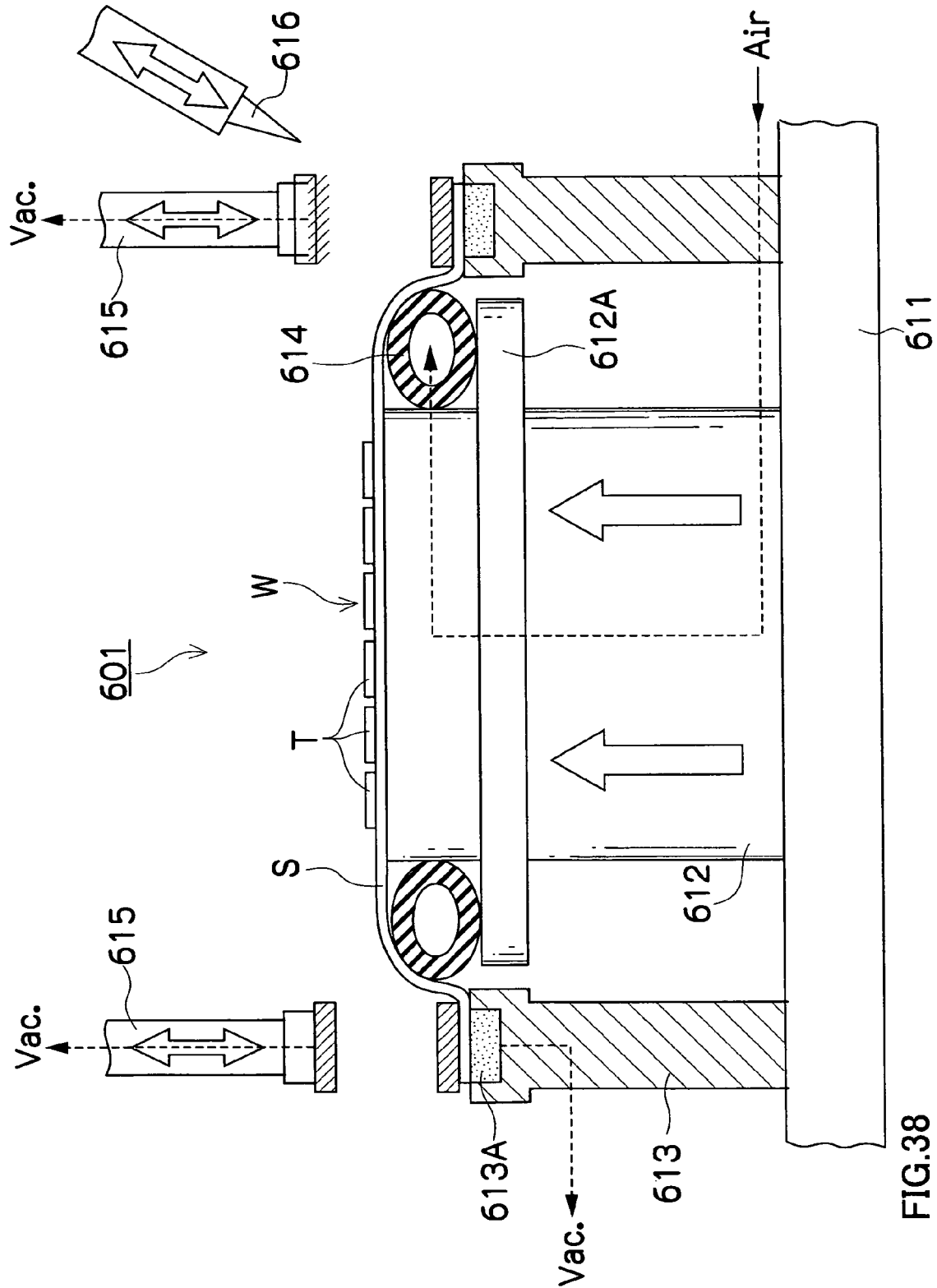
FIG. 38 is a sectional view for illustrating an expanding operation according to the seventh embodiment.

This causes the adhesive sheet S to be stretched to increase spacings between the individual chips T. FIG. 38 shows a midway state thereof. The raising of the wafer stage 612 and the inflation of the airbag 614 are continued to expand the adhesive sheet S to a state shown in FIG. 39 (Step S615).

Figure 39:
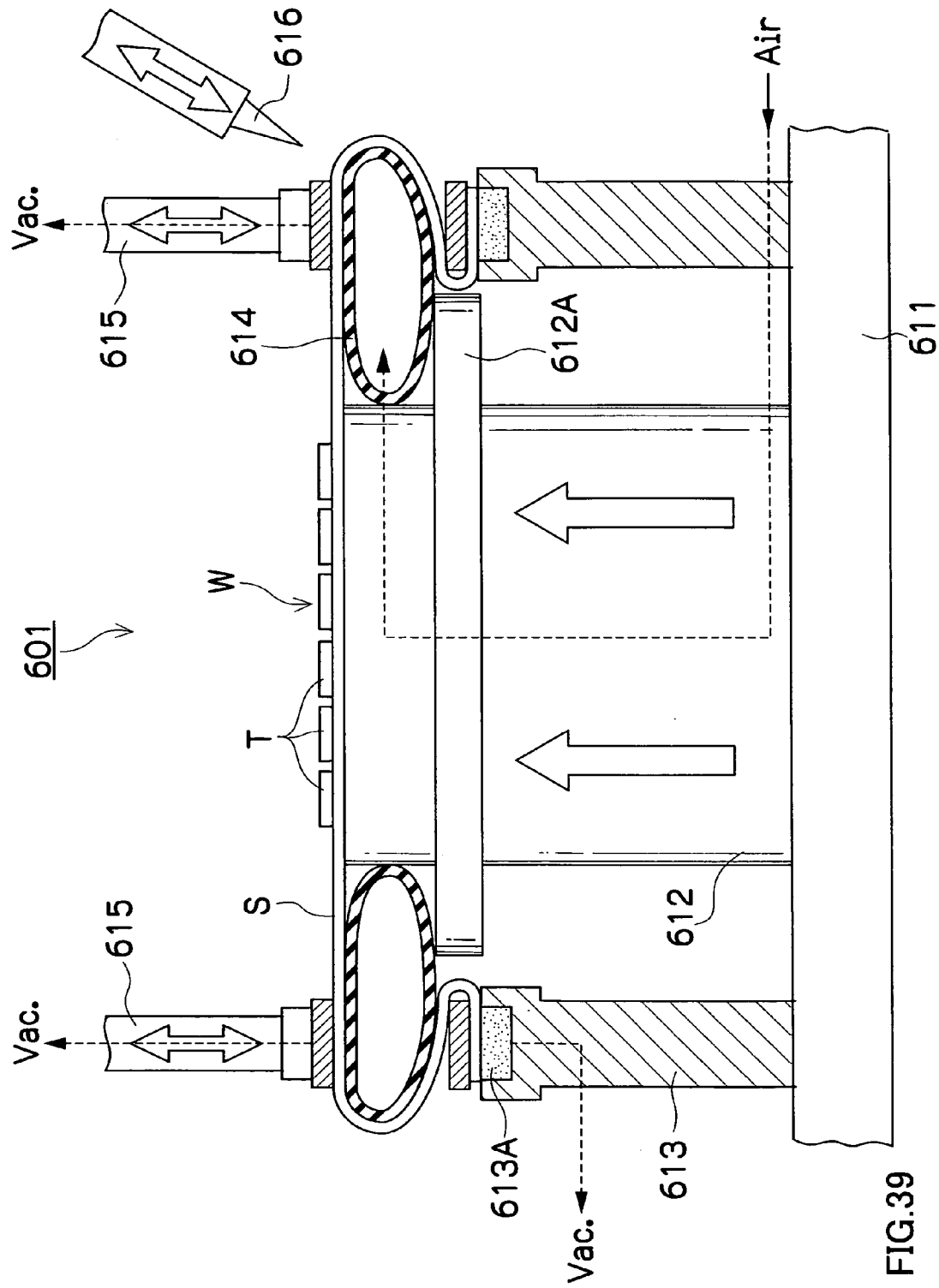
FIG. 39 is a sectional view for illustrating an expanding operation according to the seventh embodiment.

At the same time, the new frame F that is the second frame is sucked and secured to the frame holder 615 and lowered (Step S617), and the new frame F is stuck to the expanded adhesive sheet S (Step S619). FIG. 39 shows this state. In this state, the expanded state of the adhesive sheet S inside the new frame F is maintained.

Next, the supply of the compressed air into the airbag 614 is stopped, and a communication path is opened to air to shrink the airbag 614 (Step S621).

Next, the cutter 616 is lowered toward the outer periphery of the new frame F to cut into the adhesive sheet S (Step S623), then the cutter 616 is once rotated along the outer periphery of the new frame F to cut off the adhesive sheet S at the outer periphery of the new frame F (Step S625).

Next, the cutter 616 is retracted (Step S627) to release the suction of the new frame F by the frame holder 615.

Thus, the expanded state of the expanded adhesive sheet S is maintained, and the spacings between the individual chips T are increased, thereby preventing the individual chips T from coming into contact with each other and allowing the wafer W to be easily conveyed together with the new frame F.

On the other hand, the suction of the frame F sucked to and held on the frame chuck 613 is released to take out the frame F. When an adhesive material of the adhesive sheet S stuck to the frame F is an ultraviolet curable adhesive, ultraviolet light is applied to reduce adhesion, and then the adhesive sheet S is removed. When the adhesive material of the adhesive sheet S is a thermosetting adhesive, the adhesive sheet S is heated to reduce adhesion.

The frame F that is the first frame and the new frame F that is the second frame are of the same type, and thus the frame F that is the first frame from which the adhesive sheet S is removed is used as the next new frame F.

In the seventh embodiment, the frame F is secured to a fixed position, the wafer W is moved upward, and the airbag 614 is inflated to expand the adhesive sheet S, but the invention is not limited to this, and the wafer W may be secured to a fixed position, the frame F may be pushed down, and the airbag 614 may be inflated to expand the adhesive sheet S. Alternatively, the wafer W and the frame F may be relatively separated a predetermined distance and then the airbag 614 may be inflated.

The airbag 614 is used as the means for laterally stretching the adhesive sheet S, but not limited to the airbag 614, other various mechanical means may be used to apply a lateral force to the adhesive sheet S.

INDUSTRIAL APPLICABILITY

As described above, according to the expanding method and the expanding device of the invention, with respect to the plate-like article stuck to the adhesive sheet, mounted to the ring-shaped frame through the adhesive sheet, and diced into individual chips, the adhesive sheet is expanded with the plate-like article being mounted to the frame after the dicing to increase the spacings between the individual chips and maintain the state, thereby allowing the plate-like article to be conveyed together with the frame, and preventing edges of adjacent chips from coming into contact with each other by vibration during the conveyance to cause chipping or microcracks in the edges.

The invention claimed is:

1. An expanding method for expanding an adhesive sheet with respect to a plate-like article stuck to said adhesive sheet, mounted to a ring-shaped frame through said adhesive sheet, and diced into individual chips by a dicing device, after the dicing to increase spacings between said individual chips, comprising:
   a conveying step of conveying said plate-like article together with a chuck stage of said dicing device to a different area in said dicing device without being detached from said chuck stage after the dicing of said plate-like article;
   an expanding step of expanding said adhesive sheet so as to produce spacings between individual chips with said plate-like article being mounted to said frame in a wafer spreader of an expansion device; and
   an expansion maintaining step of maintaining an expanded state of said adhesive sheet with the spacings between individual chips unchanged and with said plate-like article remaining mounted to said frame after said expanding step by nipping or pinching a loose part of the expanded adhesive sheet formed near an outer periphery of the adhesive sheet by the expansion of the adhesive sheet to form a looped annular protrusion surrounding the chips and by nipping and securing facing sides of the annular protrusion into a closed loop, and
   conveying said plate-like article from the wafer spreader of said expansion device together with said frame with the increased spacings between said chips being maintained unchanged.

2. The expanding method according to claim 1, wherein said expanding step includes a step of heating and stretching said adhesive sheet.

3. The expanding method according to claim 1, wherein said expansion maintaining step includes a step of welding or bonding a base of said annular protrusion of said adhesive sheet.

4. The expanding method according to claim 3, wherein the step of welding or bonding said base of said annular protrusion formed in said adhesive sheet is performed while the chuck stage is rotated.

5. The expanding method according to claim 1, further comprising:
   placing said plate-like article on said chuck stage of said dicing device, and wherein the expanding step includes a step of temporarily maintaining the expanded state of said adhesive sheet on said chuck by holding the adhesive sheet.

6. The expanding method according to claim 5, wherein said expanding step is performed by said expansion device in a dicing area of said dicing device after the dicing of said plate-like article,
   said plate-like article with the fully expanded state of said adhesive sheet being temporarily maintained is conveyed to a different area in said dicing device together with said chuck stage, and
   said expansion maintaining step is performed in said different area.

7. The expanding method according to claim 5, wherein said expanding step and said expansion maintaining step are performed in said different area in said dicing device.

8. The expanding method according to claim 1, wherein a heat-shrinkable sheet is used as said adhesive sheet, and
   said expanding step and said expansion maintaining step are simultaneously performed by heating said adhesive sheet in at least a pair of areas sandwiching said plate-like article in parallel with a dicing line of said plate-like article in the portion of said adhesive sheet between said plate-like article and said frame.

9. The expanding method according to claim 8, wherein said adhesive sheet is heated in at least a pair of areas sandwiching said plate-like article in parallel with a dicing line in one direction of said plate-like article, and in at least a pair of areas sandwiching said plate-like article in parallel with a dicing line perpendicular to the dicing line in said one direction, and heating temperatures of said areas are individually controlled according to the state of increase in the spacings between said individual chips.

10. The expanding method according to claim 8, wherein after the dicing of said plate-like article, said adhesive sheet is heated without said plate-like article being detached from said chuck stage of said dicing device.

11. An expanding method for expanding an adhesive sheet with respect to a plate-like article stuck to said adhesive sheet, mounted to a ring-shaped frame through said adhesive sheet, and diced into individual chips by a dicing device, after the dicing to increase spacings between said individual chips, comprising:

a conveying step of conveying said plate-like article together with a chuck stage of said dicing device to a different area in said dicing device without being detached from said chuck stage after the dicing of said plate-like article;

an expanding step of expanding said adhesive sheet so as to produce spacings between individual chips with said plate-like article being mounted to said frame in a wafer spreader of an expansion device; and an expansion maintaining step of maintaining an expanded state of said adhesive sheet with the spacings between individual chips unchanged and with said plate-like article remaining mounted to said frame after said expanding step by nipping or pinching a loose part of the expanded adhesive sheet formed near an outer periphery of the adhesive sheet by the expansion of the adhesive sheet to form a looped annular protrusion surrounding the chips, and wherein a heat-shrinkable sheet is used as said adhesive sheet, said expanding step includes a step of applying tension to said adhesive sheet, and said expansion maintaining step includes a step of heating and shrinking said loose part of the expanded adhesive sheet near the outer periphery of the adhesive sheet to eliminate said loose part.

12. The expanding method according to claim 11, wherein said loose part is formed after the expanded state of said adhesive sheet in the portion on which said expanded plate-like article is stuck is maintained by suction or mechanically, and said maintenance by suction or mechanical maintenance is released after said loose part is heated and shrunk.

13. The expanding method according to claim 11, wherein said plate-like article and said frame are relatively separated to expand said adhesive sheet, and the relative separation between said plate-like article and said frame is terminated to form said loose part.

14. The expanding method according to claim 11, wherein said adhesive sheet is pressed between said plate-like article and said frame to expand said adhesive sheet, and the press of said adhesive sheet between said plate-like article and said frame is released to form said loose part.

15. The expanding method according to claim 11, wherein an annular portion of said adhesive sheet surrounding said plate-like article is heated in a ring shape to shrink said loose part.

16. The expanding method according to claim 11, wherein after the dicing of said plate-like article, said adhesive sheet is expanded without said plate-like article being detached from said chuck stage of said dicing device.

17. An expanding method for expanding an adhesive sheet with respect to a plate-like article stuck to said adhesive sheet, mounted to a ring-shaped frame through said adhesive sheet, and diced into individual chips by a dicing device, after the dicing to increase spacings between said individual chips, comprising:

a conveying step of conveying said plate-like article together with a chuck stage of said dicing device to a different area in said dicing device without being detached from said chuck stage after the dicing of said plate-like article;

an expanding step of expanding said adhesive sheet so as to produce spacings between individual chips with said plate-like article being mounted to said frame in a wafer spreader of an expansion device; and an expansion maintaining step of maintaining an expanded state of said adhesive sheet with the spacings between individual chips unchanged and with said plate-like article remaining mounted to said frame after said expanding step by nipping or pinching a loose part of the expanded adhesive sheet formed near an outer periphery of the adhesive sheet by the expansion of the adhesive sheet to form a looped annular protrusion surrounding the chips, wherein said expanding step includes a step of relatively vertically separating said plate-like article and said frame, and applying a lateral force to said adhesive sheet, and said expansion maintaining step includes a step of sticking a different ring-shaped frame to said expanded adhesive sheet, and cutting said adhesive sheet near an outer periphery of said different frame outwardly of a position at which the adhesive sheet is held.

18. The expanding method according to claim 17, wherein said lateral force applied to said adhesive sheet is applied by inflating an airbag.

19. The expanding method according to claim 17, wherein said frame and said different frame are of the same type and dimensions.

* * * * *